(12) United States Patent
Zheng et al.

(10) Patent No.: US 6,849,348 B2
(45) Date of Patent: Feb. 1, 2005

(54) COMPLEX FLUORENE-CONTAINING COMPOUNDS

(75) Inventors: Shiying Zheng, Webster, NY (US); Kathleen M. Vaeth, Rochester, NY (US); Grace A. Bennett, Scottsvile, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/334,359

(22) Filed: Dec. 31, 2002

(65) Prior Publication Data

US 2004/0131880 A1 Jul. 8, 2004

(51) Int. Cl.[7] .................. H05B 33/12; C09K 11/06
(52) U.S. Cl. .............. 428/690; 428/917; 313/504; 252/301.16
(58) Field of Search ................. 428/690, 917; 313/504; 252/301.16; 548/131; 427/66

(56) References Cited

U.S. PATENT DOCUMENTS

| | | | |
|---|---|---|---|
| 6,358,633 B1 | 3/2002 | Sano et al. | |
| 6,479,662 B2 * | 11/2002 | Becker et al. | 546/195 |
| 2003/0143422 A1 * | 7/2003 | Chen | 428/690 |
| 2004/0062930 A1 * | 4/2004 | Roberts et al. | 428/411.1 |

OTHER PUBLICATIONS

Yang et al, Organic/polymeric electroluminescent devices processed by hybrid ink-jet printing, Journal of Material Science, Mater. Electron, 2000, 11, 89–96.
Bernius et al, Progress with Light–Emitting Polymers, Adv. Mater. 2000, 12, 1737–1750.
Burroughes et al, Light–emitting diodes based on conjugated polymers, Nature 1990, 347, 539–541.

* cited by examiner

Primary Examiner—Dawn Garrett
(74) Attorney, Agent, or Firm—Raymond L. Owens

(57) ABSTRACT

An organic compound comprising a complex fluorene structure represented by one of the following formulas:

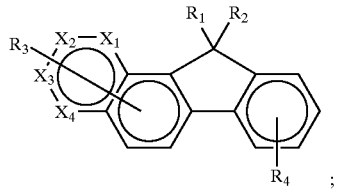

(I)

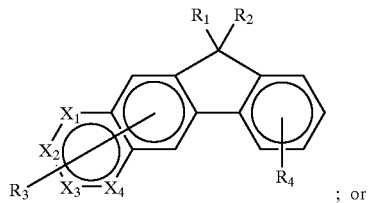

(II)

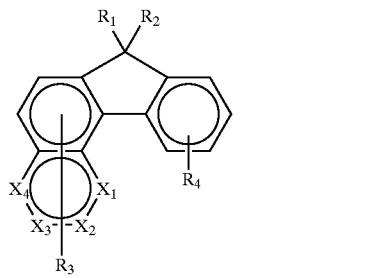

(III)

wherein:
$X_1$, $X_2$, $X_3$, and $X_4$ are individually the same or different and include a moiety containing CH or N; $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings.

18 Claims, 4 Drawing Sheets

COMPLEX FLUORENE-CONTAINING COMPOUNDS

CROSS REFERENCE TO RELATED APPLICATION

Reference is made to commonly assigned U.S. patent application Ser. No. 10/335,441 filed Dec. 31, 2002, entitled "Complex Fluorene Containing Compounds For Use in OLED Devices" by Shiying Zheng et al, the disclosure of which is incorporated herein.

FIELD OF THE INVENTION

The present invention relates to organic compounds containing a complex fluorene structures.

BACKGROUND OF THE INVENTION

There is a great need for large area solid state light sources for a series of applications, especially in the file of display elements and lighting engineering. The demands can not be fully satisfactorily met by any of the existing technologies. Electroluminescent device such as light emitting diodes represents an alternative to conventional display and lighting elements. Electroluminescent devices are opto-electronic devices where light emission is produced in response to an electrical current through the device. The physical model for EL is the radiative recombination of electrons and holes. Both organic and inorganic materials have been used for the fabrication of LEDs. Inorganic materials such as ZnS/Sn, Ga/Bs, Ga/As have been used in semiconductor lasers, small area displays, LED lamps, etc. However, the drawbacks of inorganic materials include difficulties to process and to obtain large surface areas and efficient blue light.

Organic materials, which includes both small molecules and polymeric materials, offer several advantages over inorganic materials for LEDs, such as simpler manufacturing, low operating voltages, the possibility of producing large area and full-color displays. Conjugated polymers such as poly(phenylvinylene) (PPV) were first introduced as EL materials by Burroughes et al in 1990 (Burroughes, J. H. *Nature* 1990, 347, 539–41). Tremendous progress has been made since then to improve the stability, efficiency, and durability of polymeric LEDs (Bernius, M. T. et al, *Adv. Mater*. 2000, 12, 1737). Organic LED (OLED) represents an alternative to the well-established display technologies based on cathode-ray tubes and liquid crystal displays (LCDs), especially for large area displays. OLED has been demonstrated to be brighter, thinner, lighter, and faster than LCDs. Moreover it requires less power to operate, offers higher contrast and wide viewing angle (>165 degree), and has great potential to be cheaper to manufacture, especially the polymer-based LEDs (PLED).

The OLED technology has stimulated intensive research activities across all disciplines. Currently, great efforts in materials research have been focused on novel materials for full-color flexible displays. Full-color displays require three basic colors, red, green and blue, and flexible substrates require low temperature and easy processing of the organic materials. PLED devices show great promise in meeting both requirements, since the emission color can be tailored by modulation of the chemical structures and the solution processing allows for micro-patterning of the fine multicolor pixels via inkjet printing technique (Yang, Y. et al, *J. Mater. Sci.: Mater. Elecron.*, 2000, 11, 89). However, processable, stable, and efficient blue light emitting organic materials are still highly desirable to meet the challenge. Blue light requires wide energy band. With blue light emitting polymers as primary materials, it is possible to produce other colors by a downhill energy transfer process. For instance, a green or red EL emission can be obtained by doping a blue EL host material with a small amount of green or red luminescent material.

SUMMARY OF THE INVENTION

It is an object of the present invention to provide novel highly efficient luminescent materials.

It is another object of the present invention to provide wide energy band gap luminescent materials.

It is a further object of the present invention to provide novel processable materials for easy processing.

These objects are achieved by providing the following organic materials for an organic electroluminescent device. The organic materials comprise a complex fluorene structure represented by one of the following formulae (I), (II), or (III).

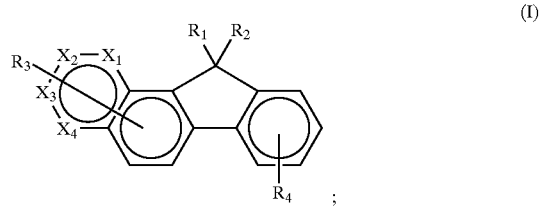

(I)

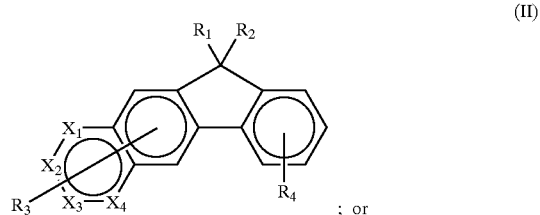

(II)

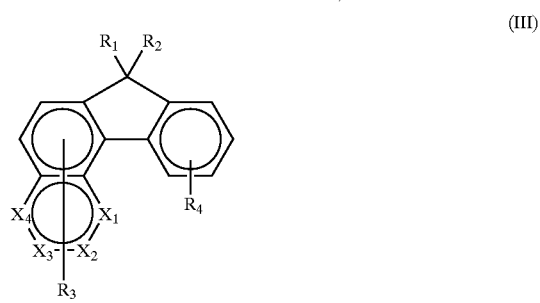

(III)

wherein:

$X_1$, $X_2$, $X_3$, and $X_4$ are individually the same or different and include a moiety containing CH or N; $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings.

The present invention provides organic luminescent materials with a number of advantages that include excellent solubility and thermal stability, good color tunability, high efficiency and low driving voltage.

DETAILED DESCRIPTION OF THE INVENTION

Figure 1:
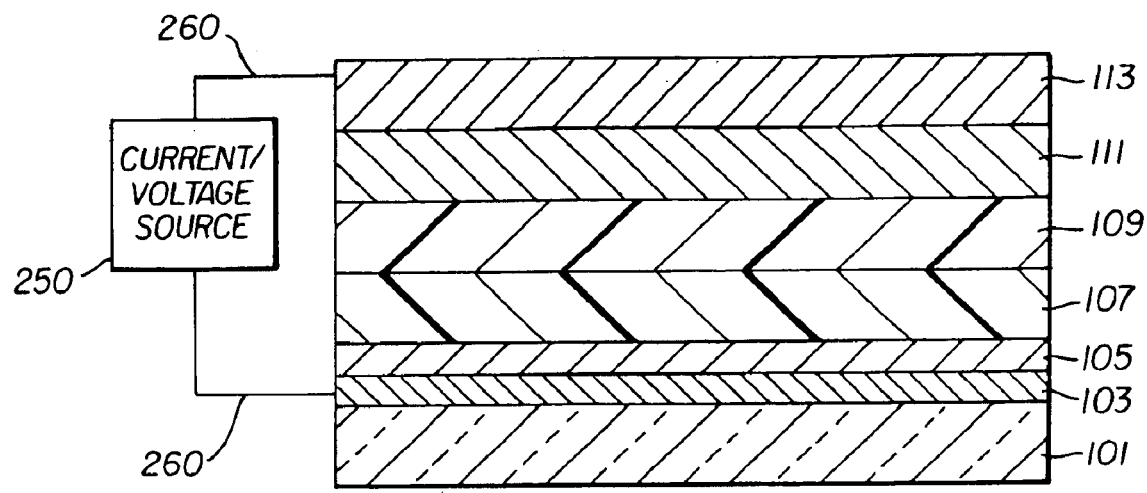
FIG. 1 illustrates in cross-section a basic structure of an EL device.

The present invention provides highly efficient organic light-emitting materials comprising a complex fluorene structure with good color tunability, excellent solubility and thermal stability, and enhanced electron and/or hole transport ability. The complex fluorene is represented by formulae (I), (II), or (III), $X_1$, $X_2$, $X_3$, and $X_4$ are individually the same or different and include a moiety containing CH or N; $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings.

For example, $R_1$, $R_2$, $R_3$, and $R_4$ are independently hydrogen, methyl, ethyl, propyl, isopropyl, butyl, isobutyl, t-butyl, pentyl, hexyl, ethylhexyl, heptyl, octyl, nonyl, decyl, dodecyl, hexyadecyl, cyclohexyl, cyclopentyl, methoxy, ethoxy, butoxy, hexyloxy, ethylhexyloxy, methoxyethoxyethyl, methoxyethyloxyethoxyethyl, phenyl, tolyl, nathphyl, xylene, anthracene, phenanthrene, phenylmethylenephenyl, benzyl, phenoxy, pyridyl, thiophenyl. $R_3$, and $R_4$ are groups that form fused aromatic or heteroaromatic rings such as naphthalene, anthracene, perylene, phenanthrene, pyrene, tetracene, pentacene, triphenylene, and benzo[a]pyrene. Preferably, $R_1$, $R_2$, $R_3$, and $R_4$ are hydrogen, t-butyl, hexyl, 2-ethylhexyl, octyl, 3,7-dimethyloctyl, decyl, heptyl, phenyl, 2-ethylhexyloxy, or 4-methoxypheny; diphenylamino, (4-diphenylamino) phenyl; $R_3$ forms fused aromatic anthracene, or perylene, or pyrene, phenanthrene, or tetracene, and R4 forms a naphthalene or anthracene; or $R_3$, or $R_4$ or both represent one or more than one substituents.

The organic materials comprising the complex fluorene structure are small molecules or polymers, and can be used in a combination of two or more thereof. Small molecules include dendrimers and polymers include hyperbranched architecture.

Small molecules comprising the complex fluorene structure are represented by formula (IV)

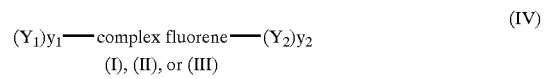

wherein $Y_1$ and $Y_2$ each individually represent a substituted or unsubstituted alkyl, alkenyl, alkynyl, aryl, or heteroaryl or other conjugated groups, and $y_1$ and $y_2$ are integers from 0 to 6, and $Y_1$ and $Y_2$ are the same or different.

Polymers comprising the complex fluorene structure are represented by repeating units of formula (V) which comprise the complex fluorene structure as part of the polymer main chain and repeating units of formula (VI) which comprise the complex structure as part of the polymer side chain.

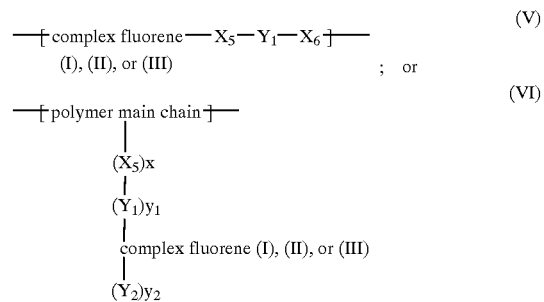

wherein:

$X_5$ and $X_6$ are linking groups, $Y_1$ and $Y_2$ are each individually represented as a substituted or unsubstituted alkyl, alkenyl, alkynyl, aryl, or heteroaryl or other conjugated groups, and x, $y_1$ and $y_2$ are integers from 0 to 6.

Incorporating $Y_1$ and $Y_2$ units into the compounds comprising the complex fluorene structure represented by formula (IV), (V), and (VI) can further improves solubility, or electron or hole transporting mobility, or finely tune the emission color.

$X_5$ and $X_6$ each individually represent a linking group and include but are not limited to the following groups:

Group I:

$X_5$ and $X_6$ are carbon-carbon bond linking groups:

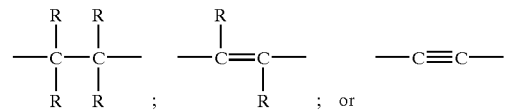

wherein R is hydrogen, alkyl, alkynyl, or alkenyl group containing 1 to 40 carbon atoms; aryl or substituted aryl of containing 6 to 60 carbon atom s; or heteroaryl or substituted heteroaryl containing 4 to 60 carbons; or F, Cl, or Br; or a cyano, or a nitro group;

Group II:

$X_5$ and $X_6$ are ether or thioether linking groups:

; or

Group III:

$X_5$ and $X_6$ are ester linking groups:

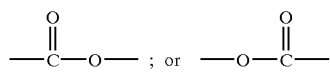

Group IV:

$X_5$ and $X_6$ are anhydride linking groups:

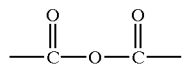

Group V:

$X_5$ and $X_6$ are carbonate linking groups;

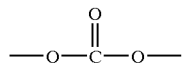

Group VI:

$X_5$ and $X_6$ are sulfone or sulfine linking groups:

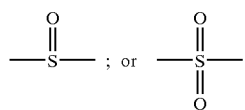

Group VII:

$X_5$ and $X_6$ are an amine linking groups:

wherein R is defined as above.

Group VIII:

$X_5$ and $X_6$ are amide linking groups:

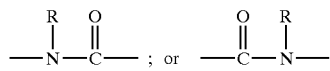

Group IX:

$X_5$ and $X_6$ are urea linking groups:

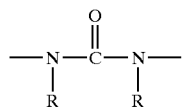

Group IX:

$X_5$ and $X_6$ are aryl or heteroaryl linking groups:

wherein Ar is an aryl or substituted aryl group containing 6 to 60 carbon atoms; or heteroaryl or substituted heteroaryl containing 4 to 60 carbons; n is an integer of from 1 to 6.

$X_5$ and $X_6$ can be one or the combination of more than one of the above groups.

$Y_1$ and $Y_2$ represents a substituted or unsubstituted alkyl, alkenyl, alkynyl, aryl, heteroaryl or other conjugated groups, and can be the same or different.

Alkyl, alkenyl, and alkynyl groups contain 1 to 40 carbon atoms;

Substituted or unsubstituted aryl groups contain 6 to 60 carbon atoms which include phenyl, biphenyl, naphthyl, anthracene, fluorene, phenanthrene, spirophenyl, perylene, or pyrene groups;

Substituted or unsubstituted heteroaryl groups contain 4 to 60 carbon atoms which include pyridine, thiophene, pyrrole, bithiophene, furan, benzofuran, benzimidazole, benzoxazole, quinoxaline, phenylquinoline, dipheyloxadizaole, or carbazole;

All the substituents mentioned above include but are not limited to alkyl or alkoxy groups containing 1 to 40 carbon atoms, aryl or substituted aryl containing 6 to 60 carbon atoms; or heteroaryl or substituted heteroaryl containing 4 to 60 carbons; or F, Cl, or Br; or a cyano group; or a nitro group.

$Y_1$ and $Y_2$ can be divided into the following groups.

Group I:

$Y_1$ and $Y_2$ are alkyl, alkenyl, or alkynyl groups of formula (VII):

$$—W—  \quad (VII)$$

wherein:

W contains 1 to 28 carbon atoms, may also contains O, N, S, F, Cl, or Br, or Si atoms.

The following structures constitute specific examples of formula (VII)

wherein: m is an integer from 1 to 6;

wherein: q is an integer from 0 to 12;

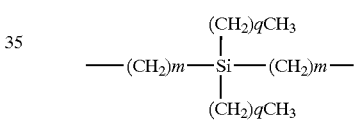

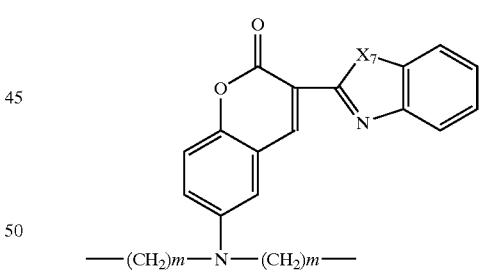

wherein: $X_7$ is a C, O, N, or S atom;

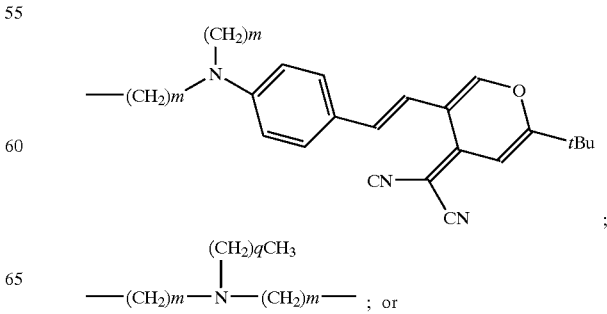

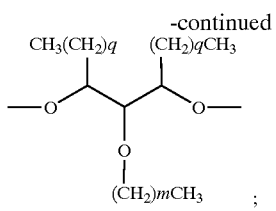

Group II:

$Y_5$ and $Y_6$ are two aryl or heteroaryl groups connected by a linking group Z of formula (VIII):

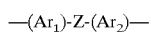 (VIII)

wherein:

$Ar_1$ and $Ar_2$ are substituted or unsubstituted aryl groups containing 6 to 60 carbon atoms, or heteroaryl groups containing 4 to 60 carbons;

Z is a divalent linking groups containing 0 to 40 carbon atoms, can contain N, Si, O, Cl, F, Br, or S atoms.

The following structures constitute specific examples of formula (VIII)

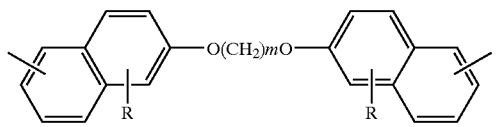

wherein: R is defined as above, and can represent more than one such substituent;

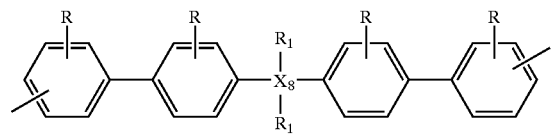

wherein: $X_8$ is C or Si;

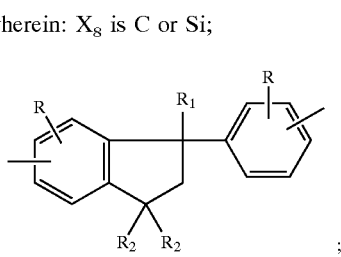

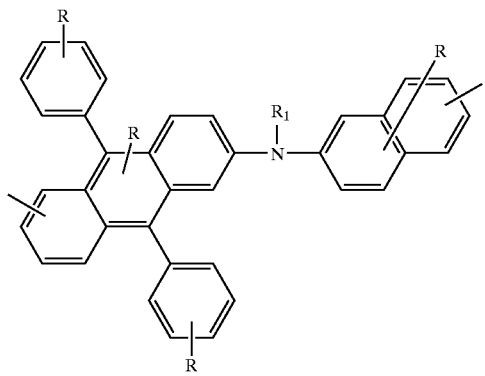

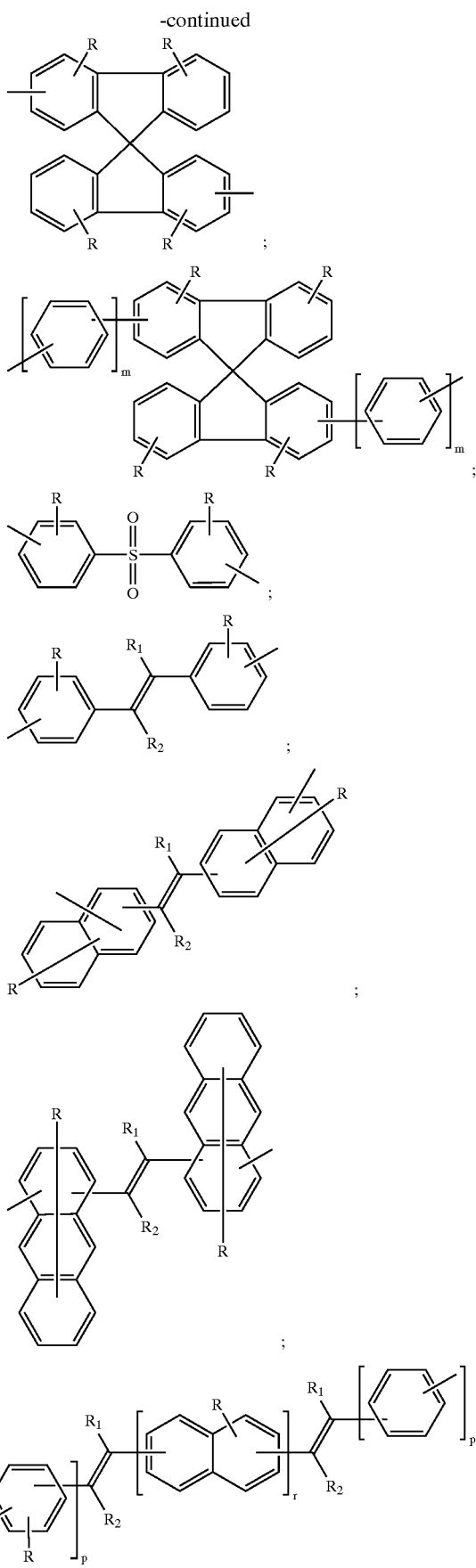

-continued wherein: p and r are integers from 1 to 4;

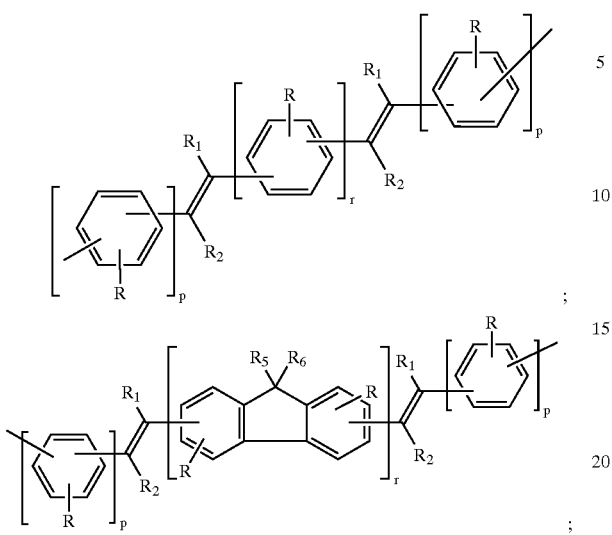

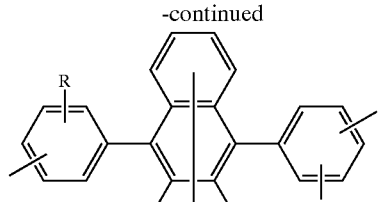

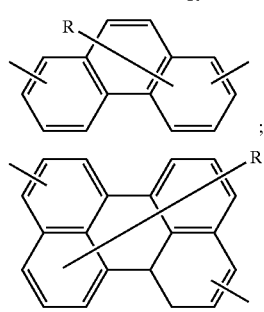

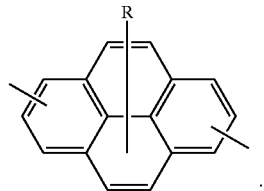

wherein: $R_5$, and $R_6$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or

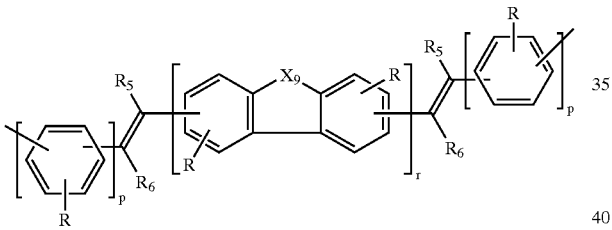

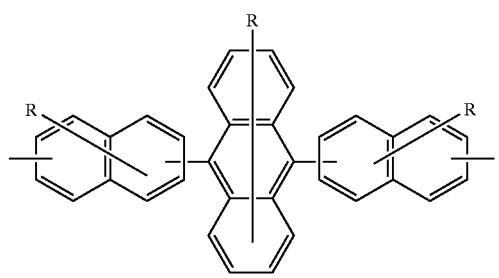

wherein: $X_9$ is O or S atom, or N—R;

Group III:

$Y_1$ and $Y_2$ are aryl or heteroaryl groups of formula (IX):

—Ar—  (IX)

wherein:

Ar is a substituted or unsubstituted aryl group with 6 to 60 carbon atoms, or a substituted or unsubstituted heteroaryl group with 4 to 60 carbon atoms, and at least one or more N, S, or O atoms.

The following structures constitute specific examples of formula (IX)

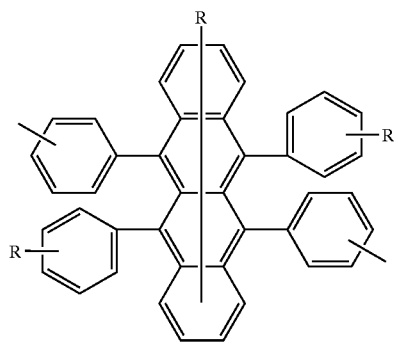

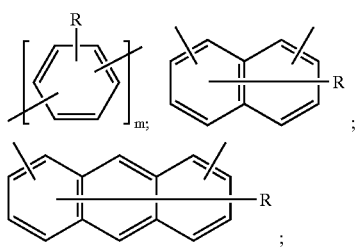

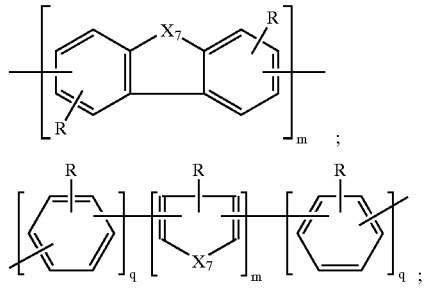

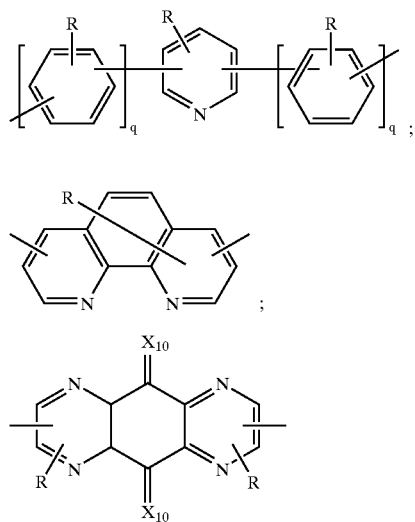
wherein: $X_{10}$ is an O atom or two cyano groups;
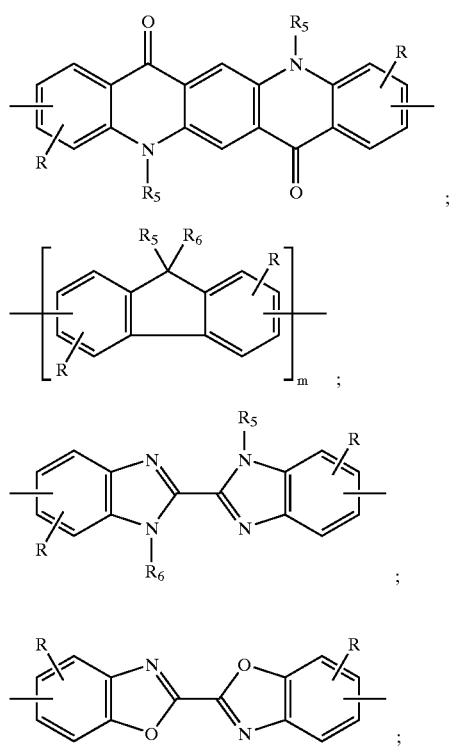
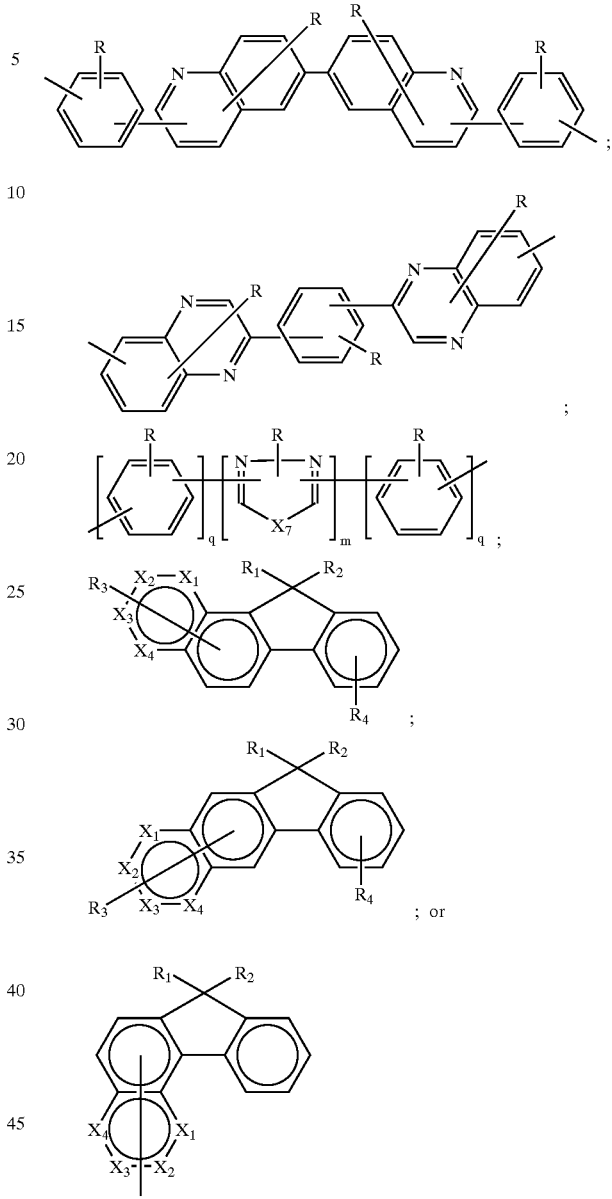
$Y_1$ and $Y_2$ can be one or the combination of more than one of the above groups.
The following molecular structures constitute specific examples of preferred compounds satisfying the requirement of this invention:
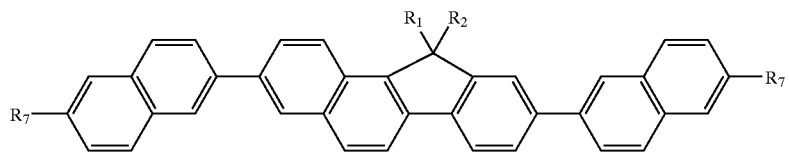

R₁=R₂=n-hexyl, R₇=H            compound 1
R₁=R₂=n-octyl, R₇=H            compound 2
R₁=R₂=2-ethylhexyl, R₇=n-hexyl compound 3
R₁=n-hexyl, R₂=2-ethylhexyl, R₇=H  compound 4

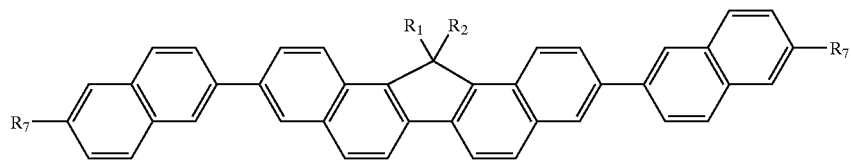

R₁=R₂=n-octyl, R₇=hexyl        compound 5
R₁=R₂=2-ethylhexyl, R₇=H       compound 6
R₁=n-hexyl, R₂=2-ethylhexyl, R₇=H  compound 7

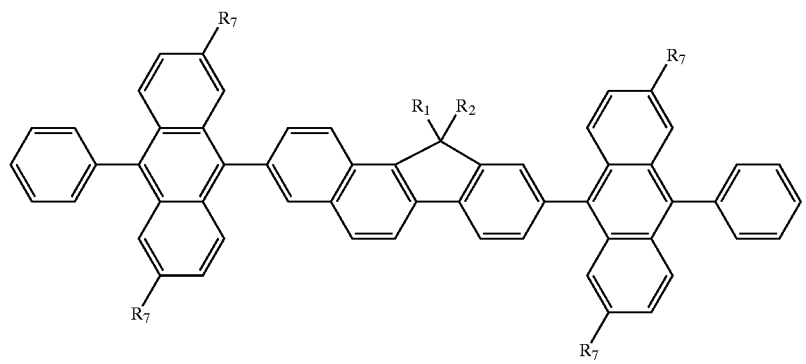

R₁=n-hexyl, R₂=2-ethylhexyl, R₇=t-butyl         compound 8
R₁=n-hexyl, R₂=2-ethylhexyl, R₇=2-ethylhexyl    compound 9
R₁=n-hexyl, R₂=2-ethylhexyl, R₇=2-ethylhexyloxy compound 10
R₁=R₂=R₇=2-ethylhexyl                           compound 11

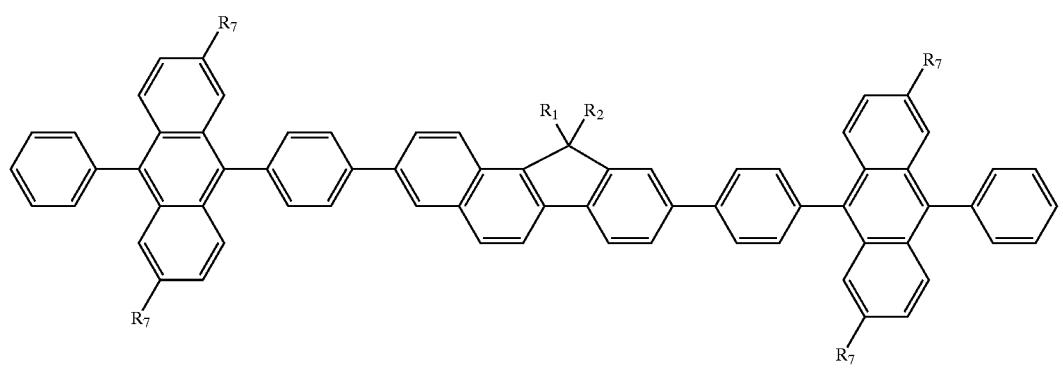

R₁=n-hexyl, R₂=2-ethylhexyl, R₇=t-butyl         compound 12
R₁=n-hexyl, R₂=R₇=2-ethylhexyl                  compound 13
R₁=n-hexyl, R₂=2-ethylhexyl, R₇=2-ethylhexyloxy compound 14
R₁=R₂=R₇=2-ethylhexyl                           compound 15
R₁=R₂=2-ethylhexyl, R₇=H                        compound 16

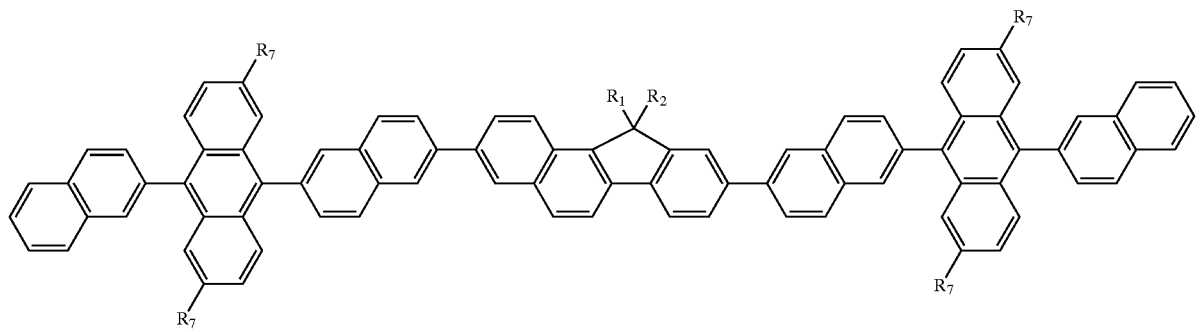
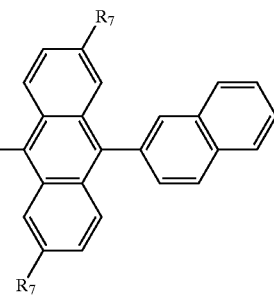

| | |
|---|---|
| $R_1$=n-hexyl, $R_2$=2-ethylhexyl, $R_7$=t-butyl | compound 17 |
| $R_1$=n-hexyl, $R_2$=$R_7$=2-ethylhexyl | compound 18 |
| $R_1$=n-hexyl, $R_2$=2-ethylhexyl, $R_7$=2-ethylhexyloxy | compound 19 |
| $R_1$=$R_2$=$R_7$=2-ethylhexyl | compound 20 |
| $R_1$=$R_2$=2-ethylhexyl, $R_7$=n-octyl | compound 21 |

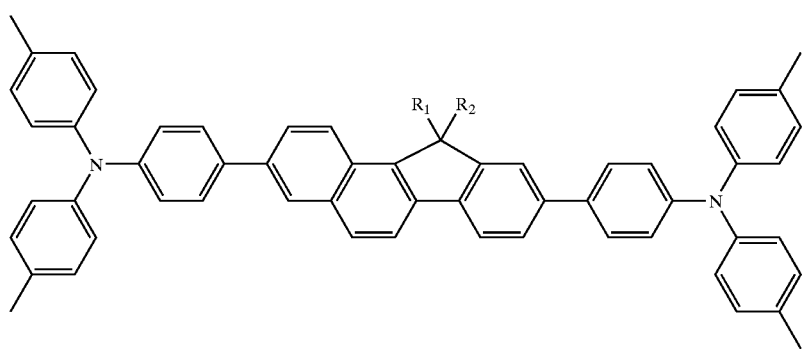

| | |
|---|---|
| $R_1$=n-hexyl, $R_2$=2-ethylhexyl | compound 22 |
| $R_1$=$R_2$=n-hexyl | compound 23 |
| $R_1$=$R_2$=2-ethylhexyl | compound 24 |
| $R_1$=$R_2$=phenyl | compound 25 |
| $R_1$=$R_2$=4-(bis(4-methylphenyl)amino)phenyl | compound 26 |

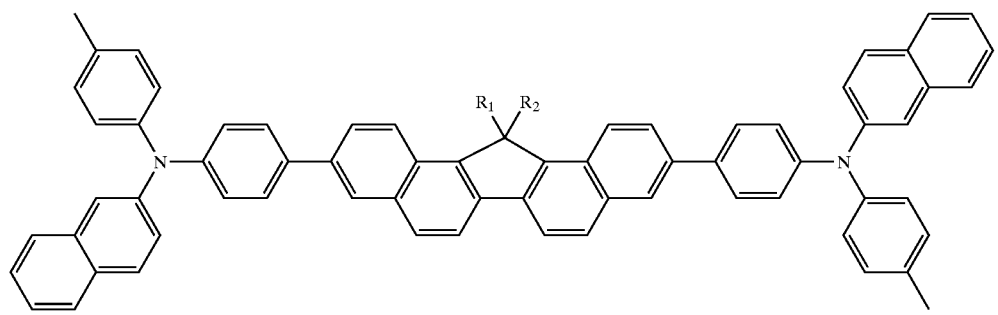

| | |
|---|---|
| $R_1$=$R_2$=2-ethylhexyl | compound 27 |
| $R_1$=$R_2$=4-(bis(4-methylphenyl)amino)phenyl | compound 28 |
| $R_1$=2-ethylhexyl, $R_2$=n-octyl | compound 29 |

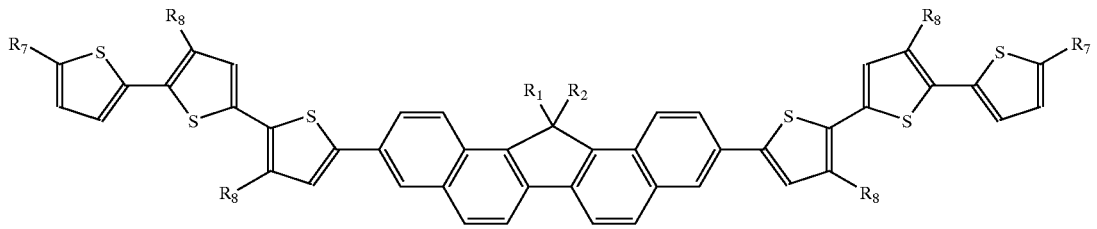

R₁=R₂=R₇=R₈=2-ethylhexyl  compound 30
R₁=R₂=R₇=R₈=n-hexyl  compound 31
R₁=R₇=n-hexyl, R₂=2-ethylhexyl, R₈=H  compound 32

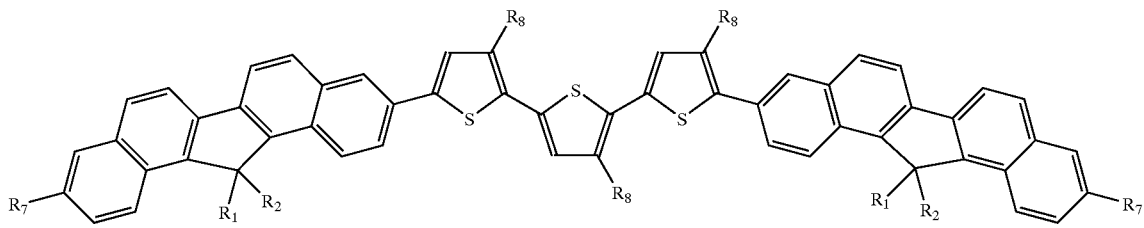

R₁=R₂=R₇=R₈=2-ethylhexyl  compound 33
R₁=R₂=R₇=R₈=n-hexyl  compound 34
R₁=R₇=n-hexyl, R₂=2-ethylhexyl, R₈=H  compound 35
R₁=R₂=R₇=4-(bis(4-methylphenyl)amino)phenyl, R₈=n-hexyl  compound 36

R₁=n-hexyl, R₂=2-ethylhexyl, R₇=t-butyl  compound 37
R₁=n-hexyl, R₂=R₇=2-ethylhexyl  compound 38
R₁=n-hexyl, R₂=2-ethylhexyl, R₇=2-ethylhexyloxy  compound 39
R₁=R₂=2-ethylhexyl, R₇=4-(bis(4-methylphenyl)amino)phenyl  compound 40
R₁=H, R₂=4-n-decylphenyl, R₇=4-(bis(4-methylphenyl)amino)phenyl  compound 41

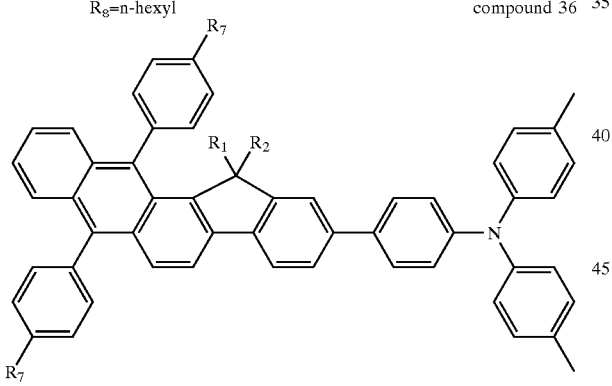

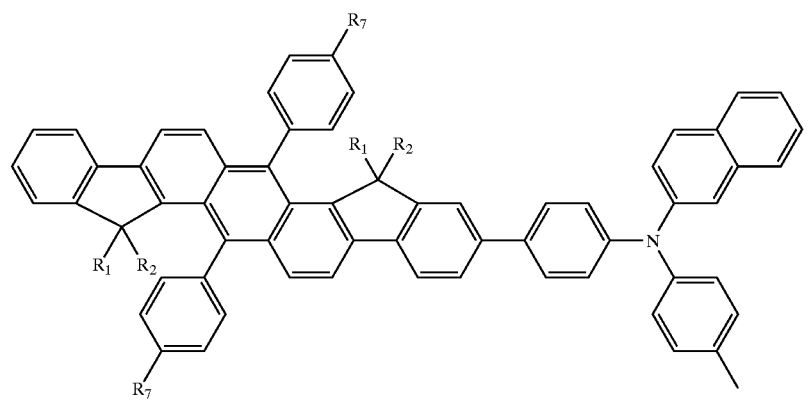

R₁=n-hexyl, R₂=R₇=2-ethylhexyl                                compound 42

R₁=n-hexyl, R₂=2-ethylhexyl, R₇=2-ethylhexyloxy               compound 43

R₁=H, R₂=4-n-decylphenyl, R₇=4-(bis(4-methylphenyl)ami-
no)phenyl                                                     compound 44

R₁=H, R₂=4-n-decylphenyl, R₇=2-ethylhexyloxy                  compound 44

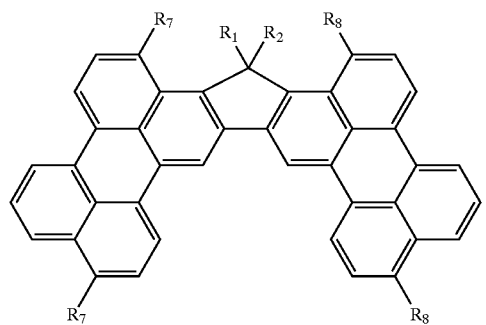

R₁=R₃=n-hexyl, R₂=R₈=2-ethylhexyl                             compound 45

R₁=n-hexyl, R₂=2-ethylhexyl, R₇=2-ethylhexyloxy, R₈=dipheny-
lamino                                                        compound 46

R₁=H, R₂=4-n-decylphenyl, R₇=R₈=4-(bis(4-methylphenyl)ami-
no)phenyl                                                     compound 47

R₁=H, R₂=4-n-decylphenyl, R₇=2-ethylhexyloxy, R₈=4-(bis(4-
methylphenyl)amino)phenyl                                     compound 48

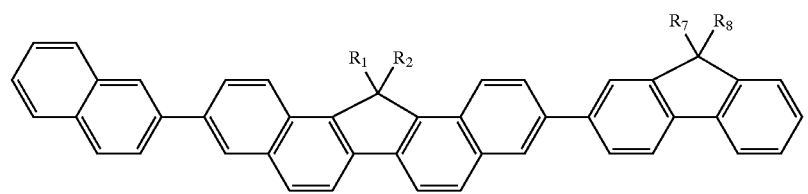

R₁=R₂=n-hexyl, R₇=R₈=2-ethylhexyl                             compound 49

R₁=R₇=4-(bis(4-methylphenyl)amino)phenyl,
R₂=R₈=H                                                       compound 50

R₁=R₂=R₇=R₈=4-n-decylphenyl                                   compound 51

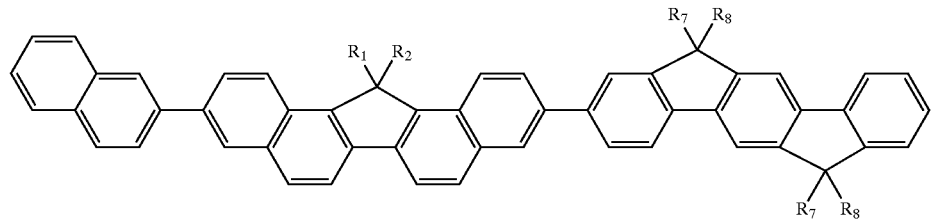

R₁=R₂=n-hexyl, R₇=R₈=2-ethylhexyl                             compound 52

R₁=R₇=4-(bis(4-methylphenyl)amino)phenyl,
R₂=R₈=H                                                       compound 53

R₁=R₂=R₇=R₈=4-n-decylphenyl                                   compound 54

R₁=R₂=R₇=R₈=n-octyl                                           compound 55

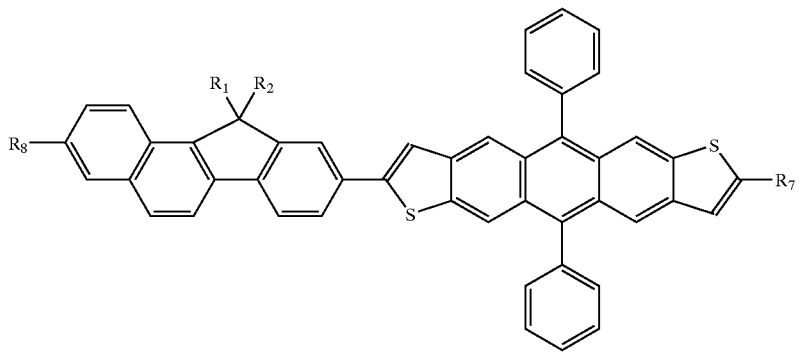

R₁=R₂=n-hexyl, R₇=R₈=2-ethylhexyl    compound 56

R₁=R₂=4-(bis(4-methylphenyl)amino)phenyl,
  R₇=R₈=H    compound 57

R₁=R₂=R₇=R₈=4-n-decylphenyl    compound 58

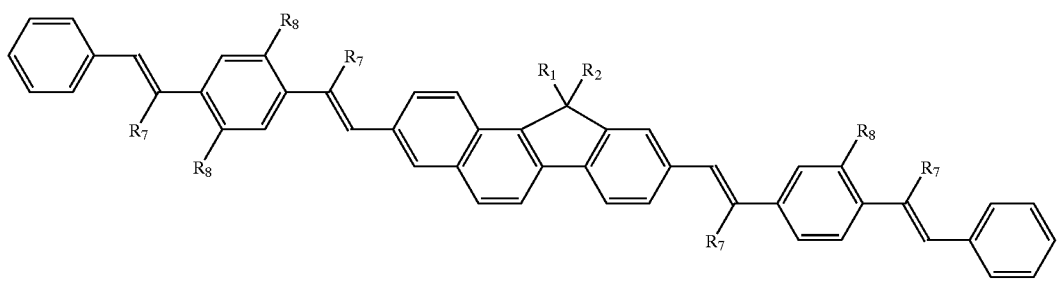

R₁=R₂=n-hexyl, R₇=H, R₈=2-ethylhexyl    compound 59

R₁=R₂=4-(bis(4-methylphenyl)amino)phenyl, R₇=H, R₈=n-hexyloxy    compound 60

R₁=R₂=R₈=4-n-decylphenyl, R₇=CN    compound 61

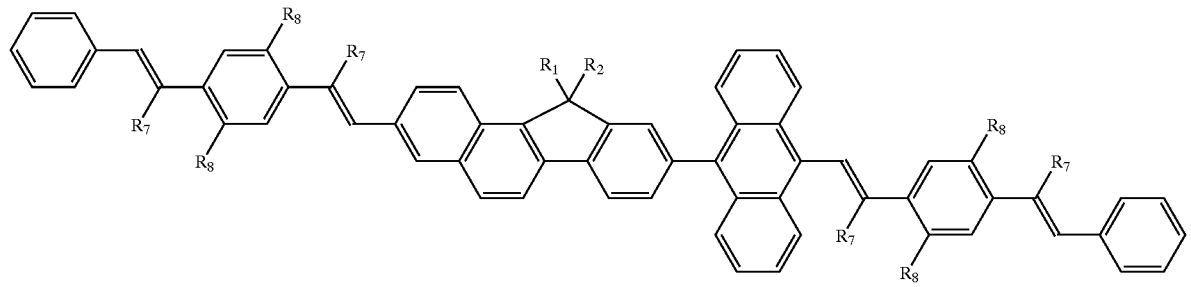

R₁=R₂=n-hexyl, R₇=H, R₈=2-ethylhexyl    compound 62

R₁=R₂=R₈=4-(bis(4-methylphenyl)amino)phenyl,
  R₇=H    compound 63

R₁=R₂ 4-n-decylphenyl, R₇=CN, R₈=n-hexyloxy    compound 64

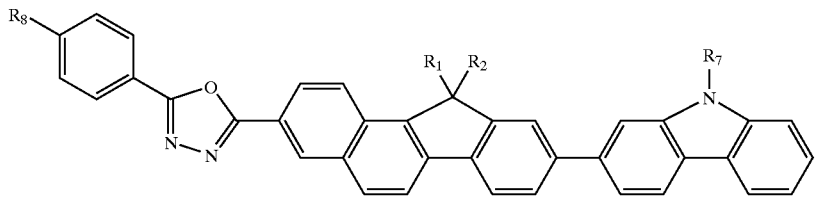

R₁=R₂=n-hexyl, R₇=2-ethylhexyl, R₈=t-butyl     compound 65

R₁=R₂=4-(bis(4-methylphenyl)amino)phenyl, R₇=4-t-butylphenyl, R₈=t-butyl     compound 66

R₁=hexyl, R₂=4-n-decylphenyl, R₇=2-ethylhexyl, R₈=phenyl     compound 67

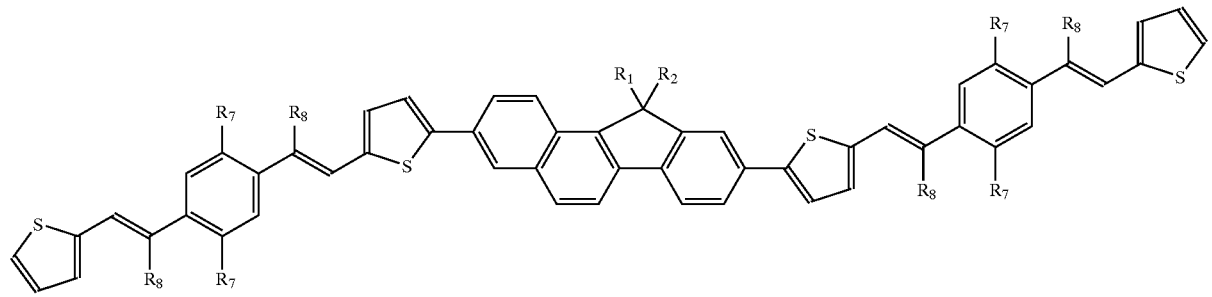

R₁=R₂=n-hexyl, R₇=2-ethylhexyl, R₈=CN     compound 68

R₁=R₂=4-(bis(4-methylphenyl)amino)phenyl, R₇=phenyl, R₈=H     compound 69

R₁=hexyl, R₂=4-n-decylphenyl, R₇=2-ethylhexyloxy, R₈=phenyl     compound 70

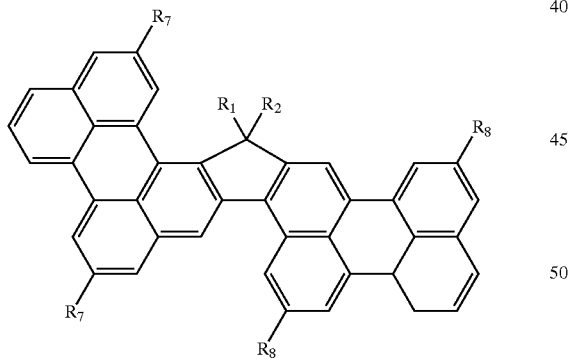

R₁=R₇=n-hexyl, R₂=R₈=2-ethylhexyl     compound 71

R=n-hexyl, R₂=2-ethylhexyl, R₇=2-ethylhexyloxy, R₈=diphenylamino     compound 72

R₁=H, R₂=4-n-decylphenyl, R₇=R₈=4-(bis(4-methylphenyl)amino)phenyl     compound 73

R₁=H, R₂=R₈=4-n-decylphenyl, R₇=2-ethylhexyloxy     compound 74

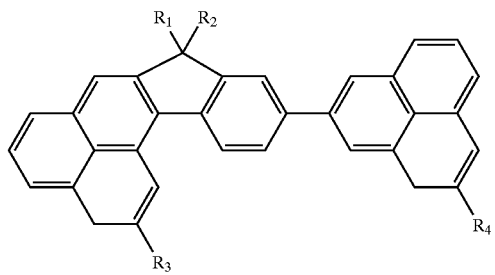

R₁=R₃=n-hexyl, R₂=R₄=2-ethylhexyl     compound 71

R₁=n-hexyl, R₂=2-ethylhexyl, R₃=R₄=2-ethylhexyloxy     compound 72

R₁=R₂=4-(bis(4-methylphenyl)amino)phenyl, R₃=R₄=4-(t-butylphenyl)     compound 73

R₁=H, R₂=4-n-decylphenyl, R₃=2-ethylhexyloxy, R₄=2-ethylhexyl     compound 74

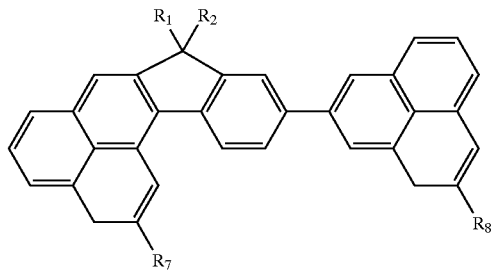

R₁=R₇=n-hexyl, R₂=R₈=2-ethylhexyl     compound 75

R₁=R₂=R₇=R₈=2-ethylhexyl     compound 76

R₁=R₂=4-(bis(4-methylphenyl)amino)phenyl,
R₇=R₈ H                                    compound 77

R₁=H, R₂=4-n-decylphenyl,
R₇=R₈=2-ethylhexyloxy                      compound 78

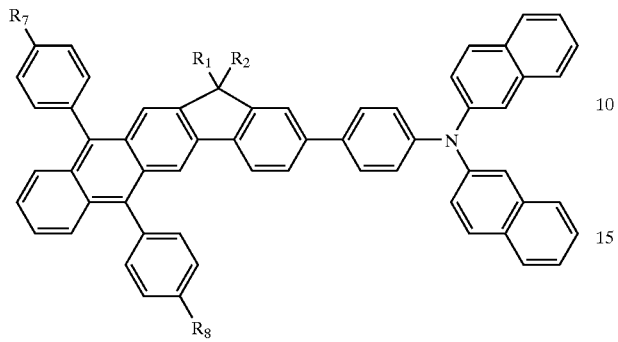

R₁=R₇=n-hexyl, R₂=R₈=2-ethylhexyl          compound 79

R₁=R₂=2-ethylhexyl, R₇=R₈=2-ethylhexyloxy  compound 80

R₁=R₂=4-(bis(4-methylphenyl)amino)phenyl,
R₇=R₈=t-butyl                              compound 81

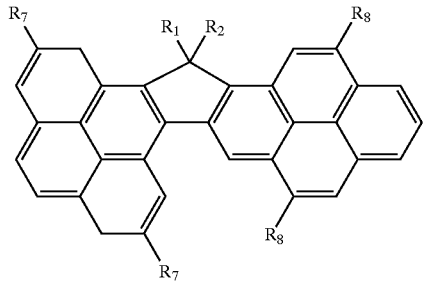

R₁=R₂=4-(bis(4-methylphenyl)amino)phenyl,
R₇=R₈=t-butyl                              compound 82

R₁=H, R₂=4-octylphenyl, R₇=R₈=2-ethylhexyl  compound 83

R₁=R₂=2-ethylhexyl, R₇=2-ethylhexyloxy,
R₈=3,7-dimethyloctyl                       compound 84

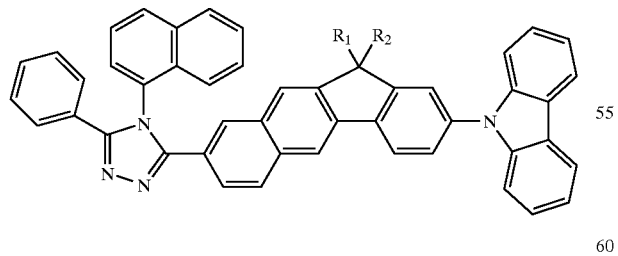

R₁=R₂=2-ethylhexyl                         compound 85

R₁=3,7-dimethyloctyl, R₂=4-octylphenyl     compound 86

R₁=R₂=4-(bis(4-methylphenyl)amino)phenyl   compound 87

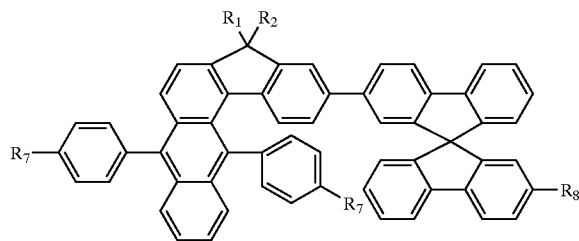

R₁=R₂=4-(bis(4-methylphenyl)amino)phenyl,
R₇=R₈=n-hexyl                              compound 88

R₁=H, R₂=4-octylphenyl, R₇=R₈=2-ethylhexyloxy  compound 89

R₁=R₂=2-ethylhexyl, R₇=4-t-butylphenyl,
R₈=3,7-dimethyloctyl                       compound 90

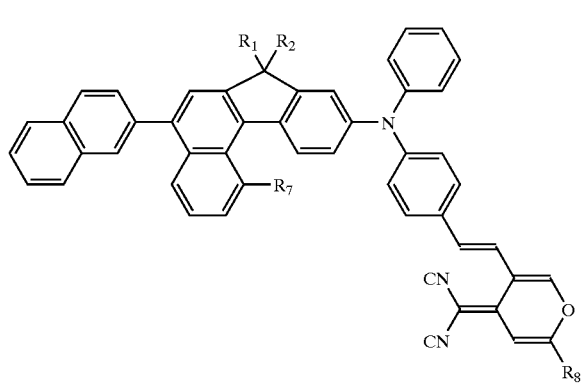

R₁=R₂=4-(bis(4-methylphenyl)amino)phenyl, R₇=n-hexyl, R₈=t-
butyl                                      compound 91

R₁=H, R₂=4-octylphenyl, R₇=R₈=2-ethylhexyl  compound 92

R₁=R₂=2-ethylhexyl, R₇=3,7-dimethyloctyloxy,
R₈=n-hexyl                                 compound 93

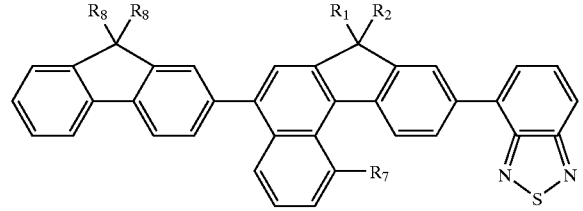

R₁=R₂=4-(bis(4-methylphenyl)amino)phenyl, R₇=n-hexyl,
R₈=phenyl                                  compound 94

R₁=R₂=2-ethylhexyl, R₇=3,7-dimethyloctyloxy,
R₈=n-hexyl                                 compound 95

R₁=R₂=2-ethylhexyl, R₇=3,7-dimethyloctyloxy,
R₈=n-hexyl                                 compound 96

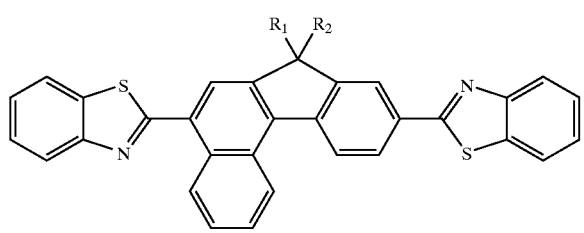

R₁=R₂=4-(bis(4-methylphenyl)amino)phenyl  compound 97

R₁=ethyl=R₂                                compound 98

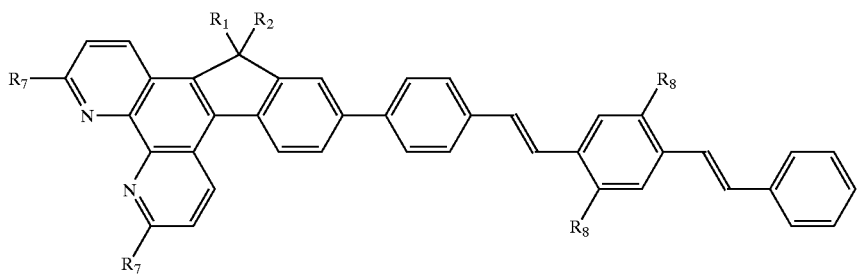

R₁=R₂=R₇=R₈=2-ethylhexyl  compound 99

R₁=H, R₂=R₇=4-octylphenyl,
R₈=2-ethylhexyloxy  compound 100

R₁=R₂=2-ethylhexyl, R₇=t-butyl,
R₈=diphenylamino  compound 101

R₁=R₂=4-(bis(4-methylphenyl)amino)phenyl,
R₇=H, R₈=phenyl  compound 102

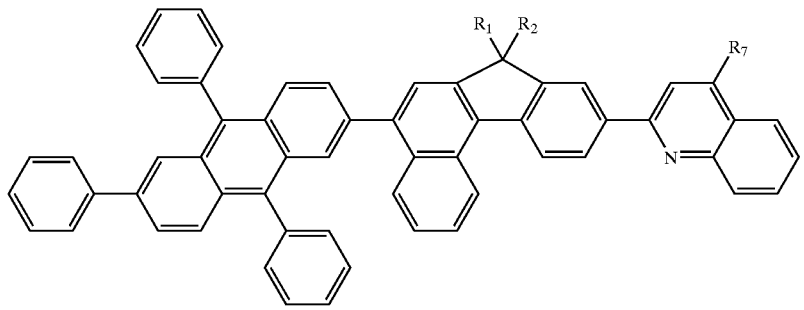

R₁=R₂=2-ethylhexyl, R₇=dimethylamino  compound 103

R₁=n-hexyl, R₂=4-octylphenyl, R₇=t-butyl  compound 104

R₁=R₂=4-(bis(4-methylphenyl)amino)phenyl,
R₇=H  compound 105

R₁=R₂=2-ethylhexyl, R₇=R₈=phenyl  compound 106

R₁=H, R₂=R₇=4-octylphenyl,
R₈=2-ethylhexyloxy  compound 107

R₁=R₂=n-octyl, R₇=diphenylamino, R₈=t-butyl  compound 108

R₁=R₂=4-(bis(4-methylphenyl)amino)phenyl, R₇=t-butyl, R₈=phenyl  compound 109

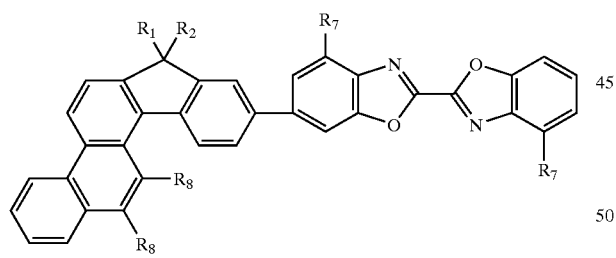

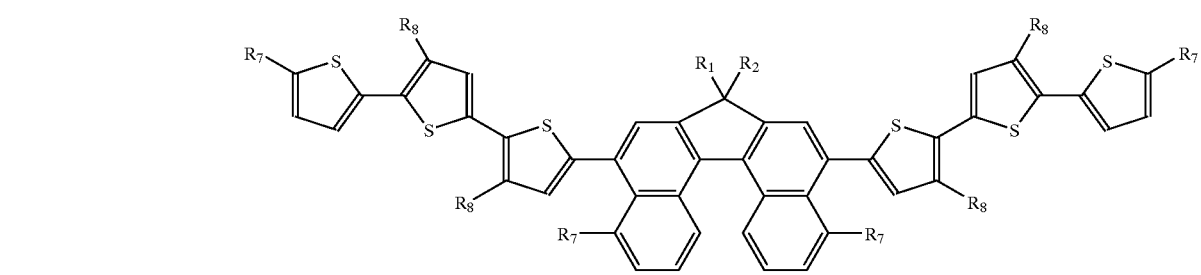

R₁=R₂=R₇=R₈=2-ethylhexyl  compound 110

R₁=R₂=R₈=n-hexyl, R₇=phenyl  compound 111

R₁=R₇=n-hexyl, R₂=(4-diphenylamino)pheny, R₈=2-ethylhexyl  compound 112

R₁=H, R₂=4-decylphenyl, R₇=n-hexyl, R₈=3,7-dimethyloctyl  compound 113

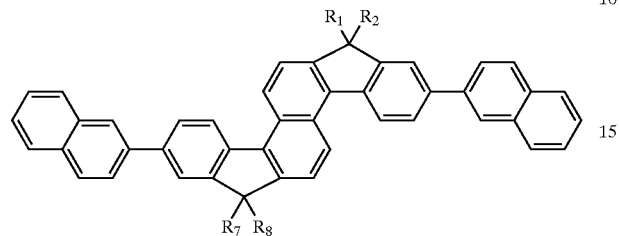

R₁=R₂=2-ethylhexyl, R₇=R₈=phenyl  compound 114

R₁=R₇=H, R₂=R₈=4-octylphenyl  compound 115

R₁=R₂=n-octyl, R₇=(4-diphenylamino)phenyl, R₈=2-ethylhexyl  compound 116

R₁=R₂=4-(bis(4-methylphenyl)amino)phenyl, R₇=n-decyl, R₈=3,7-dimethyloctyl  compound 117

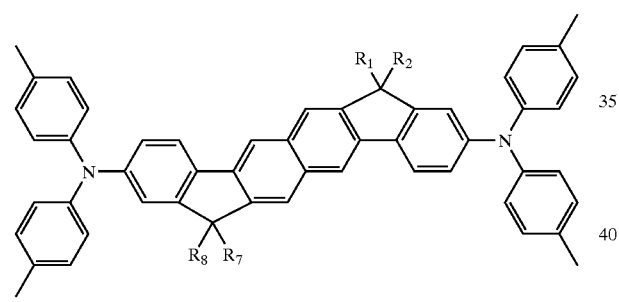

R₁=R₂=R₇=R₈=2-ethylhexyl  compound 118

R₁=R₇=n-hexyl, R₂=R₈=4-octylphenyl  compound 119

R₁=R₂=n-octyl, R₇=(4-diphenylamino)phenyl, R₈=2-ethylhexyl  compound 120

R₁=R₂=R₇=2-ethylhexyl, R₈=4-hexylphenyl  compound 121

R₁=H, R₂=R₇=3,7-dimethyloctyl, R₈=2-ethylhexyl  compound 122

R₁=R₇=(4-diphenylamino)phenyl, R₂=n-octyl, R₈=n-hexyl  compound 123

R₁=R₂=4-(bis(4-methylphenyl)amino)phenyl, R₇=n-decyl, R₈=H  compound 124

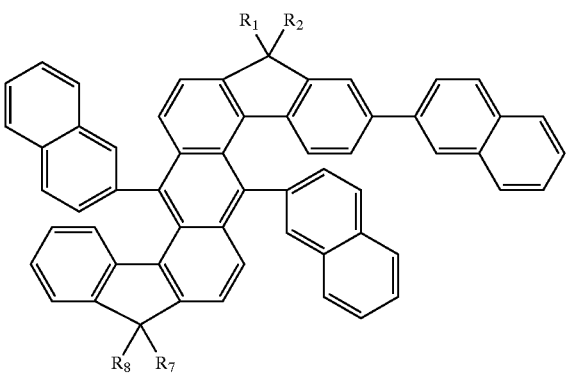

R₁=R₂=R₇=R₈=2-ethylhexyl  compound 125

R₁=H, R₂=R₇=3,7-dimethyloctyl, R₈=(4-diphenylamino)phenyl  compound 126

R₁=R₇=4-(bis(4-methylphenyl)amino)phenyl, R₂=R₈ n-decyl  compound 127

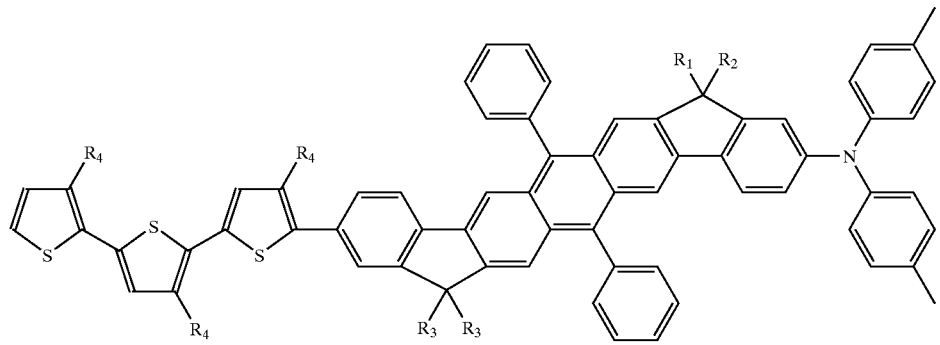

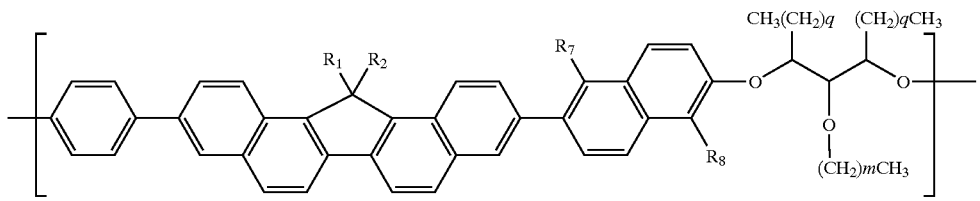

R₁=R₂=R₇=R₈=2-ethylhexyl, m=10, q=6  compound 128

R₁=H, R₂=4-decylphenyl,
 R₇=R₈=3,7-dimethyloctyl, m=2, q=5  compound 129

R₁=R₇=4-(bis(4-methylphenyl)amino)phenyl, R₂=R₈=n-decyl,
 m=q=1  compound 130

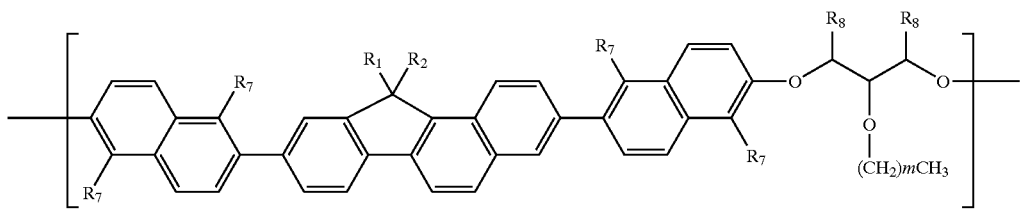

R₁=R₂=2-ethylhexyl, R₇=n-hexyloxy,
 R₈=ethyl, m=10  compound 131

R₁=R₂=4-decylphenyl, R₇=H, R₈=n-hexyl, m=1  compound 132

R₁=R₂=n-hexyl, R₇=R₈=H, m=11  compound 133

R₁=R₂=4-(bis(4-methylphenyl)amino)phenyl,
 R₃=diphenylamino, R₄=H, m=17  compound 134

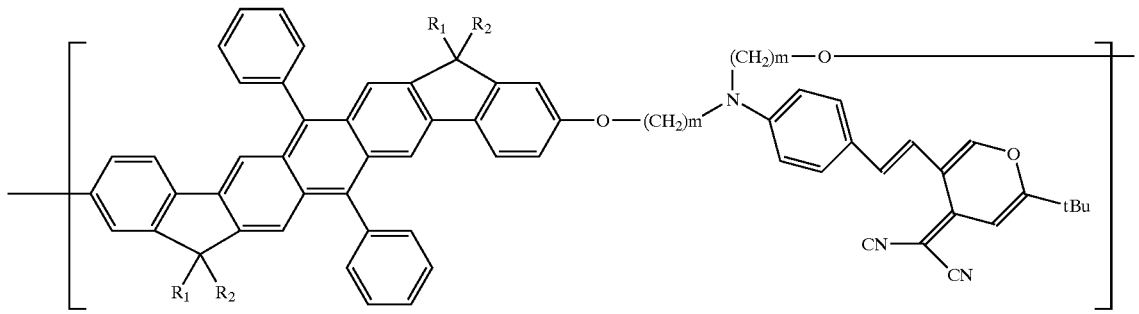

R₁=R₂=R₇=R₈=2-ethylhexyl, m=3  compound 135

R₁=H, R₂=R₇=3,7-dimethyloctyl,
 R₈=(4-diphenylamino)phenyl, m=2  compound 136

R₁=R₇=4-(bis(4-methylphenyl)amino)phenyl,
 R₂=R₈=n-decyl, m=3  compound 137

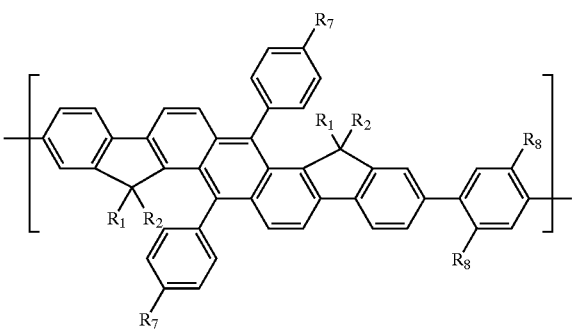

$R_1=R_2$=n-hexyl, $R_7=R_8$=2-ethylhexyl  compound 137

$R_1$=H, $R_2=R_7$=3,7-dimethyloctyl,
$R_8$=(4-diphenylamino)phenyl  compound 138

$R_1$=4-(bis(4-methylphenyl)amino)phenyl, $R_2$=n-decyl, $R_7$=t-butyl,
$R_8$=n-hexyloxy  compound 139

$R_1=R_2$ n-hexyl, $R_7=R_8$ 2-ethylhexyl  compound 140

$R_1$=H, $R_2=R_7$=3,7-dimethyloctyl,
$R_8$=(4-diphenylamino)phenyl  compound 141

$R_1$=4-(bis(4-methylphenyl)amino)phenyl, $R_2$=n-decyl, $R_7$=t-butyl,
$R_8$=n-hexyloxy  compound 142

$R_1$=4-(N-carbazole)phenyl, $R_2$=n-decyl, $R_7$=2-ethylhexyloxy,
$R_8$=n-hexyl  compound 143

$R_1$=4-(n-decyl)phenyl, $R_2=R_7=R_8$=H  compound 144

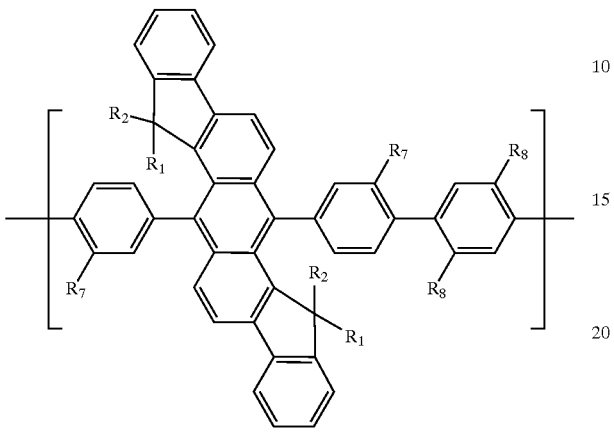

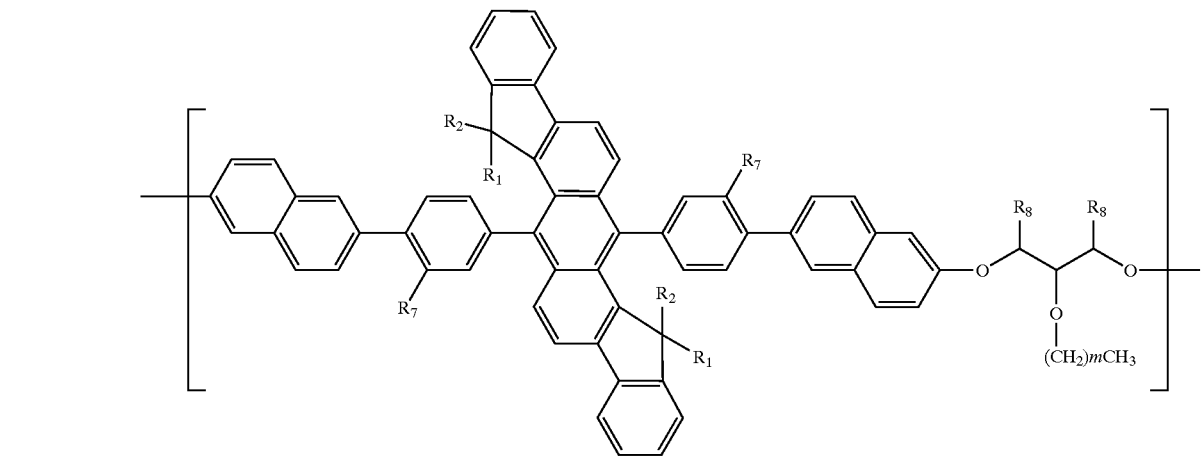

$R_1=R_2$=2-ethylhexyl, $R_7$=n-hexyloxy,
$R_8$=ethyl, m=10  compound 145

$R_1=R_2$=4-decylphenyl, $R_7$=H, $R_8$=n-hexyl, m=1  compound 146

$R_1=R_7=R_8$=H, $R_2$=4-decylphenyl, m=11  compound 147

$R_1=R_2$=4-(bis(4-methylphenyl)amino)phenyl, $R_7$=diphenylamino,
$R_8$=H, m=17  compound 148

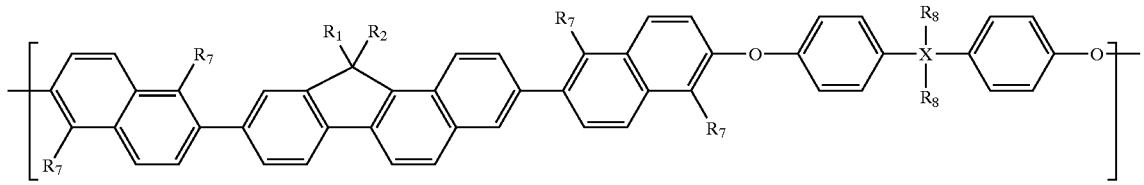

R₁=R₂=2-ethylhexyl, R₇=n-hexyloxy,
R₈=ethyl, X=C                                      compound 149

R₁=R₂=2-ethylhexyl, R₇=n-hexyl,
R₈=CF₃, X=C                                        compound 150

R₁=R₇=4-decylphenyl, R₂=H, R₈=n-butyl, X=Si  compound 151

R₁=H, R₂=4-(bis(4-methylphenyl)amino)phenyl, R₇=diphenyl-
amino, R₈=n-hexyl, X=Si                            compound 152

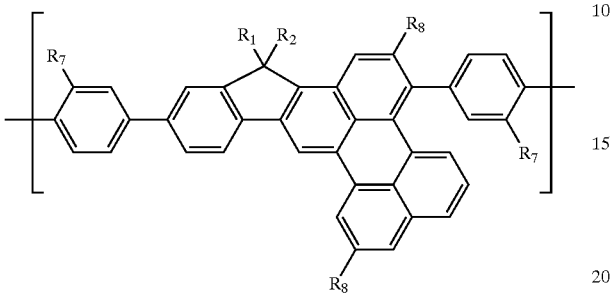

R₁=R₂=n-hexyl, R₇=R₈=2-ethylhexyl                  compound 153

R₁=H, R₂=R₇=3,7-dimethyloctyl,
R₈=(4-diphenylamino)phenyl                         compound 154

R₁=4-(bis(4-methylphenyl)amino)phenyl, R₂=n-decyl, R₇=t-butyl,
R₈=n-hexyloxy                                      compound 155

R₁=4-(N-carbazole)phenyl, R₂=n-decyl, R₇=2-ethylhexyloxy,
R₈=n-hexyl                                         compound 156

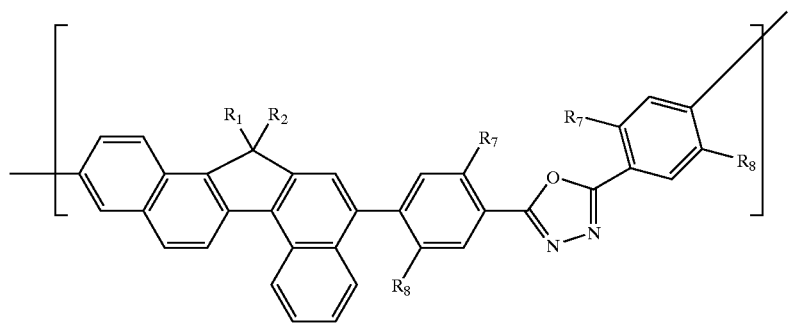

R₁=R₂=n-hexyl, R₇=R₈=2-ethylhexyloxy               compound 157

R₁=H, R₂=R₇=3,7-dimethyloctyl,
R₈=(4-diphenylamino)phenyl                         compound 158

R₁=4-(bis(4-methylphenyl)amino)phenyl, R₂=n-decyl, R₇=t-butyl,
R₈=n-hexyloxy                                      compound 159

R₁=R₂=n-hexyl, R₇=R₈=2-ethylhexyloxy               compound 160

R₁=H, R₂=R₇=3,7-dimethyloctyl,
R₈=(4-diphenylamino)phenyl                         compound 161

R₁=4-(bis(4-methylphenyl)amino)phenyl, R₂=n-decyl, R₇=t-butyl,
R₈=n-hexyloxy                                      compound 162

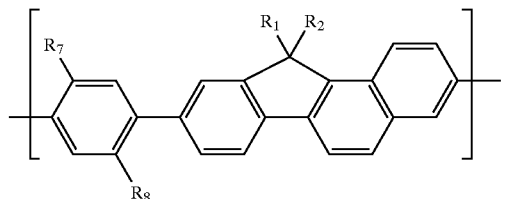

R₁=R₂=n-hexyl, R₇=R₈=2-ethylhexyloxy               compound 163

R₁=n-hexyl, R₂=R₇=3,7-dimethyloctyl, R₈=(4-diphenylami-
no)phenyl                                          compound 164

R₁=R₂=n-hexyl, R₇=R₈=H                             compound 165

R₁=4-(bis(4-methylphenyl)amino)phenyl, R₂=n-decyl, R₇=t-butyl,
R₈=n-hexyloxy                                      compound 166

R₁=R₂ n-hexyl, R₇=R₈=n-octyl                       compound 167

R₁=R₂=n-hexyl, R₇=R₈=n-hexyloxy                    compound 168

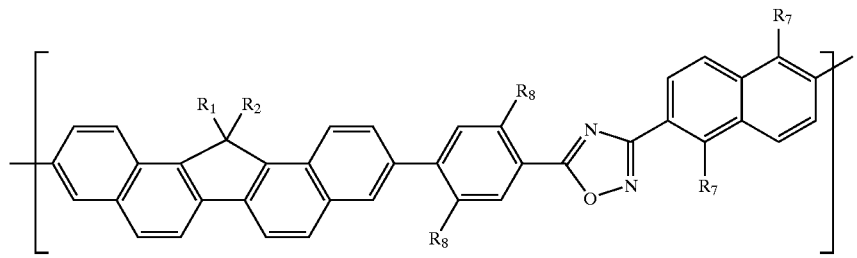

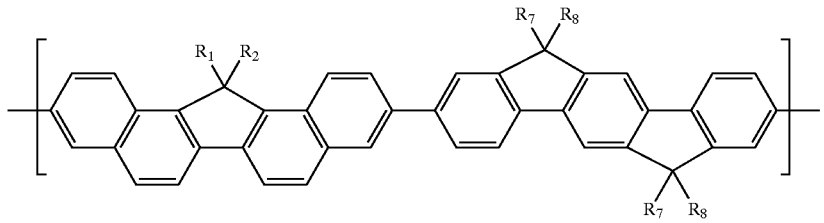

R₁=R₂=n-hexyl, R₇=R₈=2-ethylhexyl  compound 169

R₁=H, R₂=R₇=3,7-dimethyloctyl, R₈=(4-diphenylamino)phenyl  compound 170

R₁=4-(bis(4-methylphenyl)amino)phenyl, R₂=n-decyl, R₇=R₈=n-hexyl  compound 171

R₁=R₂=n-hexyl, R₇=R₈ 4-octylphenyl  compound 172

R₁=n-hexyl, R₂=R₇=3,7-dimethyloctyl, R₈=(4-diphenylamino)phenyl  compound 173

R₁=R₂=R₇=R₈=n-hexyl  compound 174

R₁=4-(bis(4-methylphenyl)amino)phenyl, R₂=n-decyl, R₇=R₈=n-octyl  compound 175

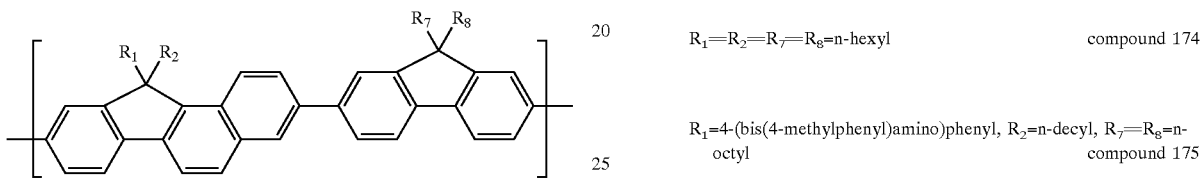

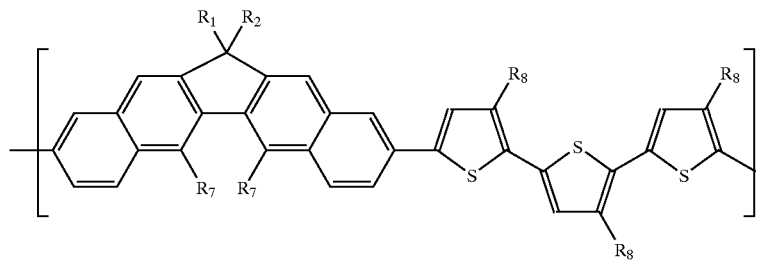

R₁=R₂=n-hexyl, R₇=n-hexyloxy, R₈=2-ethylhexyl  compound 176

R₁=R₇=n-hexyl, R₂=3,7-dimethyloctyl, R₈=(4-diphenylamino)phenyl  compound 177

R₁=R₂=R₇=R₈=n-hexyl  compound 178

R₁=4-(bis(4-methylphenyl)amino)phenyl, R₂=n-decyl, R₇=methyl, R₈=n-hexyl  compound 179

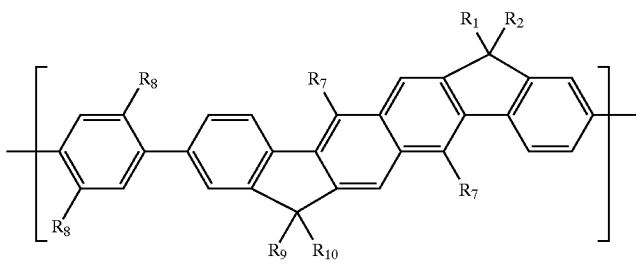

R₁=R₂=R₉=R₁₀=n-hexyl,
R₇=R₈=2-ethylhexyloxy                             compound 180

R₁=R₉=n-hexyl, R₂=R₇=R₁₀=3,7-dimethyloctyl,
R₈=(4-diphenylamino)phenyl                        compound 181

R₁=R₂=R₉=R₁₀=n-hexyl, R₇=n-hexyloxy,
R₈=H                                              compound 182

R₁=R₉=4-(bis(4-methylphenyl)amino)phenyl,
R₂=R₁₀=n-decyl, R₇=t-butyl, R₈=n-hexyloxy         compound 183

R₁=R₂=R₉=R₁₀=n-hexyl, R₇=n-hexyloxy,
R₈=n-octyl                                        compound 184

R₁=R₂=R₉=R₁₀=n-hexyl,
R₇=R₈=n-hexyloxy                                  compound 185

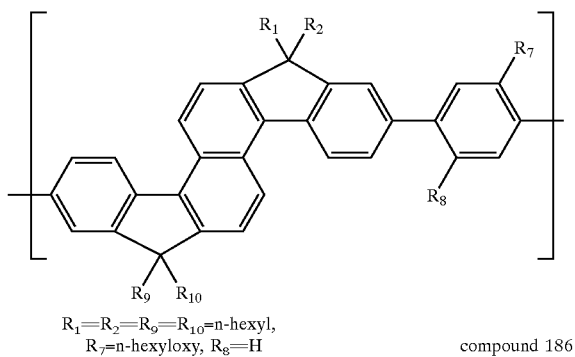

R₁=R₂=R₉=R₁₀=n-hexyl,
R₇=n-hexyloxy, R₈=H                               compound 186

R₁=R₂=R₉=R₁₀=n-hexyl,
R₇=R₈=(4-diphenylamino)phenyl                     compound 187

R₁=R₂=R₇=R₈=R₉=R₁₀=n-hexyl                        compound 188

R₁=R₉=4-decylphenyl, R₂=R₁₀=H,
R₇=R₈=n-hexyloxy                                  compound 189

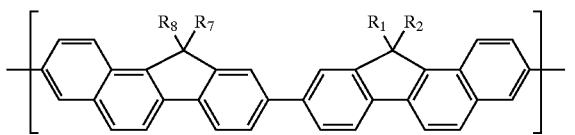

R₁=R₂=R₇=R₈=n-hexyl                               compound 190

R₁=H, R₂=R₇=3,7-dimethyloctyl,
R₈ (4-diphenylamino)phenyl                        compound 191

R₁=4-(bis(4-methylphenyl)amino)phenyl,
R₂=n-decyl, R₇=R₈=n-hexyl                         compound 192

R₁=R₂=n-hexyl, R₇=R₈=n-butyl                      compound 193

R₁=R₂=2-ethylhexyl,
R₇=R₈=(4-diphenylamino)phenyl                     compound 194

R₁=R₂=R₇=R₈=n-hexyl                               compound 195

R₁=4-decylphenyl, R₂=H, R₇=R₈=CF₃                 compound 196

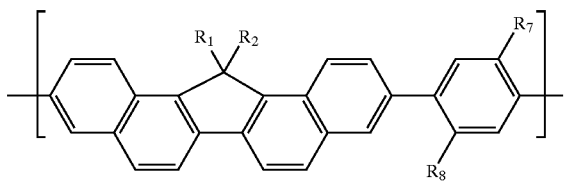

R₁=R₂=n-hexyl, R₇=R₈=2-ethylhexyloxy              compound 197

R₁=R₂=n-hexyl, R₇=R₈=H                            compound 198

R₁=2-ethylhexyl, R₂=n-hexyl, R₇=R₈=H              compound 199

R₁=n-hexyl, R₂=R₇=3,7-dimethyloctyl, R₈=(4-diphenylamino)phenyl   compound 200

R₁=2-ethylhexyl, R₂=n-hexyl, R₇=R₈=n-hexyloxy     compound 201

R₁=4-(bis(4-methylphenyl)amino)phenyl, R₂=n-decyl, R₇=t-butyl,
R₈=n-hexyloxy                                     compound 202

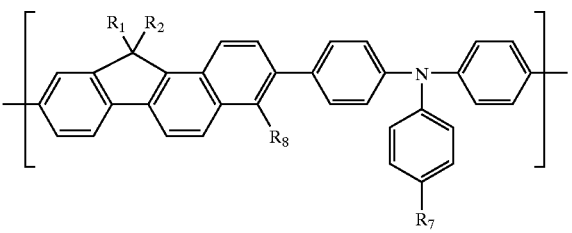

R₁=R₂=n-hexyl, R₇=R₈=2-ethylhexyl                 compound 203

R₁=2-ethylhexyl, R₂=n-hexyl, R₇=R₈=H              compound 204

R₁=n-hexyl, R₂=R₈=3,7-dimethyloctyl, R₇=(4-diphenylamino)phenyl   compound 205

R₁=R₂=n-hexyl, R₇=t-butyl, R₈=H                   compound 206

R₁=4-(bis(4-methylphenyl)amino)phenyl, R₂=n-decyl, R₇=n-butyl,
R₈=n-hexyloxy                                     compound 207

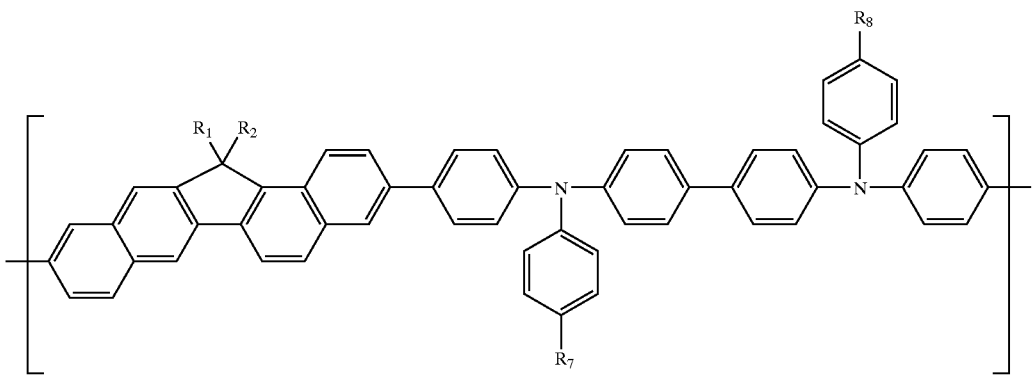

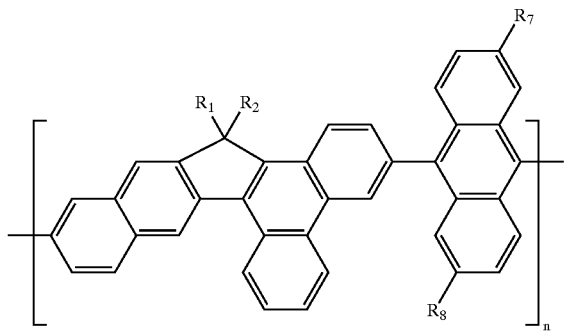

$R_1=R_2$=n-hexyl, $R_7=R_8$=2-ethylhexyloxy       compound 208

$R_1$=2-ethylhexyl, $R_2$=n-hexyl, $R_7=R_8$=n-butyl       compound 209

$R_1$=n-hexyl, $R_2$=(4-diphenylamino)phenyl, $R_7$=H, $R_8$=3,7-dimethyloctyl       compound 210

$R_1=R_2$=n-hexyl,
  $R_7=R_8$=4-(bis(4-methylphenyl)amino)phenyl       compound 211

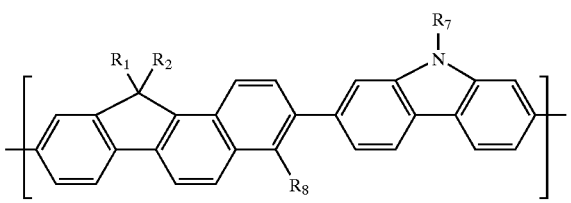

$R_1=R_2$=n-hexyl, $R_7=R_8$=2-ethylhexyl       compound 212

$R_1$=2-ethylhexyl, $R_2$=n-hexyl,
  $R_7$=4-t-butylphenyl, $R_8$=H       compound 213

$R_1$=n-hexyl, $R_2=R_8$=3,7-dimethyloctyl, $R_7$=(4-diphenylamino)phenyl       compound 214

$R_1=R_2$=n-hexyl, $R_7$=2-ethylhexyl, $R_8$=H       compound 215

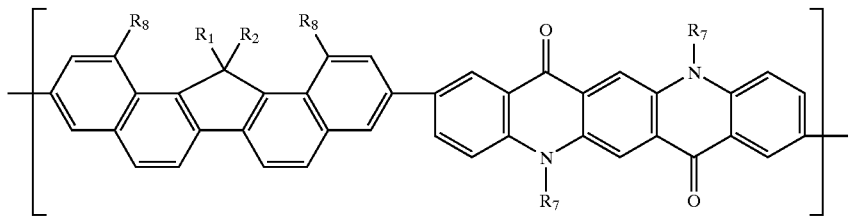

$R_1=R_2$=n-hexyl, $R_7=R_8$=2-ethylhexyl       compound 216

$R_1$=2-ethylhexyl, $R_2$=n-hexyl,
  $R_7$=4-t-butylphenyl, $R_8$=H       compound 217

$R_1$=n-hexyl, $R_2$=3,7-dimethyloctyl,
  $R_7$=(4-diphenylamino)pheny, $R_8$=n-hexyloxy       compound 218

$R_1=R_2$=n-hexyl, $R_7=R_8$=2-ethylhexyl       compound 219

$R_1$=2-ethylhexyl, $R_2$=n-hexyl,
  $R_7$=4-t-butylphenyl, $R_8$=n-hexyloxy       compound 220

$R_1=R_2$=n-hexyl, $R_7$=2-ethylhexyl, $R_8$=H       compound 221

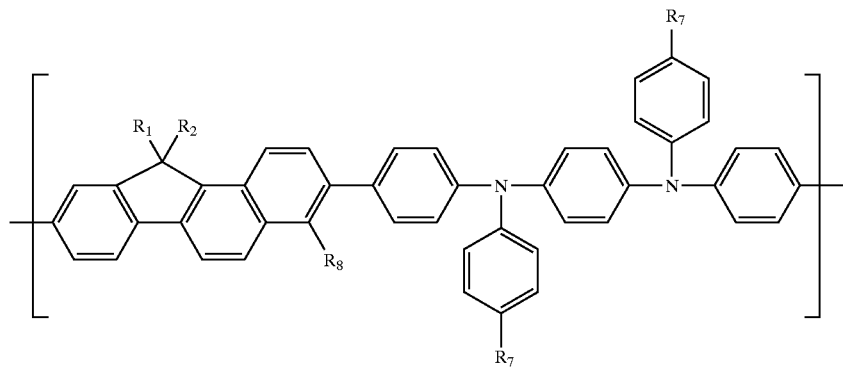

R₁=R₂=n-hexyl, R₇=R₈=n-butyl     compound 222

R₁=R₂=2-ethylhexyl,
R₇=Rx =(4-diphenylamino)phenyl     compound 223

R₁=R₂=R₇=R₈ n-hexyl     compound 224

R₁=4-decylphenyl, R₂=H, R₇=R₈=CF₃     compound 225

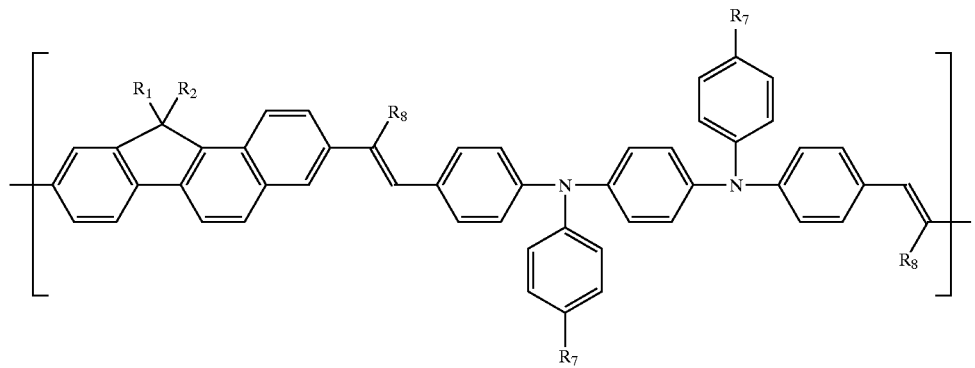

R₁=R₂=n-hexyl, R₇=n-butyl, R₈=H     compound 226

R₁=R₂=2-ethylhexyl, R₇=4-t-butylphenyl,
R₈=CN     compound 227

R₁=4-decylphenyl, R₂=H, R₇=CF₃, R₈=phenyl     compound 228

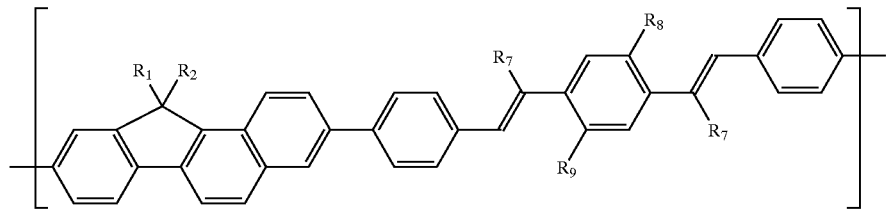

R₁=R₂=n-hexyl, R₇=phenyl,
R₈=R₉=2-ethylhexyl     compound 229

R₁=2-ethylhexyl, R₂=n-hexyl,
R₇=R₈=H, R₉=4-t-butylphenyl     compound 230

R₁=R₂=n-hexyl,
R₇=H, R₈=methoxy, R₉=3,7-dimethyloctyloxy     compound 231

R₁=n-hexyl, R₂=R₈=3,7-dimethyloctyl, R₇=H, R₉=(4-diphenylamino)phenyl     compound 232

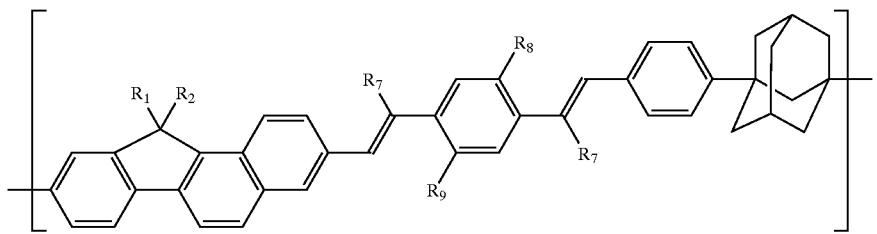

R₁=2-ethylhexyl, R₂=n-hexyl,
R₇=CN, R₈ R₉=4-t-butylphenyl    compound 233

R₁=R₂=n-hexyl, R₇=R₈=H, R₉=2-ethylhexyl    compound 234

R₁=4-decylphenyl, R₂=R₈=3,7-dimethyloctyl, R₇=H, R₉=(4-diphenylamino)phenyl    compound 235

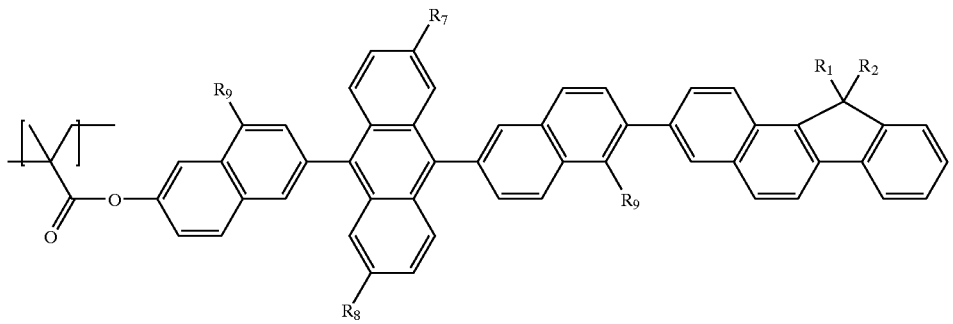

R₁=2-ethylhexyl, R₂=n-hexyl, R₇=CN,
R₈=R₉=4-t-butylphenyl    compound 236

R₁=R₂=n-hexyl, R₇=R₈=H, R₉=2-ethylhexyl    compound 237

R₁=4-decylphenyl, R₂=R₈=3,7-dimethyloctyl, R₇=H, R₉=(4-diphenylamino)phenyl    compound 238

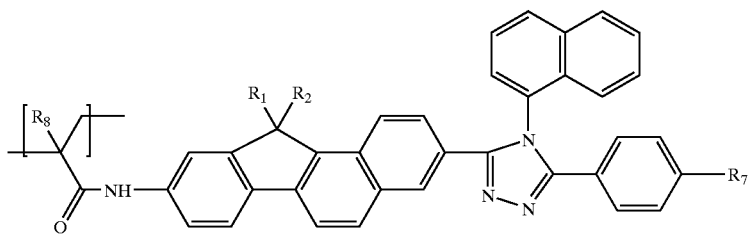

R₁=2-ethylhexyl, R₂=n-hexyl, R₇=t-butyl, R₈=H    compound 239

R₁=R₂=n-hexyl, R₇=phenyl, R₈=CN    compound 240

R₁=4-decylphenyl, R₂=R₇=3,7-dimethyloctyl, R₈=methyl    compound 241

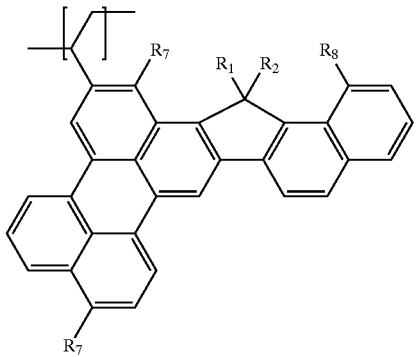

$R_1=R_2=R_7$ $R_8$=2-ethylhexyl  compound 242

$R_1=R_2$=n-hexyl, $R_7$=4-decylphenyl,
$R_8$=2-ethylhexyloxy  compound 243

$R_1$=(4-diaminophenyl)1phenyl,
$R_2=R_7$=3,7-dimethyloctyl, $R_8$=H  compound 244

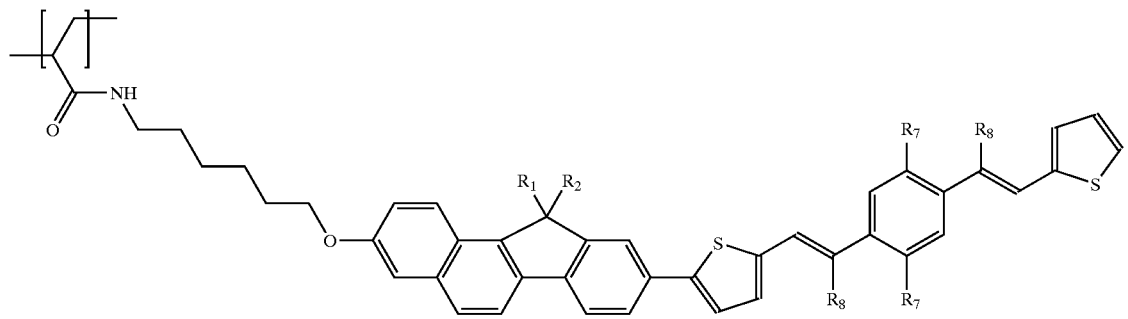

$R_1$=2-ethylhexyl, $R_2$=n-hexyl, $R_7$=t-butyl, $R_8$=H  compound 245

$R_1=R_2$=n-hexyl, $R_7$=n-octyloxy, $R_8$=CN  compound 246

$R_1$=4-decylphenyl, $R_2=R_7$=3,7-dimethyloctyl,
$R_8$=CN  compound 247

$R_1$=2-ethylhexyl, $R_2$=n-hexyl, $R_7$=t-butyl  compound 248

$R_1=R_2$=n-hexyl, $R_7$=phenyl  compound 249

$R_1$=4-decylphenyl, $R_2$=n-octyl, $R_7$=CN  compound 250

$R_1$=4-(diphenylamino)phenyl,
$R_2$=n-hexyl,
$R_7$=n-hexyloxy  compound 251

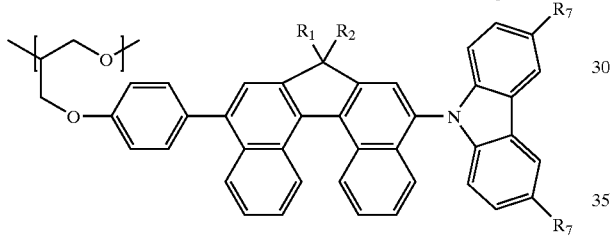

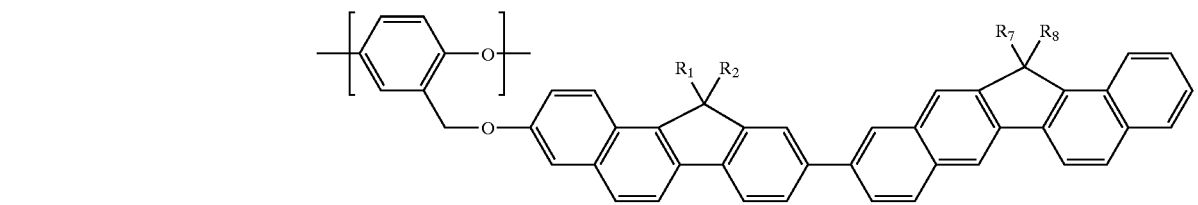

$R_1=R_2$=2-ethylhexyl, $R_7$ $R_8$=4-t-butylphenyl  compound 252

$R_1=R_2=R_7=R_8$=n-octyl  compound 253

$R_1=R_7$=4-decylphenyl,
$R_2=R_8$=3,7-dimethyloctyl  compound 254

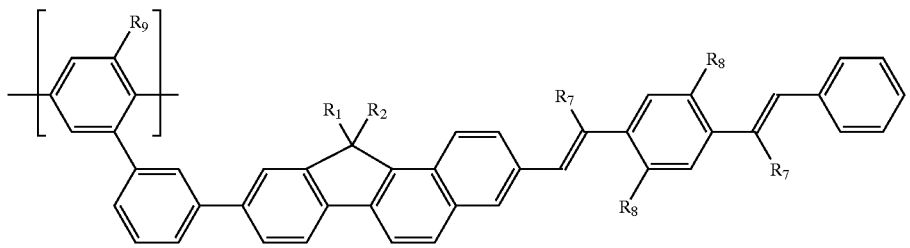

R₁=2-ethylhexyl, R₂=n-hexyl, R₇=CN,
R₈=R₉=4-t-butylphenyl            compound 255

R₁=R₂=n-hexyl, R₇=H, R₈=n-hexyloxy,
R₉=2-ethylhexyl                  compound 256

R₁=4-decylphenyl, R₂=R₈=3,7-dimethyloctyl, R₇=H, R₉=(4-
diphenylamino)phenyl             compound 257

R₁=2-ethylhexyl, R₂=n-hexyl,
R₇=t-butyl, R₈=n-butyloxy        compound 264

R₁=R₂=n-hexyl, R₇=phenyl, R₈=H   compound 265

R₁=4-decylphenyl, R₂=R₇=3,7-dimethyloctyl,
R₈=methoxy                       compound 266

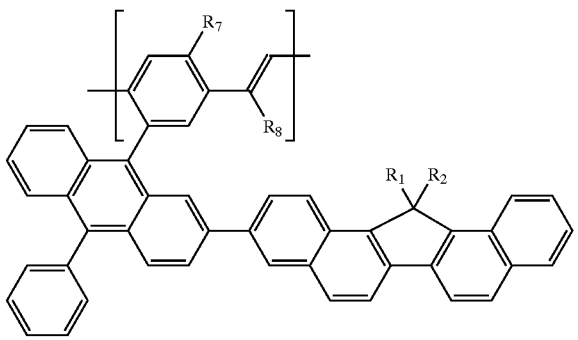

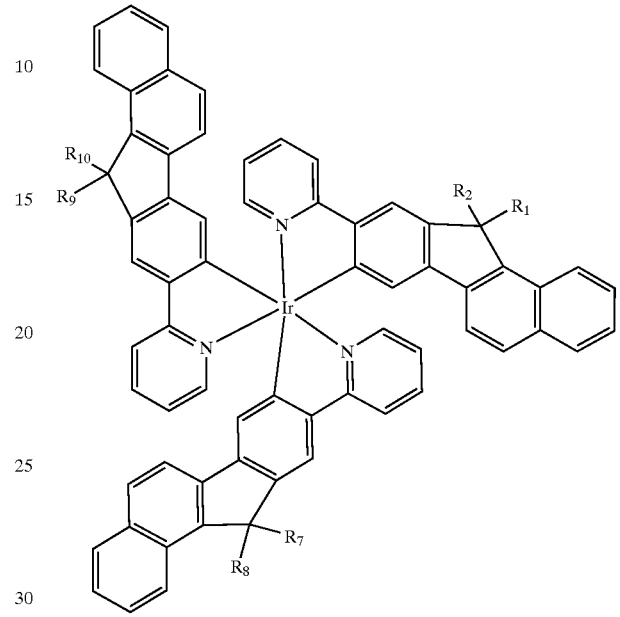

R₁=2-ethylhexyl, R₂=n-hexyl, R₇=n-hexyl, R₈=H   compound 258

R₁=R₂=n-hexyl, R₇=n-octyloxy, R₈=CN             compound 259

R₁=R₇=4-decylphenyl, R₂=3,7-dimethyloctyl,
R₈=CN                                           compound 260

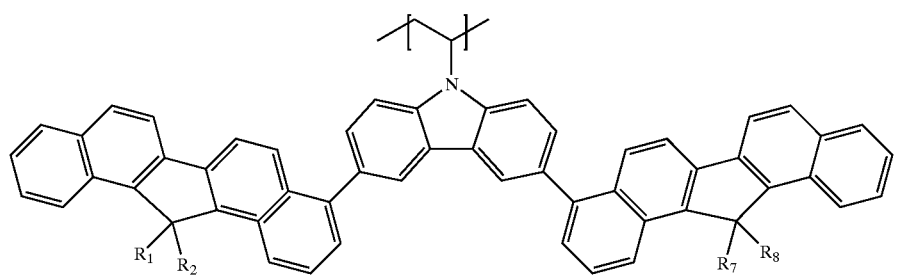

R₁=R₂=R₇=R₈=2-ethylhexyl              compound 261

R₁=R₇=n-hexyl,
R₂=R₈=(4-diphenylamino)phenyl         compound 262

R₁=n-hexyl, R₂=(4-diphenylamino)phenyl,
R₇=H, R₈=4-decylphenyl                compound 263

R₁=R₂=R₇=R₈=R₉=R₁₀=2-ethylhexyl       compound 267

R₁=R₇=R₉=n-hexyl,
R₂=R₈=R₁₀=4-t-butylphenyl             compound 268

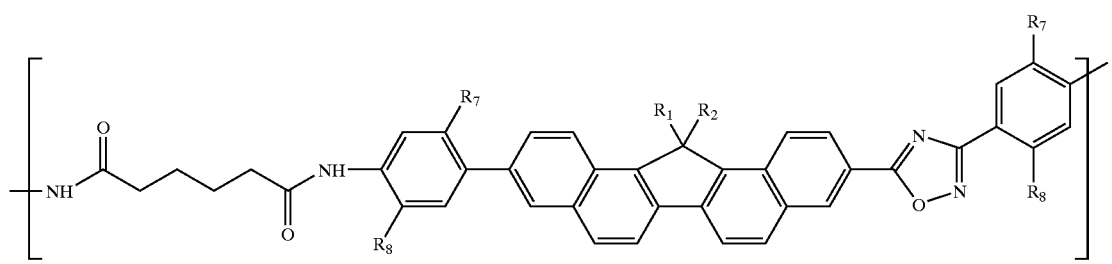

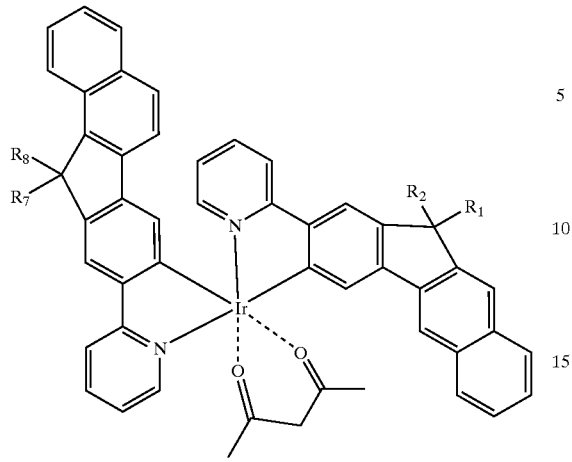

R₁=R₂=n-hexyl, R₇=R₈=2-ethylhexyl  compound 269

R₁=R₇=H, R₂=R₈=4-t-butylphenyl  compound 270

R₁=4-(diphenylamino)phenyl, R₂=R₇=n-hexyl,
R₈=4-t-butylphenyl  compound 271

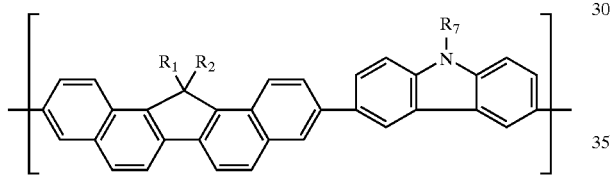

R₁=R₂=n-hexyl, R₇=2-ethylhexyl  compound 272

R₁=n-hexyl, R₂=R₇=2-ethylhexyl  compound 273

R₁=R₂=2-ethylhexyl, R₇=4-t-butylphenyl  compound 274

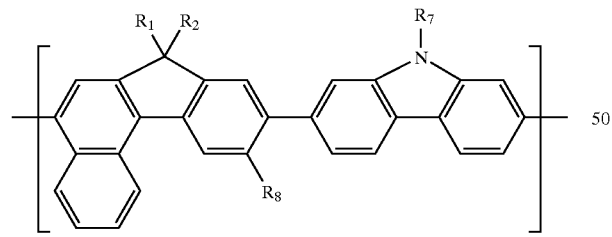

R₁=R₂=n-hexyl, R₇=R₈=2-ethylhexyl  compound 275

R₁=2-ethylhexyl, R₂=n-hexyl,
R₇=4-t-butylphenyl, R₈=H  compound 276

R₁=n-hexyl, R₂=R₈=3,7-dimethyloctyl, R₇=(4-diphenylamino)phenyl  compound 277

R₁=phenyl, R₂=4-decylphenyl,
R₇=2-ethylhexyl, R₈=H  compound 278

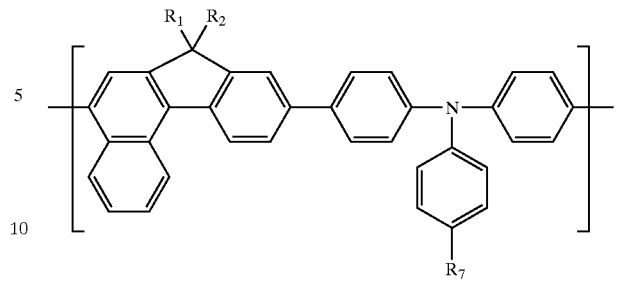

R₁=R₂=n-hexyl, R₇=R₈=n-butyl  compound 279

R₁=R₂=n-hexyl, R₇=t-butyl, R₈=H  compound 280

R₁=R₂=R₇=R₈=n-hexyl  compound 281

R₁=4-decylphenyl, R₂=phenyl, R₇=t-butyl, R₈=H  compound 282

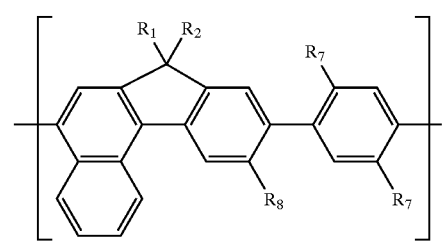

R₁=R₂=n-hexyl, R₇=R₈=n-butyl  compound 283

R₁=R₂=n-hexyl, R₇=n-hexyloxy, R₈=H  compound 284

R₁=R₂=R₇=R₈=n-hexyl  compound 285

R₁=R₂=n-hexyl, R₇=n-octyl, R₈=H  compound 286

R₁=4-decylphenyl, R₂=phenyl, R₇=t-butyl, R₈=H  compound 287

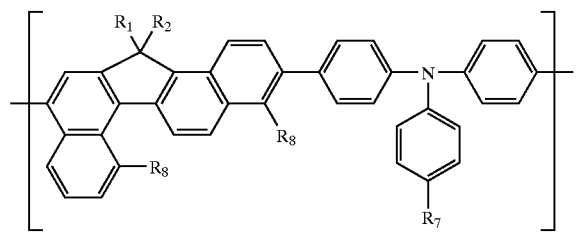

R₁=R₂=n-hexyl, R₇=R₈=n-butyl  compound 288

R₁=R₂=n-hexyl, R₇=t-butyl, R₈=H  compound 289

R₁=R₂=R₇=R₈=n-hexyl  compound 290

R₁=4-decylphenyl, R₂=phenyl,
R₇=t-butyl, R₈=H  compound 291

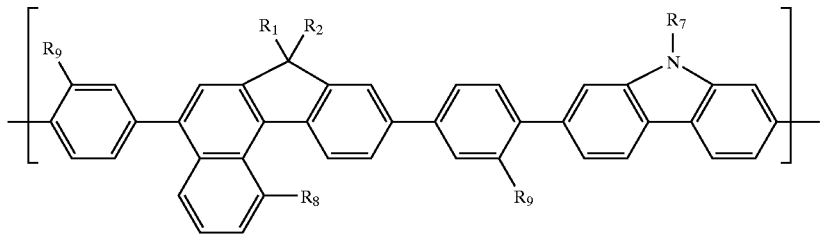

R₁=R₂=n-hexyl, R₇=R₈=R₉=2-ethylhexyl         compound 292

R₁=2-ethylhexyl, R₂=n-hexyl,
  R₇=4-t-butylphenyl, R₈=R₉=H                compound 293

R₁=R₂=R₉=3,7-dimethyloctyl,
  R₇=R₈=(4-diphenylamino)phenyl              compound 294

R₁=phenyl, R₂=4-decylphenyl, R₇=2-ethylhexyl,
  R₈=H, R₉=di(4-methylphenyl)amino           compound 295

The specific molecular structures can be the combination of any of the above drawn structures.

Organic compounds comprising complex fluorene structures (I), (II) or (III) can be synthesized using known methods. For polymers, the polymerization method and the molecular weights of the resulting polymers used in the present invention are not necessary to be particularly restricted. The molecular weights of the polymers are at least 1000, and preferably at least 2000. The polymers may be prepared by condensation polymerizations, such as coupling reactions including Pd-catalyzed Suzuki coupling, Stille coupling or Heck coupling, or Ni-mediated Yamamoto coupling, or by condensation reaction between di-(acid chlorides) with di-amines, di-alcohols or di-phenols in the presence of bases, or by other condensation methods such as Wittig reaction, or Horner-Emmons reaction, or Knoevenagel reaction, or dehalogenation of dibenzyl halides, or by free radical polymerization of vinyl compounds, or ring-opening polymerization cyclic compounds, or ring-opening metathesis polymerization. Preferably polymers are prepared by Suzuki coupling reaction.

Suzuki coupling reaction was first reported by Suzuki et al on the coupling of aromatic boronic acid derivatives with aromatic halides (Suzuki, A. et al *Synthetic Comm.* 1981, 11(7), 513). Since then, this reaction has been widely used to prepared polymers for various applications (Ranger, M. et al *Macromolecules* 1997, 30, 7686). The reaction involves the use of a palladium-based catalyst such as a soluble Pd compound either in the state of Pd (II) or Pd (0), a base such as an aqueous inorganic alkaline carbonate or bicarbonate, and a solvent for the reactants and/or product. The preferred Pd catalyst is a Pd (0) complex such as Pd(PPh₃)₄ or a Pd (II) salt such as Pd(PPh₃)₂Cl₂ or Pd(OAc)₂ with a tertiary phosphine ligand, and used in the range of 0.01–10 mol % based on the functional groups of the reactants. Polar solvents such as THF and non-polar solvents toluene can be used however, the non-polar solvent is believed to slow down the reaction. Modified processes were reported to prepare conjugated polymers for EL devices from the Suzuki coupling of aromatic halides and aromatic boron derivatives (Inbasekaran, M. et al U.S. Pat. No. 5,777,070 (1998); Towns, C. R. et al. PCT WO00/53656, 2000). A variation of the Suzuki coupling reaction replaces the aromatic halide with an aromatic trifluoromethanesulfonate (triflate) (Ritter, K. Synthesis, 1993, 735). Aromatic triflates are readily prepared from the corresponding phenol derivatives. The advantages of using aromatic triflates are that the phenol derivatives are easily accessible and can be protected/deprotected during complex synthesis. For example, aromatic halides normally would react under various coupling conditions to generate unwanted by-product and lead to much more complicated synthetic schemes. However, phenol derivatives can be easily protected by various protecting groups which would not interfere with functional group transformation and be deprotected to generate back the phenol group which then can be converted to triflates. The diboron derivatives can be prepared from the corresponding dihalide or ditriflate.

The present invention also provides a process for preparing a conjugated polymer which comprises in the polymerization reaction mixture (a) an aromatic monomer having at least two reactive triflate groups and an aromatic monomer having at least two reactive boron derivative groups selected from boronic acid, boronic ester, or borane groups or an aromatic monomer having one reactive triflate group and one boron derivative group selected from boronic acid, boronic ester, or borane groups, (b) a catalytic amount of a palladium catalyst, (c) an organic or inorganic base, and (d) an organic solvent. The process of the invention produces conjugated polymers with relatively low polydispersity, high molecular weight in a relatively short reaction time. The term "conjugated polymer" refers to either a fully conjugated polymer which is conjugated along the full length of its chain and processes a delocalized pi-electron system along the chain, or a partially conjugated polymer which contains both conjugated and non-conjugated segments.

The aromatic monomers used to form conjugated polymers of the present invention must have the appropriate functional groups: the triflate and boron derivative groups. The term aromatic or aryl refers to any monomer which has triflate or boron derivative groups attached directly to the aromatic or heteroaromatic rings. The present process can be used to polymerize two systems to form a linear polymer: 1) an aryl di-triflate monomer containing two reactive triflate groups and an aryl di-boron monomer containing two reactive boron derivative functional groups; and 2) an aryl monomer containing both reactive triflate and boron derivative functional groups. To prepare branched or hyper-branched polymers using the process of the invention, in a two monomers system, both aryl monomers must contain at least two reactive triflate or boron derivative groups; in a one monomer system, the monomer must contain at least one of the triflate or boron derivative groups and more than one the other group. The boron derivative functional groups are selected from a boronic acid group represented by B(OH)₂, a boronic ester group represented by B(OR₁₂)(OR₁₃) wherein R₁₂ is substituted or unsubstituted alkyl group of 1 to 6 carbons, and R₁₃ is hydrogen, or substituted and unsubstituted alkyl group of 1 to 6 carbons, R₁₂ and R₁₃ can be the same or different, and R₁₂ and R₁₃ can be connected to form a cyclic boronic ester, preferably a 5- or 6-membered ring; and a borane group represented by $BR_{14}R_{15}$, wherein $R_{14}$ and $R_{15}$ are each substituted and unsubstituted alkyl group of 1 to 20 carbons. The boron derivative groups are preferably boronic acid or cyclic boronic ester groups. Polymers can be prepared by using a mixture of monomers to form copolymers with desired properties and architecture. To prepare linear polymers, the polymerization system preferably comprises about equal mole percent of the reactive triflate and boron derivative groups. The mole ratio of these two classes of reactive groups is preferably 0.98 to 1.10, more preferably less than 1.05, most preferably 1.00. If desired, a mono-functional triflate or boron derivative can be used to end-cap the chain ends.

Examples of the aryl groups for the monomers include but are not limited to aromatic hydrocarbons such as phenyl, naphthyl, anthracene, fluorene, benzofluorene, dibenzofluorene, phenanthrene, perylene, pyrene, rubrene, chrysene, tetracene, pentacene, triphenylene, diphenylanthracene, dinapthylanthracene, and benzo[a]pyrene; and heteroaromatic groups such as thiophene, pyrrole, furan, pyridine, triazines, tetrazenes, oxazoles, imidazoles, oxadiazole, thiadiazole, benzoxazole, quinoline, benzimidazole, carbazole, benzothiazole, and acridine; and triarylamines such as triphenylamine, dinaphthylphenylamine, and N,N'-diphenylbenzidine. Preferably, the aryl groups are selected from fluorene, benzofluorene, diphenylanthracene, dinaphthylanthracene, thiophene, oxadiazole, benzothiazole, benzimidazole and carbazole.

The bases suitable for use in the process of the invention include inorganic aqueous bases such as alkali metal hydroxides, carbonates acetates, and bicarbonates, alkaline earth metal hydroxides, carbonates acetates, and bicarbonates, alkaline earth metal alkoxides, and alkali metal alkoxides, and organic bases such as sources of hydroxyl ions and Lewis bases such as those which create a source of hydroxyl ions in the presence of water. The organic base should be soluble in an organic solvent and/or water. Examples of aqueous inorganic bases include the hydroxide, carbonates and bicarbonates of lithium, sodium, potassium, cesium, and barium. Preferably, the aqueous base is a solution of sodium, potassium, or cesium carbonate in a concentration of 1 to 2 M. Examples of organic bases include alkyl ammonium hydroxides, carbonates, bicarbonates, fluorides, and borates, pyridines, organic amines. Preferably, the organic base used in the process of the invention is a tetraalkylammonium hydroxide, carbonate, or bicarbonate such as tetramethyl-, tetraethyl-, or tetrapropyl-ammonium hydroxide, carbonate, or bicarbonate. The amount of base used in the process is not particularly important as long as the number of moles of the base is equal or higher than that of the monomer. Preferably, 1 to 10 molar equivalents of the base per boron-derivative functional group are employed. More preferably, 1 to 5 molar equivalents of base are used. Most preferably, 1.5 to 4 molar equivalents, and in particular 1.8 to 2.5 molar equivalents of base are used. A single base or a mixture of different bases can be used in the process of the invention.

The catalyst used in the process of the invention is preferably a palladium catalyst in a form of Pd(0) or Pd(II) complexes with ligands or Pd(II) salts. Examples of the suitable ligands for the palladium complexes are phosphines such as trialkylphophines, tricycloalkylphosphines and triarylphosphines, where the three substituents on the phosphorus can be identical or different and one or more of the ligands can link phophorus groups of a plurality of phosphines, where part of this linkage can also be one or me metal atoms, diketones such asdibenzylideneacetone (dba), acetylacetone and octafluoroacetylacetone, and tertiary amines such as triethylamine, trimethylamine, tripropylamines. These ligands can also be derivatized by attachment of cationic or anionic groups to render water solubility. It is also possible to use a mixture of more than one ligand. Particular examples of the phosphine ligands used in the process of the invention are trimethylphosphine, tributylphophine, tricyclohexylphosphine, tritolylphosphine, 1,2-bis(diphenylphosphino)ethane, triphenylphosphine, 1,3-bis(diphenylphosphino)propane, and 1,1'-(diphenylphosphineo)ferrocene (dppf). Preferably, the ligands are triphenylphosphine $(Ph_3P)$, 1,1'-(diphenlphosphineo)ferrocene (dppf), 1,2-bis(diphenylphosphino)ethane, and 1,3-(bisdiphenylphosphino)propane, and more preferably, triphenylphosphine $(Ph_3P)$, and 1,1'-(diphenlphosphineo)ferrocene (dppf). The most preferred Pd(0) complex is $Ph(Ph_3P)_4$. The preferred Pd(II) salts are palladium acetate, palladium (II) propionate, palladium (II) butanoate, and palladium (II) chloride, and more preferred Pd (II) salt is palladium (II) acetate. When a palladium (II) salt is used, it is advantageous to add to the reaction mixture 2 to 4 molar equivalents of other ligands such as $Ph_3P$ or dppf per mole of Pd salt. A Pd(II) complex such as $PdCl_2(PPh_3)_2$, bis(acetonitrile)palladium dichloride, dichlorobis(dimethylsulfoxide) palladium (II), bis(benzonitrile) palladium dichloride, or $PdCl_2(dppf)$ can be used as an alternative. The palladium catalyst can also be on a support material such as an inert organic resin. Typically, the amount of the palladium catalyst used in the reaction mixture is 0.001 to 1 mol % for each mole of monomer, preferably, 0.01 to 1 mol % for each mole of monomer.

The organic solvents suitable for use in the process include those capable of dissolving the monomer to a solution concentration of at least 1 percent, preferably at least 2 percent. Examples of suitable solvents for the process described are hydrocarbons such as hexane, heptane, petroleum ether, cyclohexane, benzene, chlorobenzenes, ethylbenzen, mesitylene, toluene, and xylenes, ethers such as anisole, diethyl ether, tetrahydrofuran, dioxane, dioxolane, diisopropyl ether, dimethoxyethane, t-butyl methyl ether, and diethylene glycol dimethyl ether, ketones such as acetone, methyl ethyl ketone, and isobutyl methyl ketone, alcohols such as methanol, ethanol, propanols, ethylene glycol, and butanols, and amides such as dimethylformamide, dimethylactamide and N-methylpyrrolidone, and the florinated analog thereof, and the mixtures thereof.

The preferred organic solvents include one solvent in which the polymer is soluble. Examples of the preferred solvents are ethers such as tetrahydrofuran, dioxane, dimethyoxyethane, diethylene glycol dimethyl ether, diisopropyl ether, hydrocarbons such as benzene, chlorobenzenes, toluene, xylenes, heptane, and cyclohexane, ketones such as methyl ethyl ketone and isobutyl methyl ketone, amides such as dimethylformamide, dimethylacetamide and N-methylpyrrolidone, and mixtures thereof.

More preferred organic solvents are ethers for example tetrahydrofuran, dimethyoxyethane and dioxane, hydrocarbons for example toluene, chlorobenzenes, and xylenes, and amides for example, dimethylformamide, and dimethylacetamide.

Most preferred organic solvents of the process of the invention are one or more water-insoluble solvents such as toluene or xylenes or tetrahydrofuran, or mixtures thereof The volume of the solvent of the process of the invention should be maintained at the level for efficient mixing and stirring at reflux as the reaction mixture becomes more viscous with the build-up of polymer molecular weight.

The polymerization reaction mixture may also contain a phase transfer catalyst as disclosed in U.S. Pat. No. 5,777,070. Suitable phase transfer catalysts used in the process of the invention include quaternary ammonium and phosphonium salts, crown ethers and cryptands. Preferably, the phase transfer catalyst is a tetralkylammonium halide, or bisulfate. Examples of the most preferred phase transfer catalyst are tetrabutylammonium chloride and tricaprylylmethylammonium chloride (known as Aliquat® from Aldrich Chemical). The preferred range of the amount of phase transfer catalyst is between 0.01 to 0.5 mole per mole of monomer, more preferably 0.05 to 0.1 mole per mole of monomer.

The polymerization reaction is carried at a temperature of from 0 to 200° C., preferably from 30 to 170° C., and more preferably 50 to 150° C., and most preferably 60 to 120° C. The reaction time is from 1 to 100 hours, preferably 5 to 70 hours, more preferably 5 to 50 hours, and most preferably, 5 to 48 hours.

The process of the present invention can also be extended to the use of monomers in which some or all of the reactive functional groups are not directly attached to the aromatic rings, especially to other kinds of unsaturated monomers.

The synthetic schemes of the compounds according to the present invention are illustrated in Schemes 1–11.

The process of the invention provides conjugated polymers particularly useful for an optical device. The optical device may comprise a luminescent device such as an EL device in which the polymer or small molecules of the present invention is deposited between a cathode and an anode. The polymers or small molecules or the combination thereof can be deposited as thin film by vapor deposition method or from a solution by spin-coating, spray-coating, dip-coating, roller-coating, or ink jet delivery. The thin film may be supported by substrate directly, preferably a transparent substrate, or supported by the substrate indirectly where there is one or more inter layers between the substrate and thin film. The thin film can be used as emitting layer or charge carrier transporting layer. General EL device architecture:

The present invention can be employed in most organic EL device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. A typical structure is shown in FIG. 1 and includes a substrate 101, an anode 103, a hole-injecting layer 105, a hole-transporting layer 107, a light-emitting layer 109, an electron-transporting layer 111, and a cathode 113. These layers are described in detail below. This figure is for illustration only and the individual layer thickness is not scaled according to the actual thickness. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate:

The OLED device of this invention is typically provided over a supporting substrate 101 where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. The substrate may be a complex structure comprising multiple layers of materials. This is typically the case for active matrix substrates wherein TFTs are provided below the EL layers. It is still necessary that the substrate, at least in the emissive pixilated areas, be comprised of largely transparent materials such as glass or polymers. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Again, the substrate may be a complex structure comprising multiple layers of materials such as found in active matrix TFT designs. Of course it is necessary to provide in these device configurations a light-transparent top electrode.

Anode:

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. The anode can be modified with plasma-deposited fluorocarbons. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injection Layer (HIL):

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl) phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 of the organic EL device in general contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

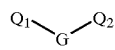

(A)

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is-represented by structural formula (B):

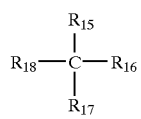

(B)

wherein:

$R_{15}$ and $R_{16}$ each independently represents a hydrogen atom, an aryl group, or an alkyl group or $R_1$ and $R_2$ together represent the atoms completing a cycloalkyl group; and $R_{17}$ and $R_{18}$ each independently represents an aryl group, which is in turn substituted with a diaryl substituted amino group, as indicated by structural formula (C):

(C)

wherein $R_{19}$ and $R_{20}$ are independently selected aryl groups. In one embodiment, at least one of $R_{19}$ or $R_{20}$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D):

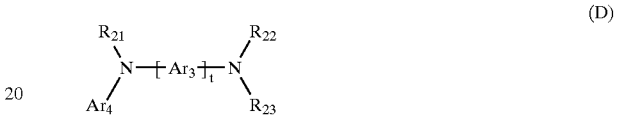

(D)

wherein
each $Ar_3$ is an independently selected arylene group, such as a phenylene or anthracene moiety, t is an integer of from 1 to 4, and $Ar_4$, $R_{21}$, $R_{22}$, and $R_{23}$ are independently selected aryl groups.

In a typical embodiment, at least one of $Ar_4$, $R_{21}$, $R_{22}$, and $R_{23}$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl 4,4"-Bis[N-(1-naphthyl)-N-phenylamino]p-terphenyl 4,4'-Bis[N-(2-naphthyl)-N-phenylamino]biphenyl 4,4'-Bis[N-(3-acenaphthenyl)-N-phenylamino]biphenyl 1,5-Bis[N-(1-naphthyl)-N-phenylamino]naphthalene 4,4'-Bis[N-(9-anthryl)-N-phenylamino]biphenyl 4,4"-Bis[N-(1-anthryl)-N-phenylamino]-p-terphenyl 4,4'-Bis[N-(2-phenanthryl)-N-phenylamino]biphenyl 4,4'-Bis[N-(8-fluoranthenyl)-N-phenylamino]biphenyl 4,4'-Bis[N-(2-pyrenyl)-N-phenylamino]biphenyl 4,4'-Bis[N-(2-naphthacenyl)-N-phenylamino]biphenyl 4,4'-Bis[N-(2-perylenyl)-N-phenylamino]biphenyl 4,4'-Bis[N-(1-coronenyl)-N-phenylamino]biphenyl 2,6-Bis(di-p-tolylamino)naphthalene 2,6-Bis[di-(1-naphthyl)amino]naphthalene 2,6-Bis[N-(1-naphthyl)-N-(2-naphthyl)amino] naphthalene N,N,N',N'-Tetra(2-naphthyl)-4,4"-diamino-p-terphenyl 4,4'-Bis {N-phenyl-N-[4-(1-naphthyl)-phenyl] amino}biphenyl 4,4'-Bis[N-phenyl-N-(2-pyrenyl)amino]biphenyl 2,6-Bis[N,N-di(2-naphthyl)amine]fluorene 1,5-Bis[N-(1-naphthyl)-N-phenylamino]naphthalene 4,4',4"-tris[(3-methylphenyl)phenylamino] triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline (Yang, Y. et al. Appl. Phys. Lett. 1994, 64,1245) and copolymers such as poly(3,4-ethylenedioxythiophene)/poly(4-styrenesulfonate) also called PEDOT/PSS(Groenendaal, L. B. et al. Adv. Mater. 2000, 12, 481).

Light-Emitting Layer (LEL)

As more fully described in commonly-assigned U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material including both small molecules and polymers, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Simultaneously, the color of the EL devices can be tuned using dopants of different emission wavelengths. By using a mixture of dopants, EL color characteristics of the combined spectra of the individual dopant are produced. This dopant scheme has been described in considerable detail for EL devices in commonly-assigned U.S. Pat. No. 4,769,292 for fluorescent dyes. Dopants are typically coated as 0.01 to 10% by weight into the host material. Polymeric materials such as polyfluorenes and poly(arylene vinylenes) (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital (HOMO) and the lowest unoccupied molecular orbital (LUMO) of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

For small molecules, host and emitting molecules known to be of use include, but are not limited to, those disclosed in U.S. Pat. Nos. 4,768,292; 5,141,671; 5,150,006; 5,151,629; 5,405,709; 5,484,922,; 5,593,788; 5,645,948; 5,683,823; 5,755,999; 5,928,802; 5,935,720; 5,935,721, and 6,020,078.

For example, small molecule metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

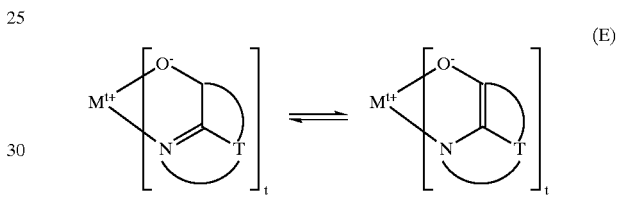

(E)

wherein:

M represents a metal;

t is an integer of from 1 to 4; and

T independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

T completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato) indium]

CO-6: Aluminum tris(5-methyloxine) [alias, tris(5-methyl-8-quinolinolato) aluminum(III)]

CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

(F)

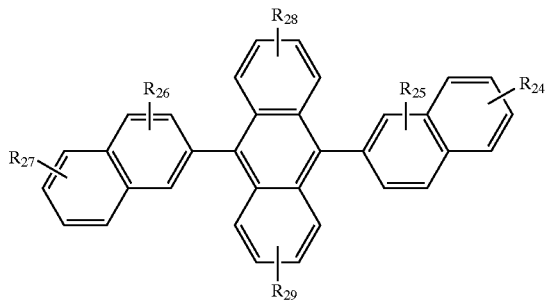

wherein: $R_{24}$, $R_{25}$, $R_{26}$, $R_{27}$, $R_{28}$, and $R_{29}$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful hosts capable of supporting electroluminescence, and are particularly suitable for light emission of wavelengths longer than 400 nm, e.g., blue, green, yellow, orange or red.

(G)

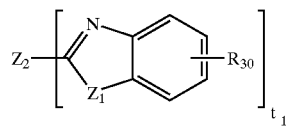

wherein:
$t_1$ is an integer of 3 to 8;
$Z_1$ is O, $NR_{31}$ or S; and
$R_{30}$ and $R_{31}$ are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;
$Z_2$ is a linkage unit consisting of alkyl, aryl, substituted alkyl, or substituted aryl, which conjugately or unconjugately connects the multiple benzazoles together. An example of a useful benzazole is 2, 2', 2''-(1,3,5-phenylene) tris[1-phenyl-1H-benzimidazole].

Distyrylarylene derivatives are also useful hosts, as described in U.S. Pat. No. 5,121,029. Carbazole derivatives are particularly useful hosts for phosphorescent emitters.

Polymers incorporating the above small molecule moieties as represented by formulas (E), (F), and (G) are useful host materials. Examples of 9,10-di-(2-naphthyl) anthracene-containing polymers are disclosed in U.S. Pat. No. 6,361,887.

Useful fluorescent dopants (FD) include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds. Useful phosphorescent dopants (PD) include but are not limited to organometallic complexes of transition metals of iridium, platinum, palladium, or osmium. Illustrative examples of useful dopants include, but are not limited to, the following:

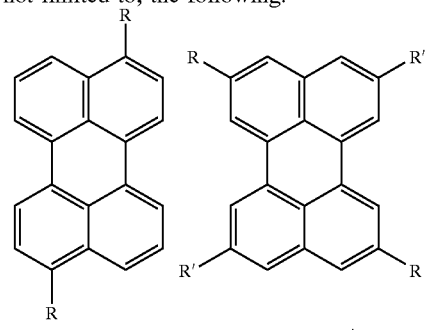

FD 1 R = H
FD 2 R = CO₂Pr-i
FD 3 R = H, R' = t-Bu
FD 4 R = R' = t-Bu

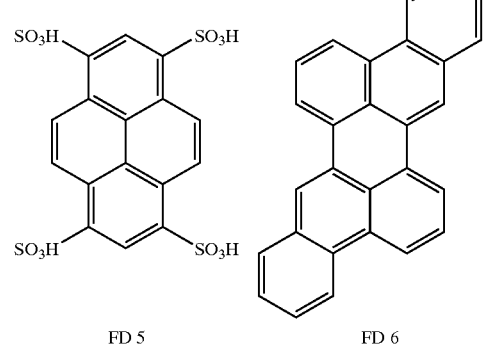

FD 5

FD 6

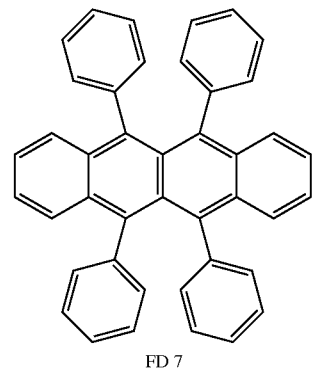

FD 7

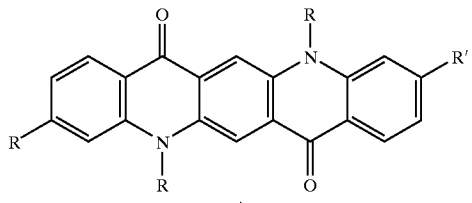

FD 8 R = R' = H
FD 9 R = Me, R' = H
FD 10 R = Pr-i, R' = H
FD 11 R= Me, R' = F
FD 12 R = phenyl, R' = H

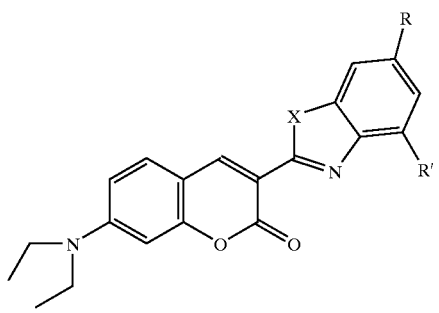

FD 13 R = R' = H, X = O
FD 14 R = H, R' = Me, X = O
FD 15 R = Me, R' = H, X = O
FD 16 R = Me, R' = Me, X = O
FD 17 R = H, R' = t-Bu, X = O
FD 18 R = t-Bu, R' = H, X = O
FD 19 R = R' = t-Bu, X = O
FD 20 R = R' = H, X = S
FD 21 R = H, R' = Me, X = S
FD 22 R = Me, R' = H, X = S
FD 23 R = Me, R' = Me, X = S
FD 24 R = H, R' = t-Bu, X = S
FD 25 R = t-Bu, R' = H, X = S
FD 26 R = R' = t-Bu, X = S

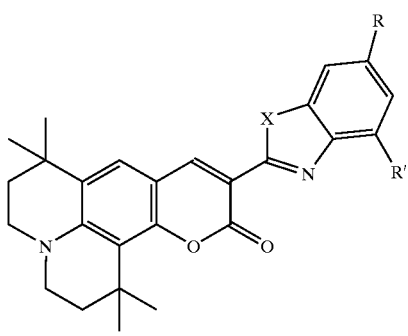

FD 27 R = R' = H, X = O
FD 28 R = H, R' = Me, X = O
FD 29 R = Me, R' = H, X = O
FD 30 R = Me, R' = Me, X = O
FD 31 R = H, R' = t-Bu, X = O
FD 32 R = t-Bu, R' = H, X = O
FD 33 R = R' = t-Bu, X = O
FD 34 R = R' = H, X = S
FD 35 R = H, R' = Me, X = S
FD 36 R = Me, R' = H, X = S
FD 37 R = Me, R' = Me, X = S
FD 38 R = H, R' = t-Bu, X = S
FD 39 R = t-Bu, R' = H, X = S
FD 40 R = R' = t-Bu, X = S

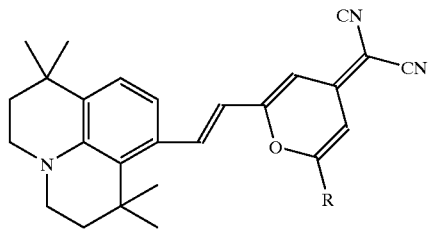

FD 41 R = phenyl
FD 42 R = Me
FD 43 R = t-Bu
FD 44 R = mesityl

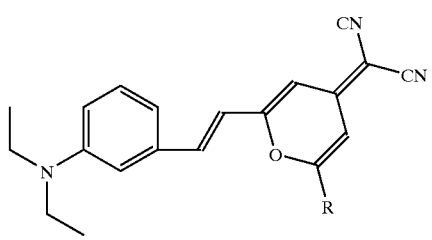

FD 45 R = phenyl
FD 46 R = Me
FD 47 R = t-Bu
FD 48 R = mesityl

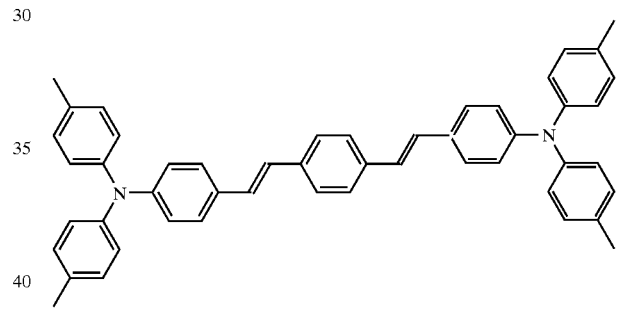

FD 49

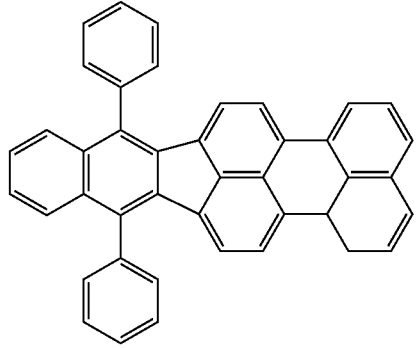

FD 50

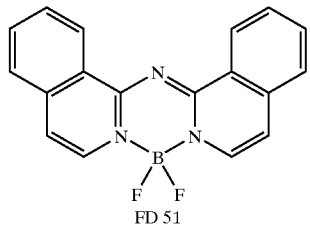

FD 51

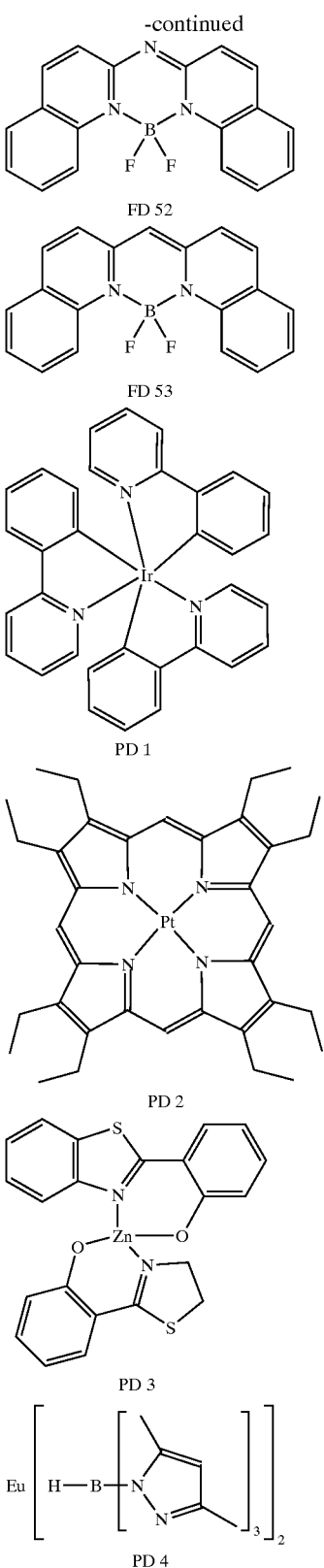

FD 52

FD 53

PD 1

PD 2

PD 3

PD 4

Electron-Transporting Layer (ETL):

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials. Oxadiazole compounds including small molecules and polymers are useful electron transporting materials as described in U.S. Patent No. 6,451,457.

Cathode:

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in commonly-assigned U.S. Pat. No. 4,885,211. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in commonly-assigned U.S. Pat. No. 5,677,572. Other useful cathode material sets include, but are not limited to, those disclosed in commonly-assigned U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,3936; EP 1 076 368 and JP 3,234,963. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture

In some instances, layers 109 and 111 can optionally be collapsed into a single layer that serves the function of supporting both light emission and electron transportation. Alternatively, layers 107, 109 and 111 can optionally be collapsed into a single layer that serves the function of supporting both light emission and hole and electron transportation. This is the preferred EL device structure of this invention and is referred to as "single-layer" device.

It also known in the art that emitting dopants may be added to the hole-transporting layer, which may serve as a host. Multiple dopants may be added to one or more layers in order to create a white-emitting EL device, for example, by combining blue- and yellow-emitting materials, cyan- and red-emitting materials, or red-, green-, and blue-emitting materials. White-emitting devices are described, for example, in EP 1 187 235, EP 1 182 244, U.S. Patent Publication 20020025419, and U.S. Pat. Nos. 5,683,823; 5,503,910; 5,405,709; and 5,283,182.

Additional layers such as electron or hole-blocking layers as taught in the art may be employed in devices of this invention. Hole-blocking layers are commonly used to improve efficiency of phosphorescent emitter devices, for example, as in U.S. Patent Publication 20020015859.

This invention may be used in so-called stacked device architecture, for example, as taught in U.S. Pat. Nos. 5,703,436 and 6,337,492.

Deposition of Organic Layers

The organic materials mentioned above can be deposited as high quality transparent thin films by various methods such as a vapor deposition or sublimation method, an electron-beam method, a sputtering method, a thermal transferring method, a molecular lamination method and a coating method such as solution casting, spin-coating or inkjet printing, with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709 and 6,066,357) and inkjet method (U.S. Pat. No. 6,066,357).

Preferably, the spin-coating or inkjet printing technique is used to deposit the organic material of the invention, only one compound is deposited in a single layer device.

Encapsulation:

Most organic EL devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization:

Organic EL devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

EXAMPLES

The invention and its advantages are further illustrated by the following specific examples:

Synthesis of Small Molecules

The monomers to be used in the present invention to construct polymers are not necessary to be particularly restricted. Any monomers can be used as long as the polymer formed is a polymer which satisfies the general formulas (V) and (VI). Typical synthesis is illustrated in Schemes 1–11.

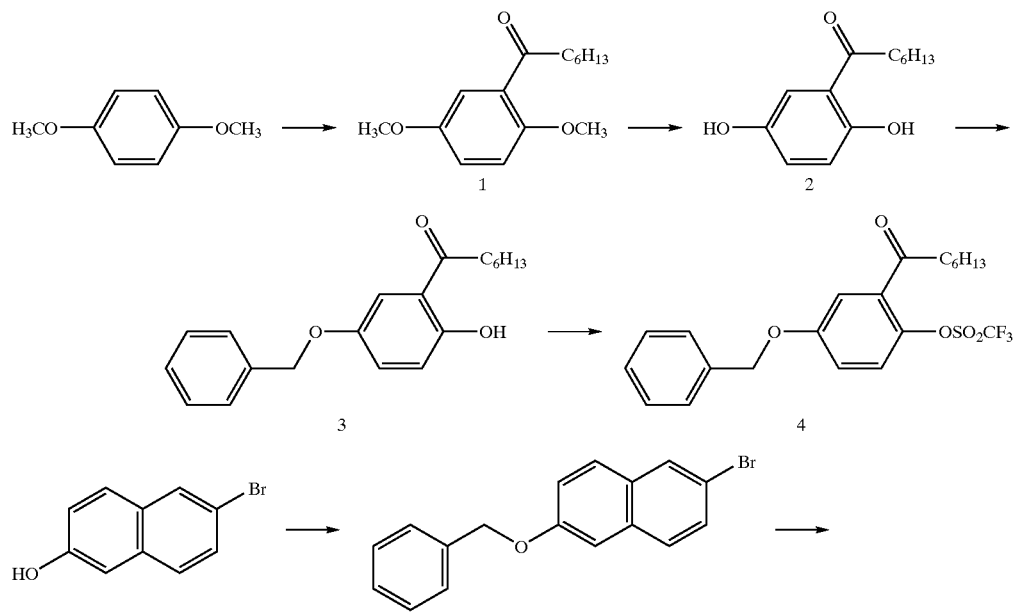

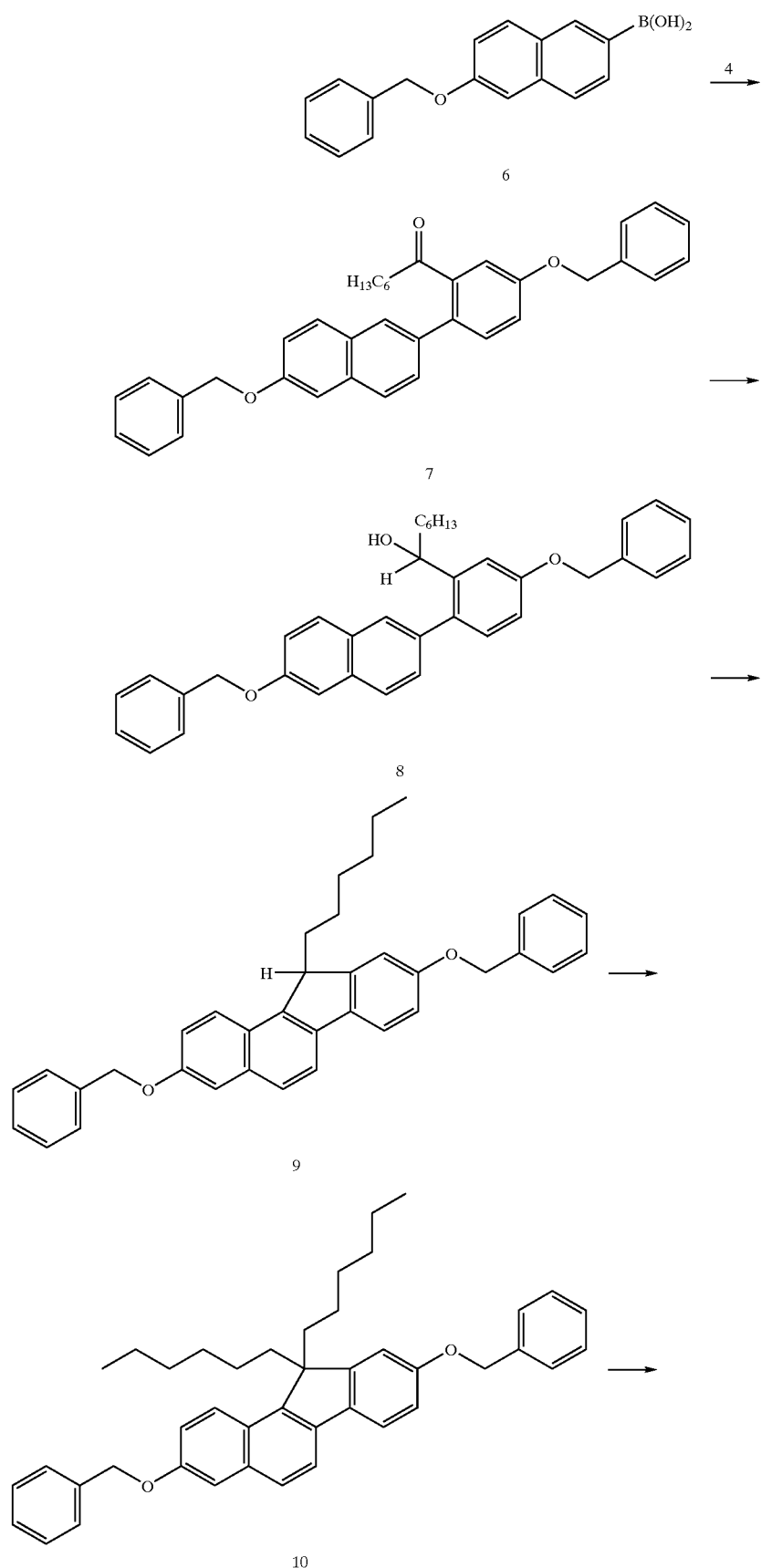

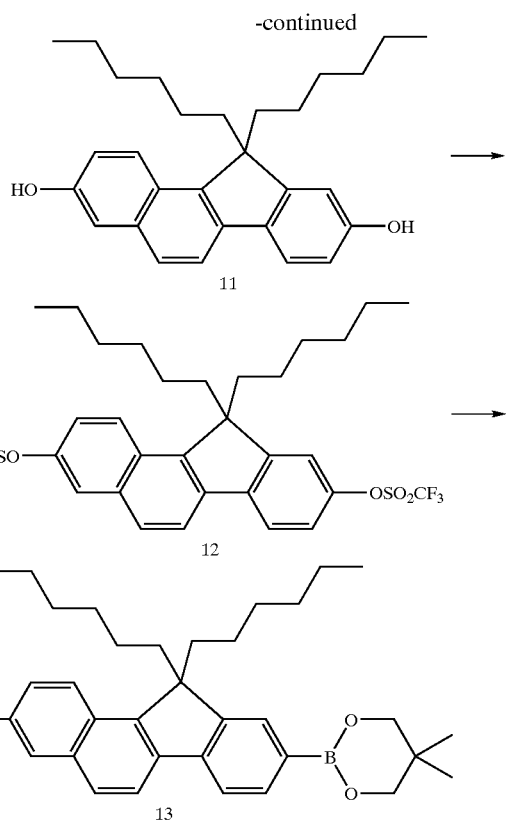
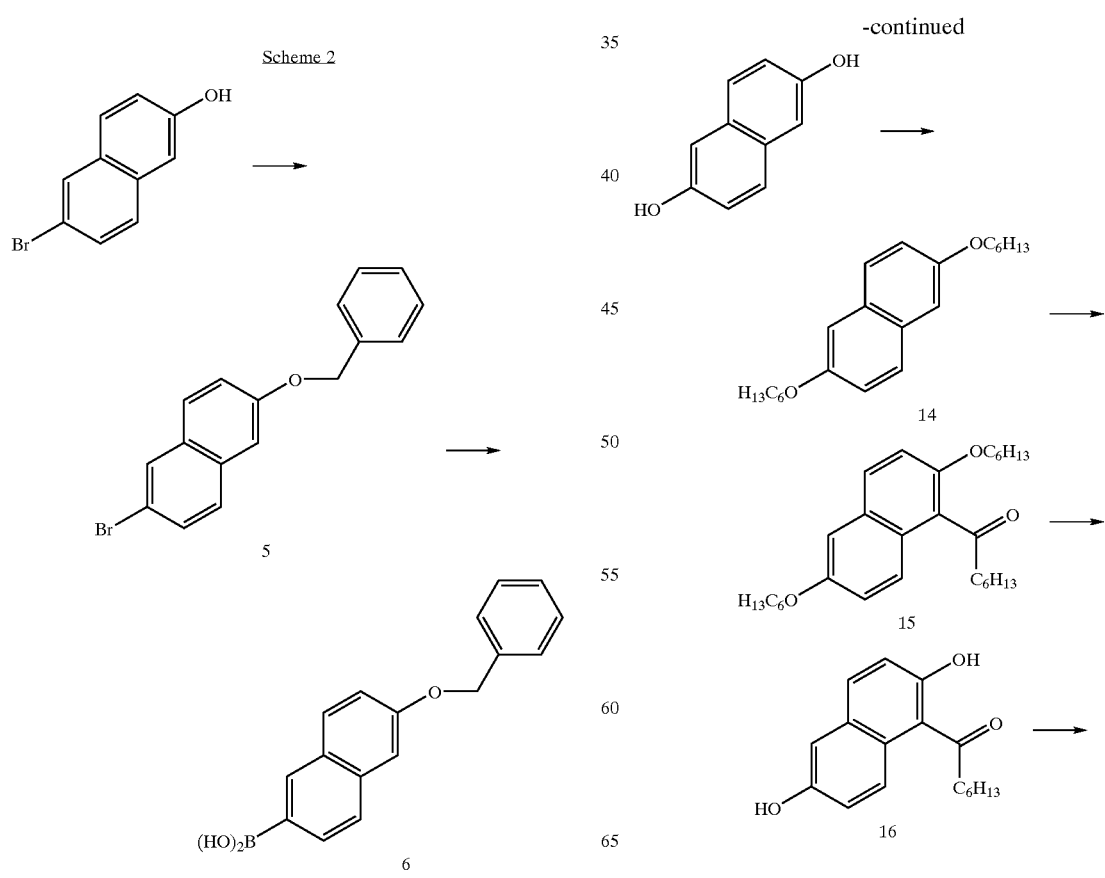
Scheme 2

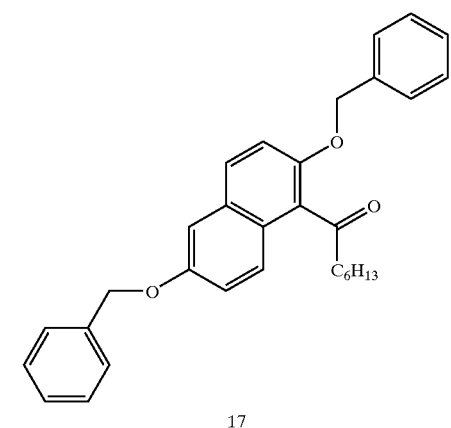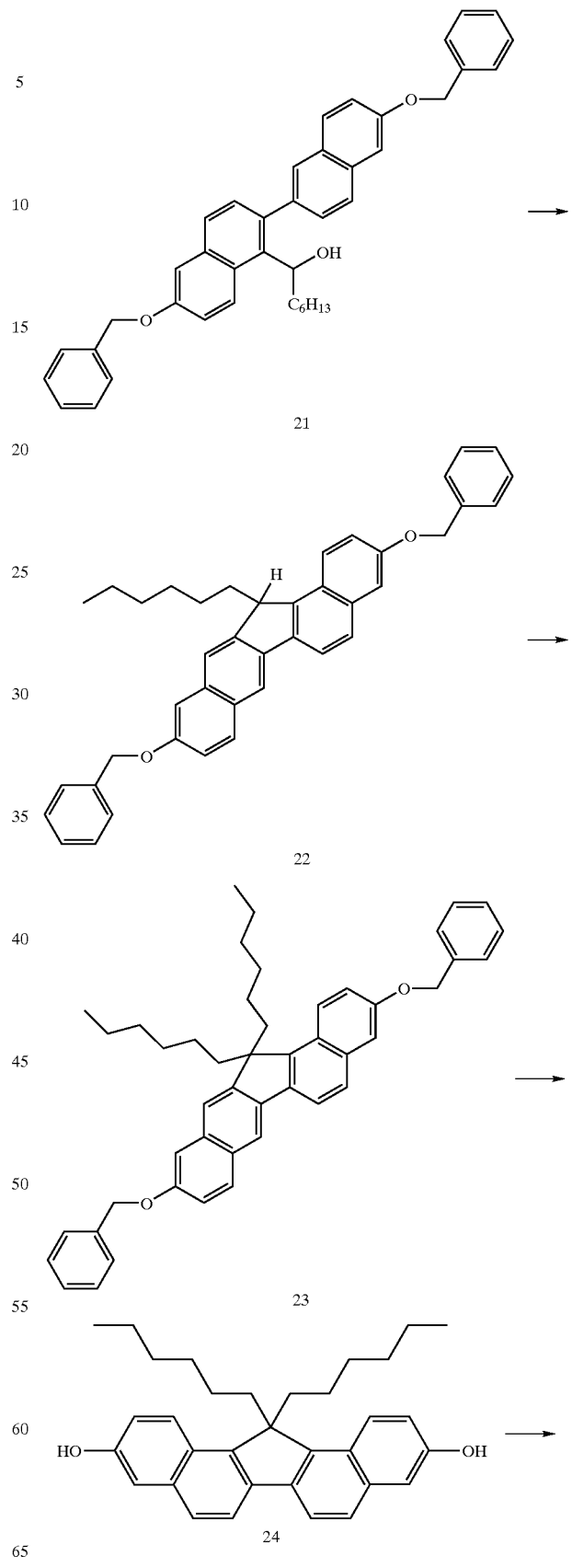

77
-continued
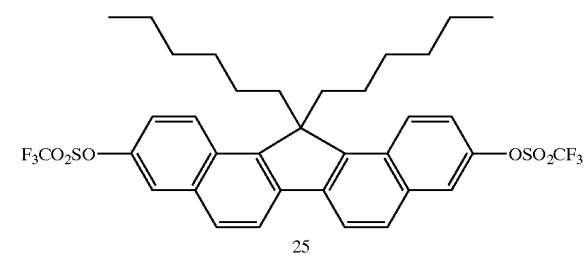
25
22 →
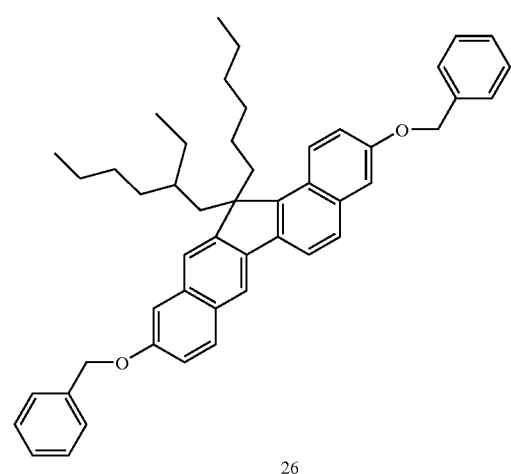
26
78
-continued
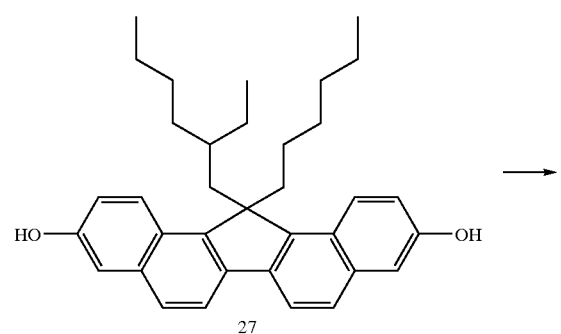
27
→
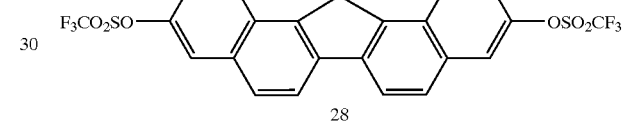
28
Scheme 3
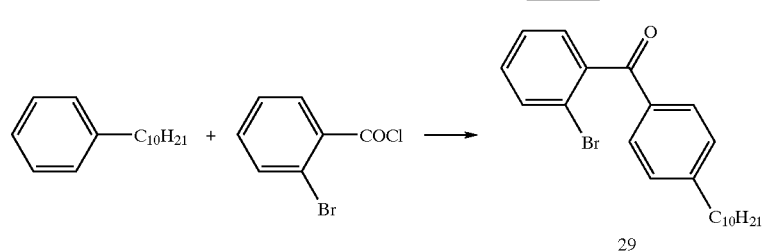
29
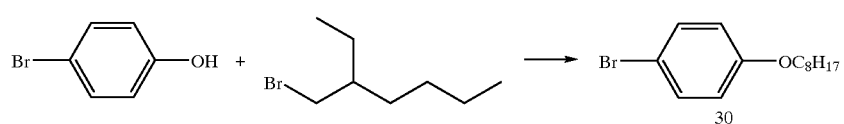
30
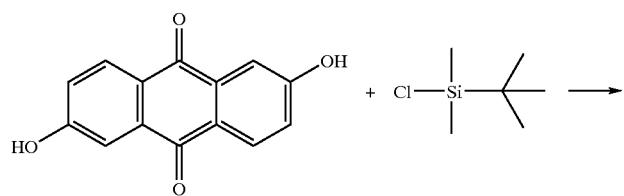

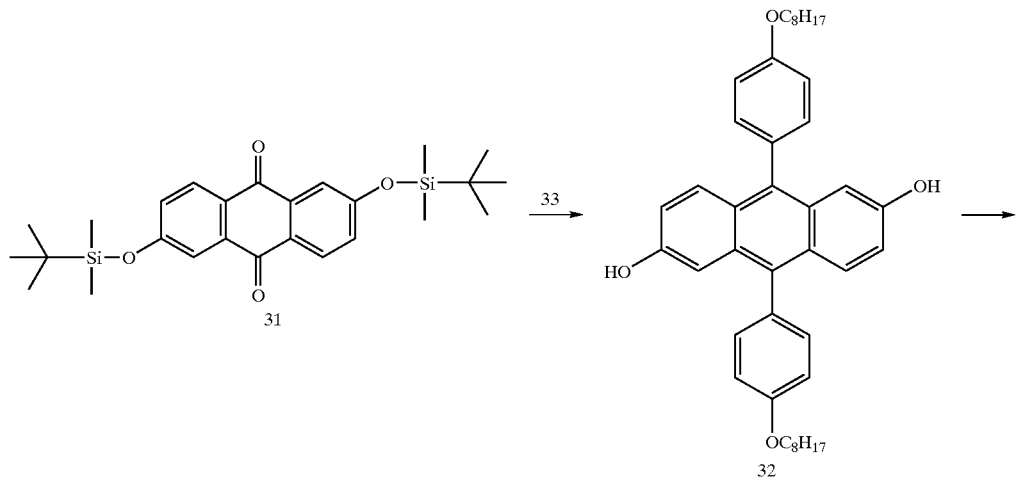
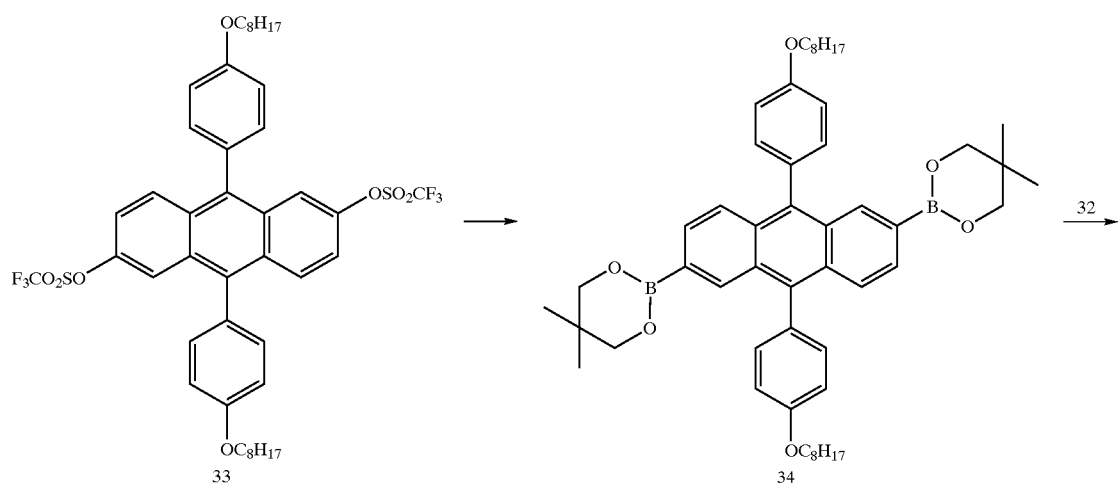
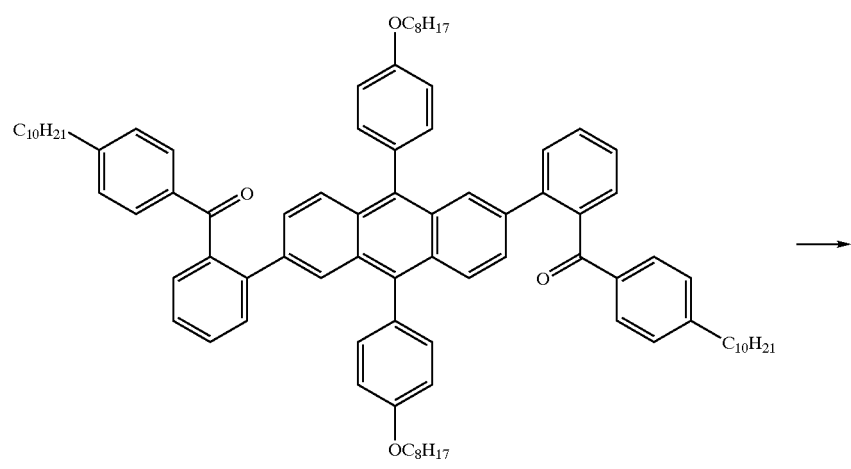

-continued
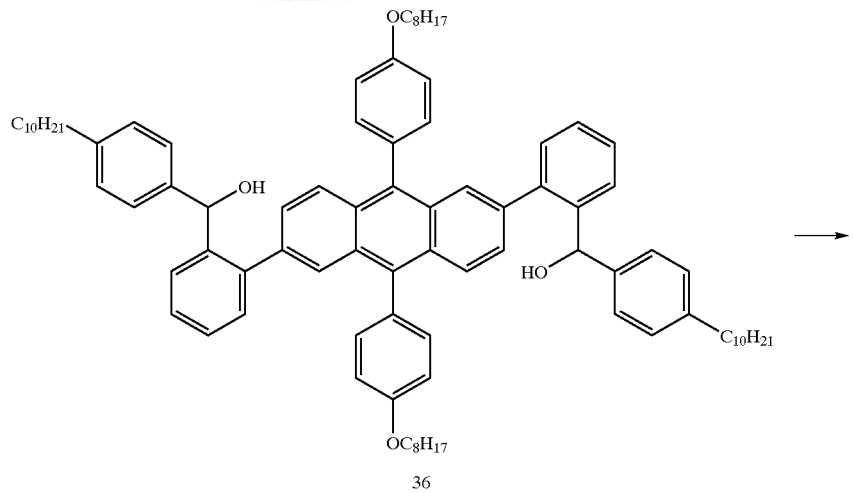
36
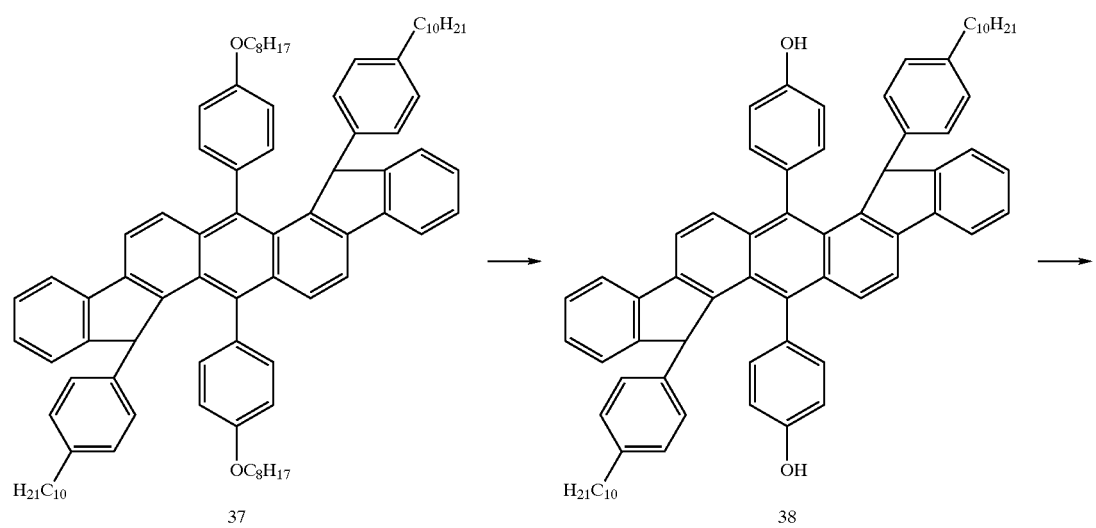
37        38
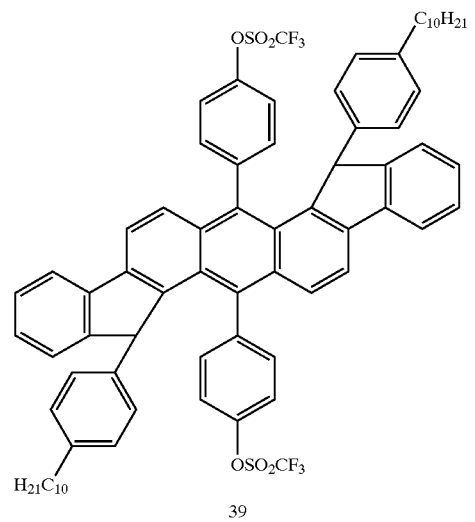
39

Scheme 4
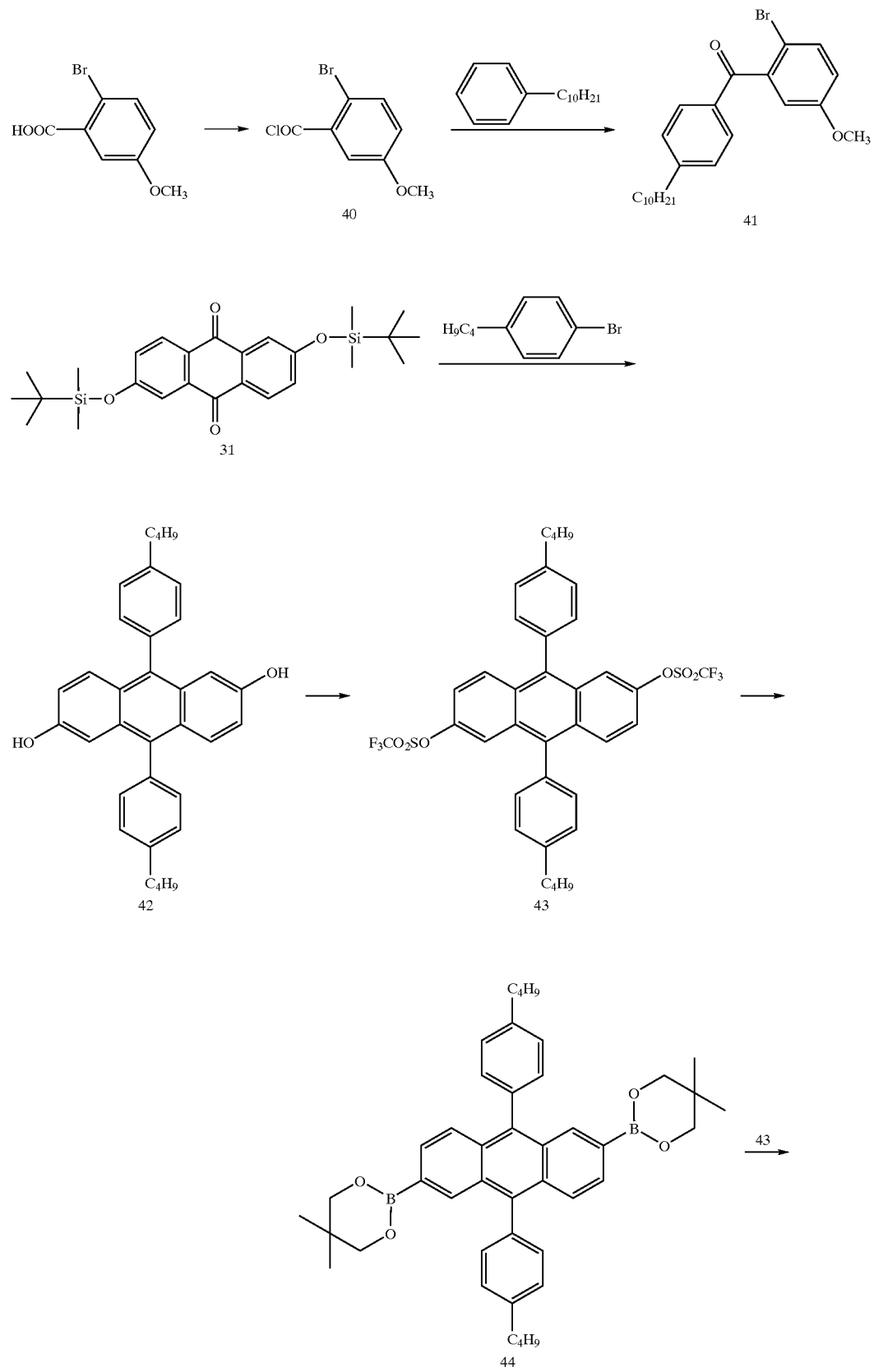

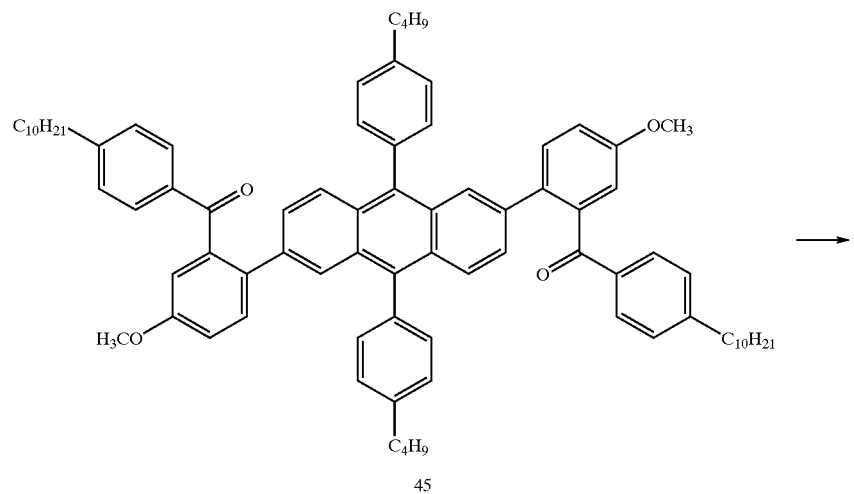
45
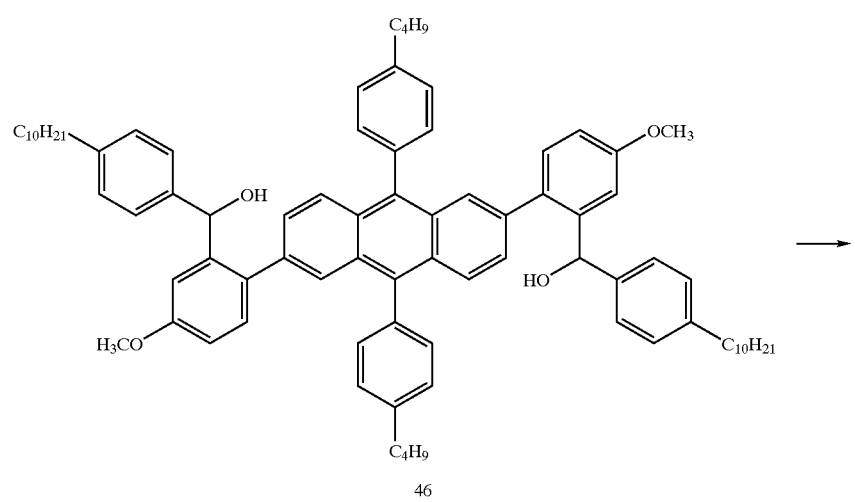
46
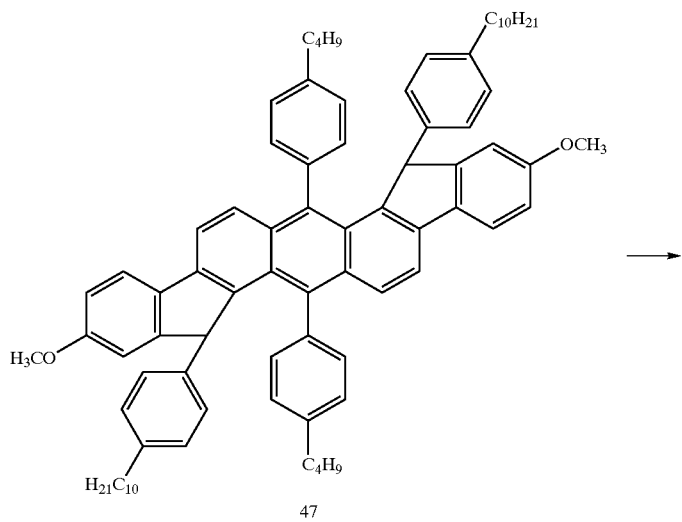
47

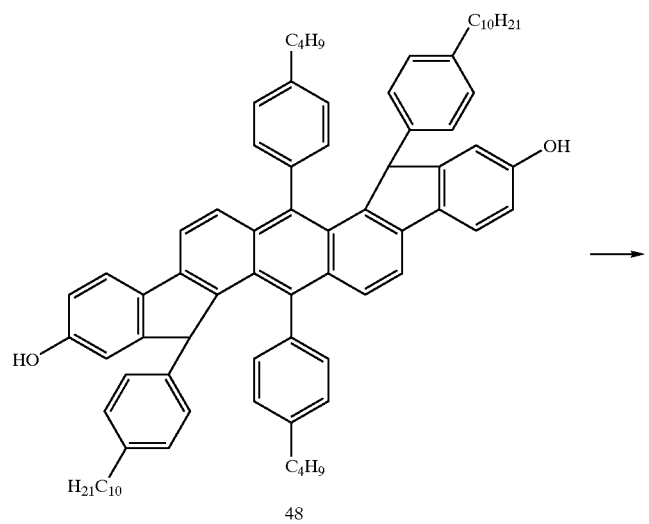
48
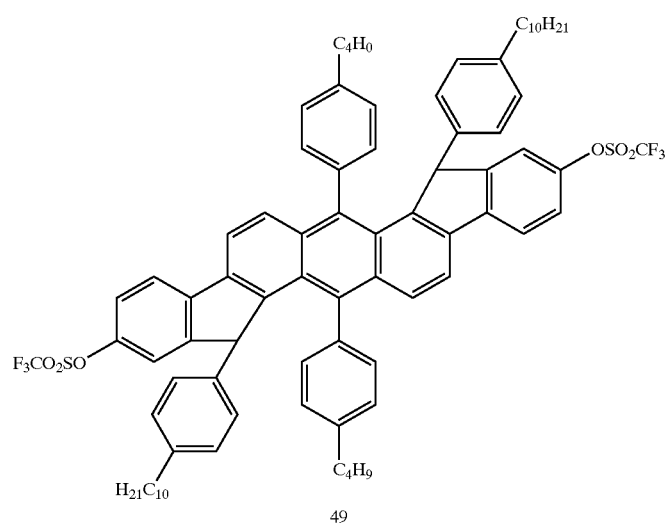
49
Scheme 5
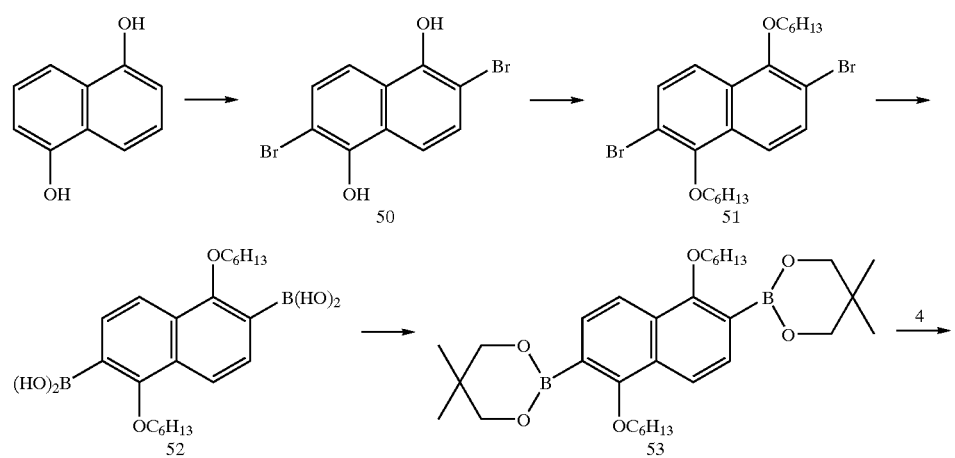

-continued
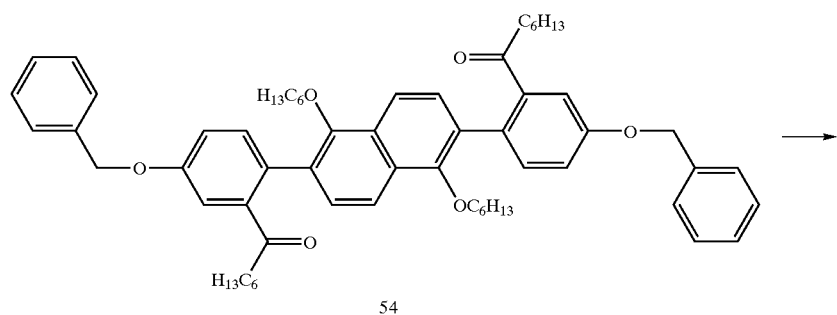
54
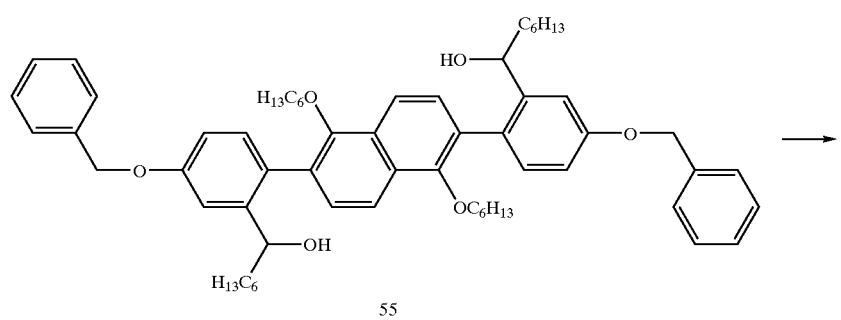
55
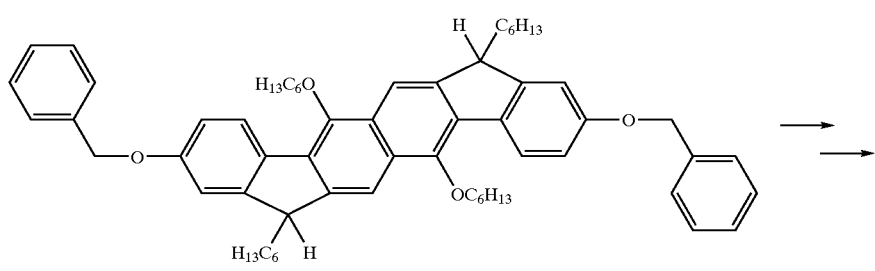
56
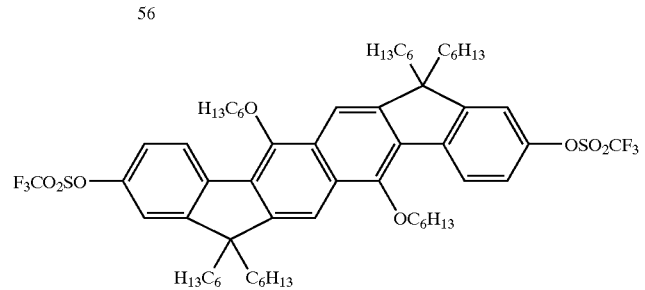
Scheme 6
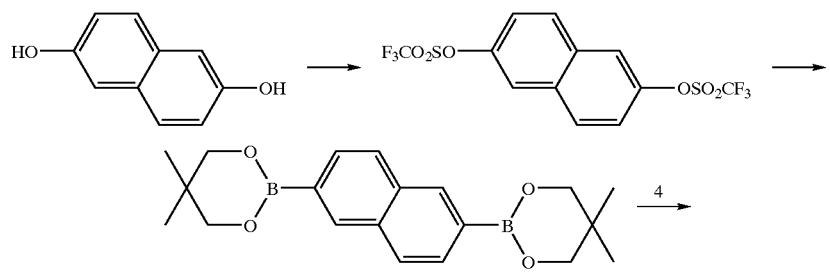

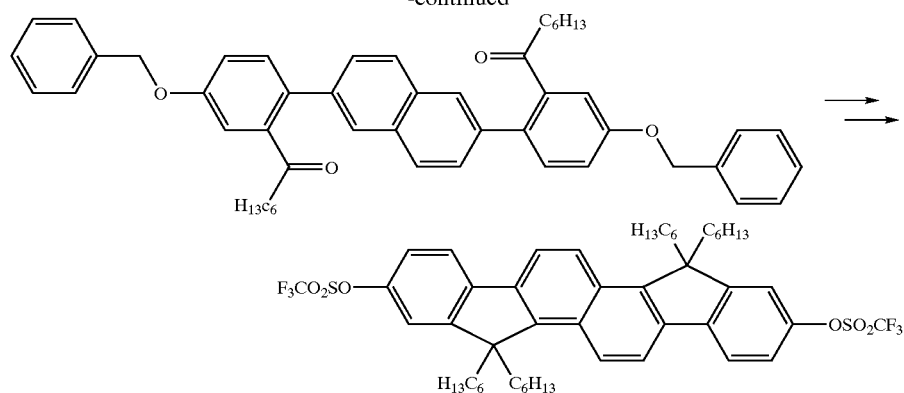
Scheme 7
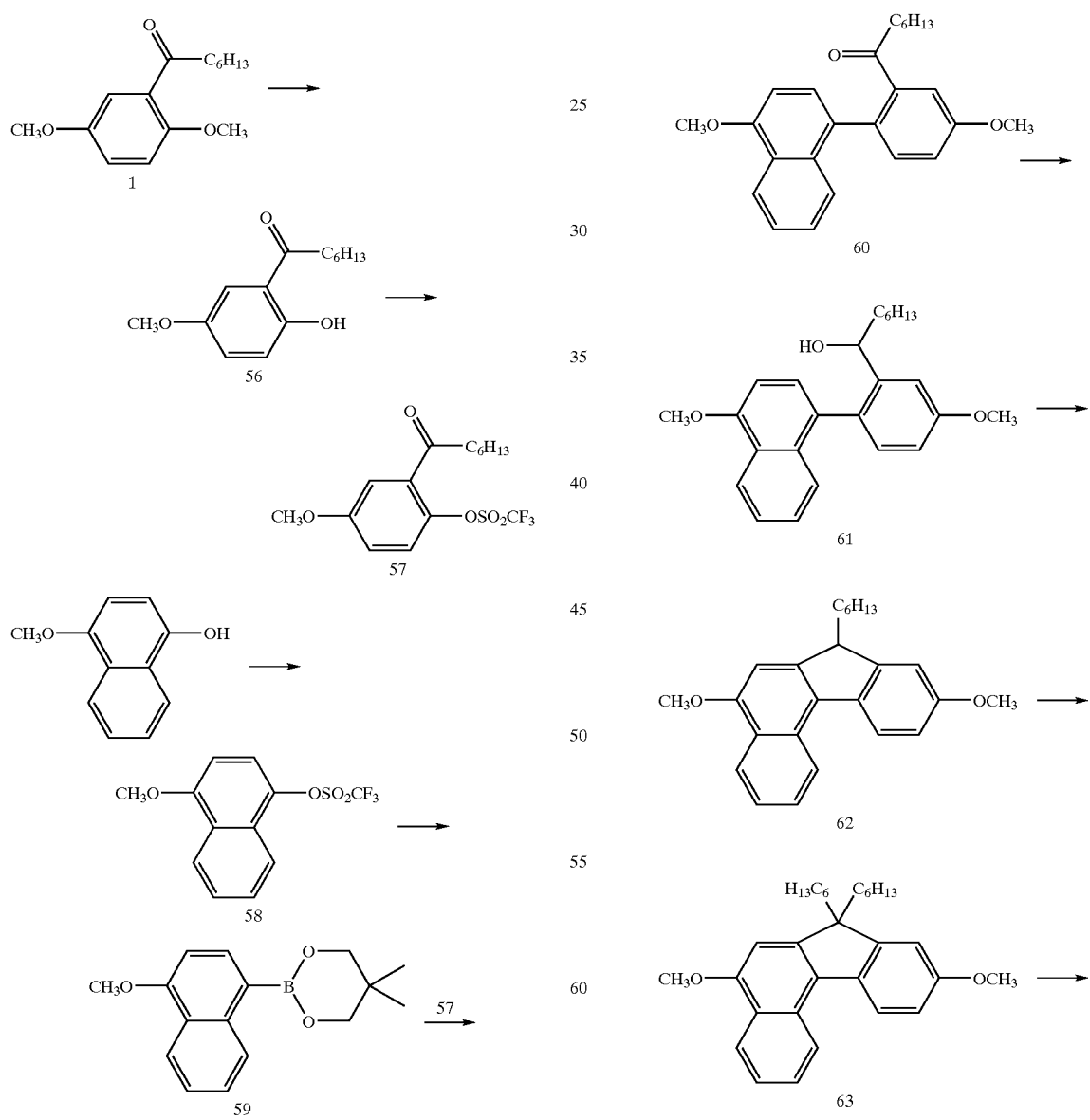

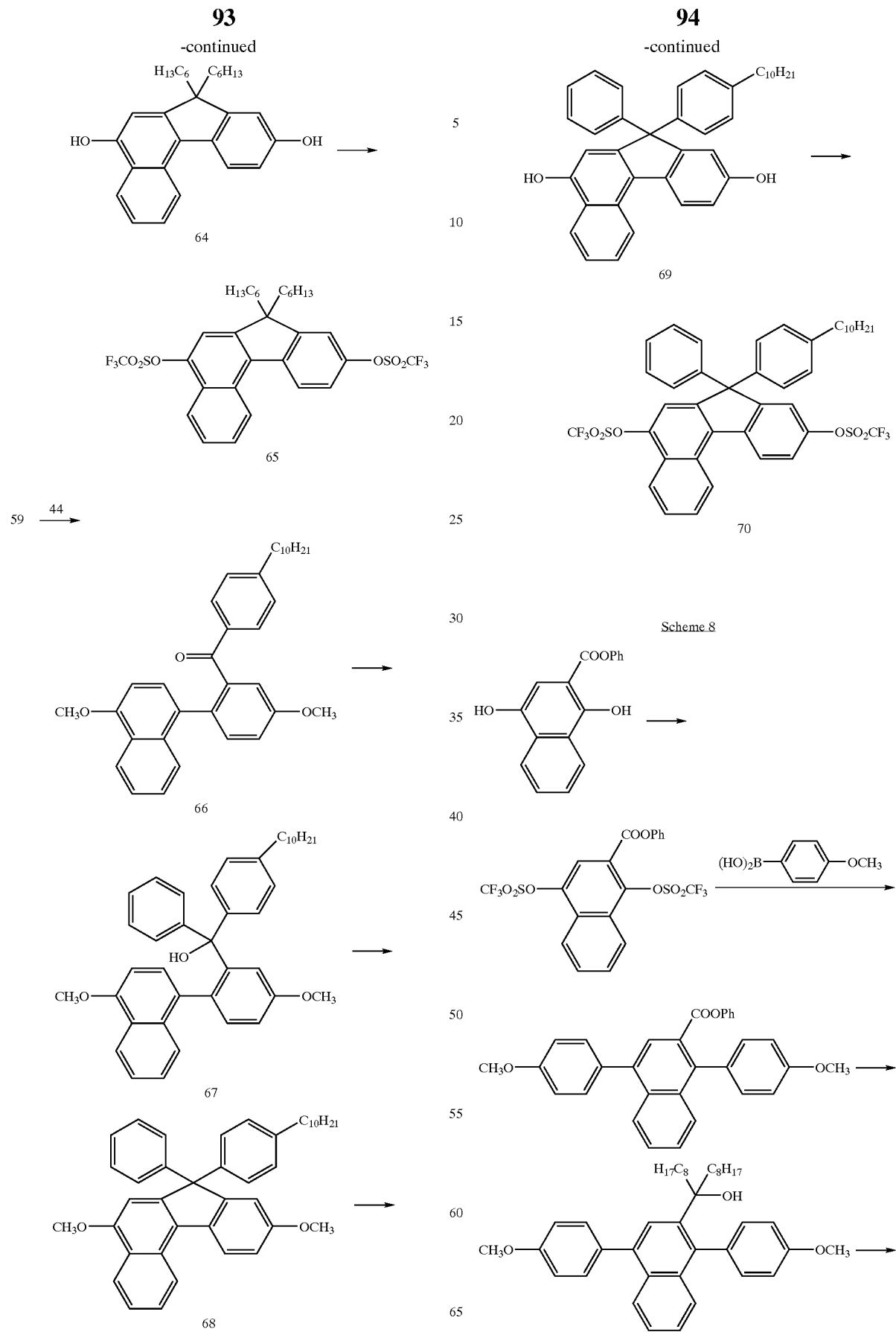

95
-continued
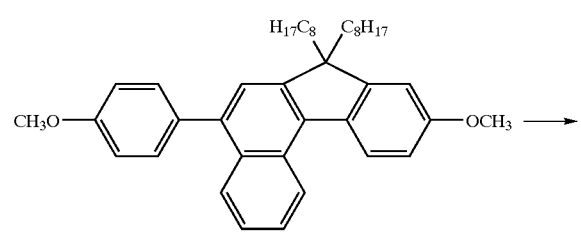
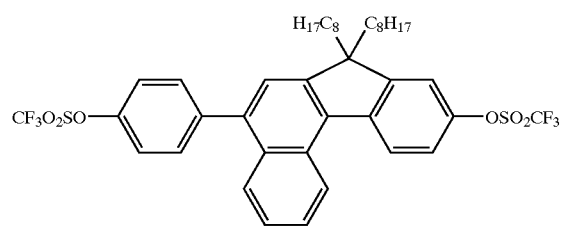
Alternative route
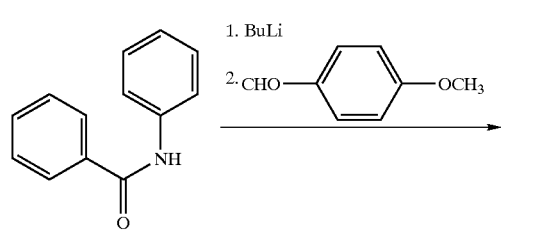
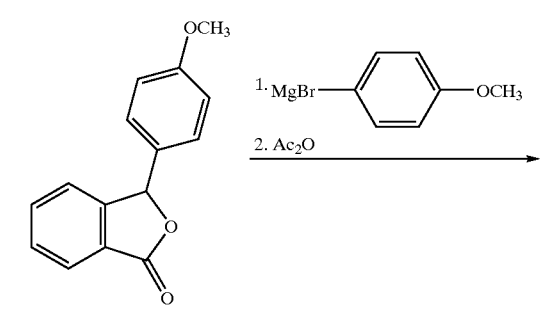
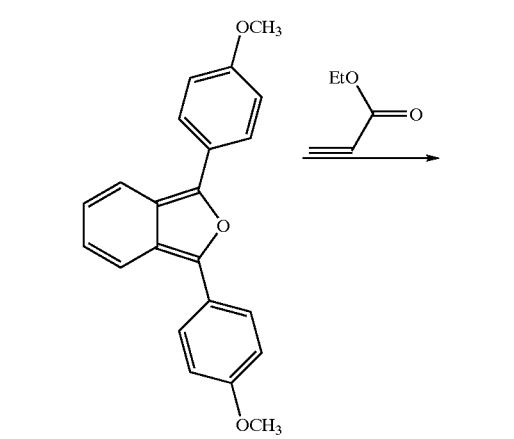
96
-continued
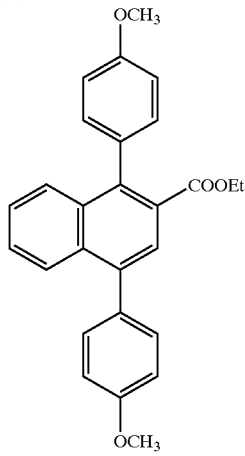
Scheme 9
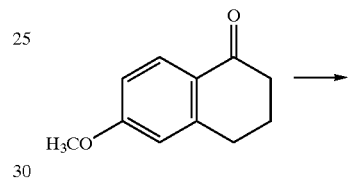
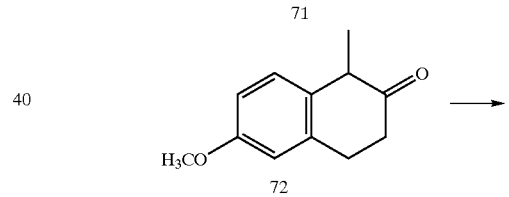
71
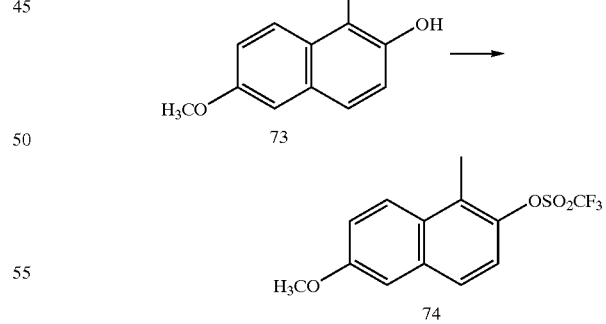
72
73
74
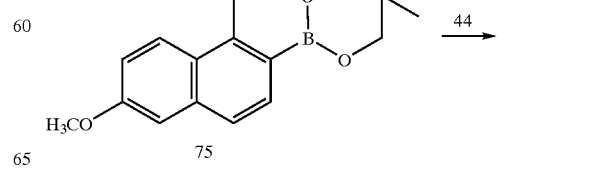
75

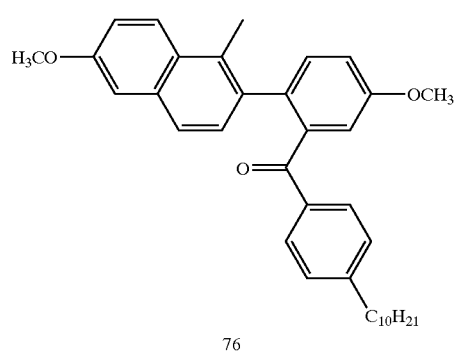
76
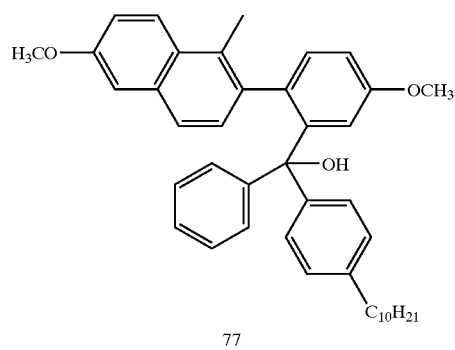
77
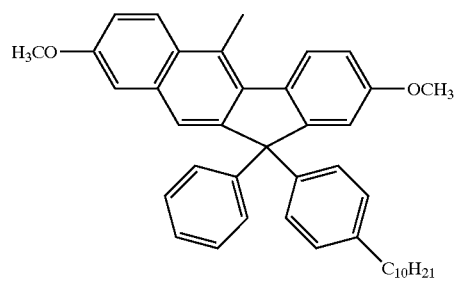
78
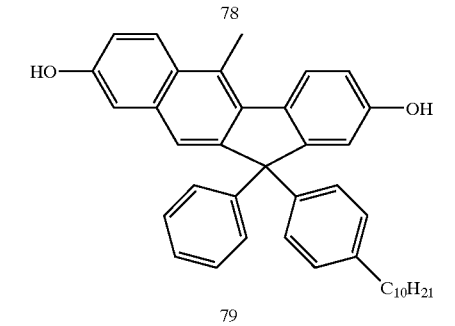
79
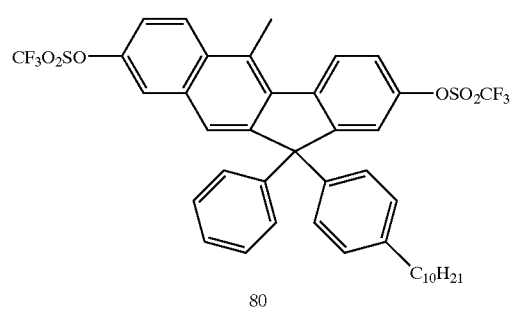
80
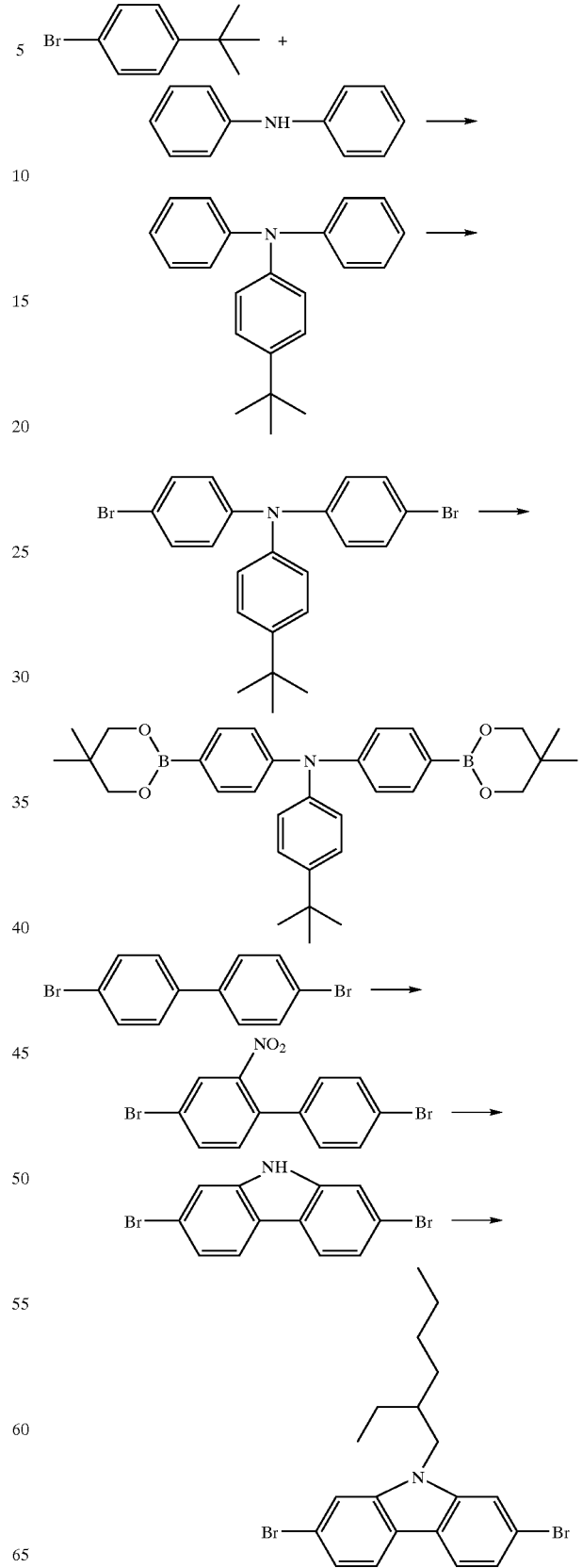
Scheme 10

Scheme 11

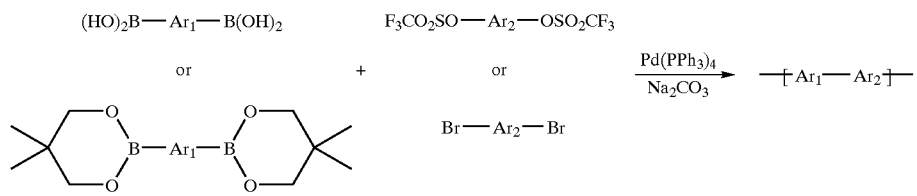

Example 1
Synthesis of Compound 1 (2,5-dimethoxy-heptanophenone)

1,4-Dimethoxybenzene (15.0 g, 0.11 mol) was dissolved in 100 mL of methylene chloride and the solution was cooled to 0° C. To the solution was added aluminum chloride (17.37 g, 0.13 mol) in portions and the mixture was stirred for 10 min. Heptanoyl chloride (17.75 g, 0.12 mol) was added via an additional funnel. After 2 h, reaction was complete and was quenched with dilute HCl solution carefully. The organic phase was separated, washed with dilute sodium bicarbonate, and dried over magnesium sulfate. The crude product was purified by column on silica gel using either/heptane (10/90) as an eluent to give 20.52 g pure product as clear oil (75% yield). FD-MS: 250 ($M^+$).

Example 2
Synthesis of Compound 2 (2,5-dihydroxy-heptanophenone)

Compound 1 (10.0 g, 0.040 mol) was dissolved in 150 mL of toluene. To this solution was added aluminum chloride (11.72 g, 0.088 mol) in portions. The reaction was heated to 80° C. overnight. After cooled to room temperature, the reaction was poured into dilute HCl solution. The organic phase was separated and the aqueous phase was extracted with methylene chloride. The combined organic phase was dried over magnesium sulfate. The crude product was purified by recrystallization from hexane/ethyl acetate to give 6.42 g of pure product as yellow fluffy solid (72% yield). $^1$H NMR (CDCl$_3$) δ ppm: 0.89 (t, J=6.6 Hz, 3 H), 1.28–1.39 (m, 6 H), 1.67–1.76 (m, 2 H), 2.91 (t, J=7.5 Hz, 2 H), 5.37 (br, 1 H), 6.87 (d, J=8.9 Hz, 1 H), 7.03 (dd, J$_1$=8.9 Hz, J$_2$=3.0 Hz, 1 H), 7.22 (d, J=3.0 Hz, 1 H), 12.06 (s, 1 H); FD-MS: 222 ($M^+$).

Example 3
Synthesis of Compound 3 (5-benyloxy2-hydroxy-heptanophenone)

Compound 2 (53.60 g, 0.24 mol) was dissolved in 500 mL of acetone. To this solution was added anhydrous potassium carbonate (36.66 g, 0.26 mol). The mixture was stirred for 10 min and benzyl bromide (45.37 g, 0.26 mol) was added dropwise. The reaction was refluxed overnight. After cooled to room temperature, the reaction was filtered and acetone was evaporated. The residue was extracted with ether and dried over magnesium sulfate. The crude product was purified by column on silica gel using heptane/ethyl acetate (98/2) as an eluent. The product was obtained as light yellow solid after further recrystallization from heptane, 50.12 g (0.67% yield). $^1$H NMR (CDCl$_3$) δ ppm:0.90 (t, J=6.6 Hz, 3 H), 1.32–1.39 (m, 6 H), 1.64–1.71 (m, 2 H), 2.88 (t, J=7.5 Hz, 2 H), 5.03 (s, 2 H), 6.91 (d, J=9.0 Hz, 1 H), 7.15 (dd, J$_1$=9.0 Hz, J$_2$=3.0 Hz, 1 H), 7.25 (d, J=3.0 Hz, 1 H), 7.32–7.43 (m, 5 H), 11.99 (s, 1 H); FD-MS: 222 ($M^+$).

Example 4
Synthesis of Compound 4

Compound 3 (50.0 g, 0.16 mol) was dissolved in methylene chloride and cooled to 0° C. To the solution was added triethylamine (19.4 g, 0.19 mol), followed by slow addition of triflate anhydride (54.2 g, 0.19 mol). The mixture was stirred at room temperature for a few hours until the completion of the reaction. The reaction was quenched with water, extracted with methylene chloride and dried over MgSO$_4$. The crude product was recrystallized passed through a short pad of silica gel and recrystallized from heptane to give 55.0 g pure product as fluffy white powder (77% yield). FD-MS: 444 ($M^+$).

Example 5
Synthesis of Compound 5 (2-bromo-6-benzyloxynaphthalene)

6-Bromo-2-naphthol (50.0 g, 0.22 mol) was dissolved in 150 mL of DMF, and potassium carbonate (123.92 g, 0.90 mol) was added. The mixture was stirred for 10 min and benzyl bromide (95.84 g, 0.56 mol) was added. The reaction mixture was heated at 90° C. for 4 h and poured into water. The crude product was collected as yellow powder and was purified by recrystallization from ethanol to give 68.05 g pure product as sparklingly white needles (97% yield). $^1$H NMR (CDCl$_3$) δ ppm: 5.17 (s, 2 H), 7.18 (d, J=2.4 Hz, 1 H), 7.25 (dd, J$_1$=8.9 Hz, J$_2$=2.5 Hz, 1 H), 7.35–7.52 (m, 6H), 7.60 (d, J=8.8 Hz, 1 H), 7.67 (d, J 8.9 Hz, 1 H), 7.92 (d, J=1.6 Hz, 1 H); $^{13}$C NMR (CDCl$_3$): 70.08, 107.09, 109.74, 117.15, 120.08, 127.56, 128.11, 128.42, 128.55, 128.64, 129.62, 130.09, 132.96, 136.57; FD-MS: 313 ($M^+$).

Example 6
Synthesis of Compound 6 (6-benzyloxy-2-naphalene boronic acid)

Compound 5 (15.65 g, 0.050 mol) was dissolved in 200 mL of anhydrous THF and cooled to −78° C. To the cold solution was added dropwise n-BuLi (30 mL, 2.5 M in hexane, 0.075 mol) to maintain the temperature lower than −60° C. After one hour, trimethylborate (10.39 g, 0.10 mol) was added and the reaction was stirred for 3 h. The reaction was quenched by dilute HCl, stirred at room temperature for 1 h, and extracted with methylene chloride. The organic phase was dried over MgSO$_4$ and concentrated. The crude product was recrystallized from toluene to give light gray solid that was recrystallized again in methanol to remove the insoluble by-product. The pure product was concentrated from the filtrate as white solid, 6.1 g (44% yield). FD-MS: 278($M^+$).

Example 7
Synthesis of Compound 7

Compound 4 (24.16 g, 0.054 mol) and compound 6 (13.60 g, 0.049 mol) were dissolved in 100 mL of toluene and 2 M solution of Na$_2$CO$_3$ (36 mL, 0.072 mol) and a few drops of phase transfer reagent Aquat 336 were added. The mixture was bubbled with nitrogen for 10 min and catalyst tetrakis (triphenylphosphine) palladium (0.85 g, 1.5 mol %) was added. The reaction was heated to 105° C. for 3 h. After cooled down, the organic phase was separated and the aqueous phase was extracted with methylene chloride. The combined organic phase was dried over $MgSO_4$. The crude product was recrystallized twice from heptane to give 15.13 g of pure product as white powder (58% yield). $^1$H NMR ($CDCl_3$) δ ppm:0.73 (t, J=7.2 Hz, 3 H), 0.92–0.97 (m, 4 H), 1.04–1.10 (m, 2 H), 1.35–1.40 (m, 2 H), 2.22 (t, J=7.4 Hz, 2 H), 5.15 (s, 2 H), 5.21 (s, 2 H), 7.11–7.16 (m, 2 H), 7.26–7.52 (m, 14 H), 7.67 (d, J=1.3 Hz, 1 H), 7.76 (d, J=8.4 Hz, 2 H); $^{13}$C NMR ($CDCl_3$): 14.04, 22.36, 24.56, 28.59, 31.35, 42.92, 70.06, 70.24, 106.87, 113.39, 117.12, 119.62, 127.12, 127.31, 127.37, 127.44, 127.96, 128.01, 128.53, 128.83, 129.51, 131.51, 135.40, 136.61, 142.18, 156.89, 157.82, 208.15; FD-MS: 528 ($M^+$).

Example 8

Synthesis of Compound 8

Compound 7 (11.20 g, 0.021 mol) was dissolved in 100 mL of anhydrous THF and cooled to 0° C. LAH (1.60 g, 0.042 mol) was added in portions under nitrogen. After addition, the reaction was stirred for 15 min, and quenched with sodium sulfate decahydrate carefully. The reaction was filtered and the precipitated solid was washed methylene chloride. The filtrate was concentrated to give pure product at quantitative yield, 11.35 g. $^1$H NMR ($CDCl_3$) δ ppm: 0.78 (t, J=7.1 Hz, 3 H), 1.11–1.69 (m, 10 H), 4.81–4.85 (m, 1 H, OH), 5.15 (s, 2 H), 5.21 (s, 2 H), 6.96 (dd, $J_1$=8.5 Hz, $J_2$=2.6 Hz, 2 H), 7.20–7.52 (m, 14 H), 7.65 (s, 1H), 7.73 (d, J=2.2 Hz, 1 H), 7.73–7.77 (m, 1 H); $^{13}$C NMR ($CDCl_3$): 14.00, 22.50, 25.81, 28.95, 31.60, 38.76, 70.07, 70.48, 106.97, 109.76, 111.76, 113.77, 119.47, 126.49, 127.55, 127.98, 128.03, 128.54, 128.59, 128.63, 128.79, 129.46, 131.37, 133.26, 133.54, 136.82, 143.92, 156.84; FD-MS: 530 ($M^+$).

Example 9

Synthesis of Compound 9

Compound 8 (14.10 g, 0.028 mol) was dissolved in 100 mL of methylene chloride and cooled to 0° C. To the solution was added boron trifluoride etherate (5.9 g, 0.042 mol). After 20 min, the reaction was quenched carefully with saturated sodium bicarbonate solution. Organic phase was separated and the aqueous phase was extracted with methylene chloride. The combined organic phase was dried over $MgSO_4$. The crude product was recrystallized from heptane twice to give 8.21 g of product as off-white solid (56% yield). $^1$H NMR ($CDCl_3$) δ ppm: 0.72 (t, J=7.1 Hz, 3 H), 0.80–0.83 (m, 2 H), 1.03–1.12 (m, 6 H); 2.02–2.14 (m, 1 H), 2.17–2.27 (m, 1 H), 4.26–4.29 (m, 1 H), 5.10 (s, 2 H), 5.14 (s, 2 H), 6.96 (dd, $J_1$=8.3 Hz, $J_2$=2.2 Hz, 1 H), 7.16–7.47 (m, 14 H), 7.59 (d, J=8.3 Hz, 1 H), 7.65–7.73 (m, 2 H), 7.93 (d, J=8.7 Hz, 1 H); $^{13}$C NMR ($CDCl_3$): 14.00, 22.57, 24.41, 29.52, 31.52, 33.66, 47.10, 70.03, 70.40, 108.66, 111.51, 113.19, 118.79, 119.16, 119.70, 125.36, 126.83, 127.56, 127.60, 127.94, 128.01, 128.57, 128.61, 133.82, 135.35, 136.64, 136.93, 137.15, 142.34, 149.97, 155.86, 157.93; FD-MS: 512 ($M^+$).

Example 10

Synthesis of Compound 10

Compound 9 (8.20 g, 0.016 mol) was suspended in 16 mL of DMSO and the mixture was degassed by bubbling with nitrogen for 10 min. To this mixture was added 3 drops of phase transfer reagent Aquat® 336 and 50% NaOH aqueous solution (2.56 g, 0.032 mol) under nitrogen. The reaction turned bright orange immediately. n-Hexylbromide (3.20 g, 0.019 mol) was then added dropwise and the reaction was heated to 80° C. The orange color disappeared and reaction became light yellow and clear. After 20 min, the reaction was poured into water and extracted with ether. The combined organic phase was washed with water and dried over $MgSO_4$. After the removal of the solvent, the pure product was obtained as light brownish-yellow oil (quantitative yield). $^1$H NMR ($CDCl_3$) δ ppm: 0.44–0.52 (m, 4 H), 0.76 (t, J=7.1 Hz, 6 H), 0.94–1.12 (m, 12 H), 2.13–2.23 (m, 2 H), 2.42–2.52 (m, 2H), 5.21 (s, 2 H), 5.24 (s, 2 H), 7.05 (dd, $J_1$=8.2 Hz, $J_2$=2.3 Hz, 1 H), 7.11 (d, J=2.1 Hz, 1 H), 7.33–7.58 (m, 14 H), 7.68 (d, J=8.2 Hz, 1 H), 7.76–7.84 (m, 2 H), 8.16 (d, J=9.2 Hz); $^{13}$C NMR ($CDCl_3$): 13.94, 22.50, 23.50, 29.54, 31.31, 40.52, 57.22, 69.97, 70.35, 108.93, 109.42, 112.98, 118.68, 118.82, 119.41, 124.78, 125.97, 127.01, 127.62, 127.91, 127.99, 128.52, 128.58, 134.22, 135.02, 136.94, 137.01, 137.09, 143.56, 153.66, 155.55, 158.24; FD-MS: 596 ($M^+$).

Example 11

Synthesis of Compound 11

Compound 10 (9.55 g, 0.016 mol) was dissolved in 100 mL of methylene chloride and was cooled to 0° C. To this solution was added boron tribromide (6.05g, 0.024 mol) dropwise. After 30 min, the reaction was quenched with saturated sodium bicarbonate. The aqueous layer was extracted with methylene chloride and the combined organic layer was washed with water and dried over $MgSO_4$. The crude product was washed with minimum amount of methylene chloride to 4.21 g give pure product as light tan solid and the filtrate was purified by column chromatography on silica gel to give 1.42 g of product (total yield 84%). $^1$H NMR ($CDCl_3$) δ ppm: 0.34–0.47 (m, 4 H), 0.69 (t, J=7.0 Hz, 6 H), 0.90–1.05 (m, 12 H), 2.05–2.13 (m, 2 H), 2.33–2.43 (m, 2 H), 4.78 (br, 1 H), 4.93 (br, 1 H), 6.82 (dd, $J_1$=8.1 Hz, $J_2$=2.3 Hz, 1 H), 6.90 (d, J=2.2 Hz, 1 H), 7.15 ($J_1$=9.0 Hz, $J_2$=2.3 Hz, 1 H), 7.24 (d, J=2.4 Hz, 1 H), 7.57 (d, J=8.0 Hz, 1 H), 7.67 (d, J=8.2 Hz, 1 H), 7.75 (d, J=8.4 Hz, 1 H), 8.06 (d, J=9.1 Hz, 1 H); $^{13}$C NMR ($CDCl_3$): 13.93, 22.50, 23.51, 29.55, 31.34, 40.53, 109.45, 109.75, 111.37, 113.78, 117.60, 118.85, 118.88, 119.61, 125.09, 126.58, 128.80, 128.80, 134.92, 143.47, 152.08, 154.80; FD-MS: 416 ($M^+$).

Example 12

Synthesis of Compound 12

Compound 11 (5.60 g, 0.013 mol) and triethylamine (3.56 g, 0.035 mol) were dissolved in 80 mL of methylene chloride, and the solution was cooled to 0° C. Triflate anhydride (9.10 g, 0.032 mol) was added slowly. After 30 min, the reaction was quenched by water, and the aqueous phase was extracted with methylene chloride. The combined organic phase was washed with water and dried over $MgSO_4$. The crude product was recrystallized from heptane to give 7.12 g of pure product as light cream needles (79% yield). $^1$H NMR ($CDCl_3$) δ ppm: 0.30–0.40 (m, 4H), 0.69 (t, J=6.9 Hz, 6 H), 0.88–1.04 (m, 12 H), 2.17–2.67 (m, 2 H), 2.38–2.48 (m, 2 H), 7.31–7.34 (m, 2 H), 7.48 (dd, $J_1$=9.2 Hz, $J_2$=2.5 Hz, 1 H), 7.83 (d, J=8.2 Hz, 1 H), 7.87 (d, J=2.5 Hz, 1 H), 7.91–7.98 (m, 2 H), 8.25 (d, J=9.3 Hz, 1 H); $^{13}$C NMR ($CDCl_3$): 13.80, 22.32, 23.40, 29.22, 31.15, 40.03, 58.08, 115.56, 120.12, 120.23, 120.27, 120.76, 120.98, 125.93, 128.91, 129.10, 133.98, 138.58, 140.81, 145.08, 146.56, 149.20, 154.48; FD-MS: 680 ($M^+$).

Example 13

Synthesis of Compound 13

Compound 12 (1.81 g, 0.003 mol), bis(neopentyl glycola) diboron (1.31 g, 0.006 mol) and potassium acetate (1.55 g, 0.016 mol) were mixed in 15 mL of dioxane. The mixture was bubbled with nitrogen for 5 min and catalyst bis (diphenylphosphino)ferrocene palladium chloride (Pd(dppf)$_2$Cl$_2$) (70 mg, 0.03 mol %) and ligand dppf (40 mg, 0.03 mol %) were added. The reaction was heated at 80° C. under nitrogen overnight. The reaction was extracted with methylene chloride and water, and the crude product was passed through a short column of silica gel to give 1.31 g of pure product as light yellow foam (82% yield). $^1$H NMR (CDCl$_3$): 0.26–0.40 (m, 4 H), 0.66 (t, J=7.0 Hz, 6 H), 0.83–0.98 (m, 12 H), 1.07 (s, 12 H), 2.21–2.31 (m, 2 H), 2.42–2.52 (m, 2 H), 3.83 (s, 4 H), 3.84 (s, 4 H), 7.75 (d, J=8.8 Hz, 1 H), 7.83 (d, J=8.4 Hz, 1 H), 7.85–7.92 (m, 4 H), 8.18 (d, J=8.5 Hz, 1 H), 8.44 (s, 1 H); $^{13}$C NMR (CDCl$_3$): 13.91, 21.95, 22.04, 22.49, 23.48, 29.54, 31.31, 31.92, 31.97, 40.09, 57.31, 72.35, 72.44, 109.77, 118.47, 122.62, 127.10, 129.00, 130.06, 131.75, 132.61, 133.18, 136.64, 139.72, 144.00, 144.78, 151.40; FD-MS: 608 (M$^+$).

Example 14
Synthesis of Compound 14 (2,6-dihexyloxynaphthalene)

2,6-Dihydroxynaphthalene (30.0 g, 0.19 mol) reacted with n-hexylbromide (68.06 g, 0.41 mol) in the presence of potassium carbonate (129.6 g, 0.94 mol) in 400 mL of DMF at 95° C. for 3 h. The reaction was poured into 700 mL of water and the precipitate was filtered, washed with water and methanol, and dried. The crude product was recrystallized from ethanol to give 54.5 g (88% yield) of pure product white crystals. $^1$H NMR CDCl$_3$) δ (ppm): 0.91 (t, J=6.9 Hz, 6 H), 1.32-1.40 (m, 8H), 1.44–1.54 (m, 4H), 1.77–2.86 (m, 4H), 4.02 (t, J=6.6 Hz, 4H), 7.06-7.12 (m, 4H), 7.60 (d, J=8.8 Hz, 2H); M.p. 78–79° C.; FD-MS: 328 (M$^+$).

Example 15
Synthesis of Compound 15

Compound 14 (25.5 g, 0.078 mol) was dissolved in 250 mL of methylene chloride and cooled to 0° C. To this solution was added aluminum chloride (12.7 g, 0.085 mol) in portions and heptanoyl chloride (12.4 g, 0.093 mol) was added via an additional funnel. The reaction was monitored by TLC and was quenched carefully with 2N HCl solution. The reaction was extracted with methylene chloride and the combined organic phase was dried over MgSO$_4$. The crude product was recrystallized from heptane to give 25.4 g (74% yield) as light yellow powder. $^1$H NMR CDCl$_3$) δ (ppm): 0.77–0.85 (m, 9 H), 1.21–1.39 (m, 18 H), 1.61–1.76 (m, 6 H), 2.84 (t, J=7.4 Hz, 2 H), 3.91–4.00 (m, 4 H), 6.98 (d, J=2.4 Hz, 1 H), 7.04 (dd, J$_1$=9.1 Hz, J$_2$=2.4 Hz, 1 H), 7.09 (d, J=9.1 Hz, 1 H), 7.48 (d, J=9.2 Hz, 1 H), 7.61 (d, J=9.1 Hz, 1 H); FD-MS: 440 (M$^+$).

Example 16
Synthesis of Compound 16

Compound 15 (20.0 g, 0.045 mol) was dissolved in 200 mL of methylene chloride and cooled to 0° C. To the solution was slowly added boron tribromide (34.45 g (13.0 mL), 0.14 mol). The reaction was stirred for 1 h and quenched carefully with saturated NaHCO$_3$ solution. The reaction was extracted with methylene chloride and the combined organic phase was dried over MgSO$_4$. The crude product was recrystallized from heptane to give 10.2 g (83% yield) of pure product as yellow solid. $^1$H NMR CDCl$_3$) δ (ppm): 0.85 (t, J=7.0 Hz, 3 H), 1.29-1.35 (m, 6 H), 1.77–1.84 (m, 2 H), 3.13 (t, J=7.4 Hz, 2 H), 5.04 (br, 1 H), 7.10–7.19 (m, 3 H), 7.72 (d, J=9.9 Hz, 1 H), 7.94 (d, J=9.3 Hz, 1 H), 12.75 (s, 1 H); FD-ES: 273 (M+1)$^+$.

Example 17
Synthesis of Compound 17

Compound 16 (30.02 g, 0.11 mol) was dissolved in 200 mL of acetone. To the solution was added potassium carbonate (38.05 g, 0.28 mol) and catalytic amount of 18-crown-6. The mixture was stirred for 5 min. and benzyl bromide (47.2 g, 0.28 mol) was added. The reaction was heated to reflux for 2 h and then solvent was removed. The residue was extracted with methylene chloride/water. Pure product was obtained by recrystallization using heptane (40.1 g, 80% yield). $^1$H NMR CDCl$_3$) δ (ppm): 0.72 (t, J=7.4 Hz, 3 H), 1.12–1.19 (m, 6 H), 1.52–1.61 (m, 2 H), 2.78 (t, J=7.5 Hz, 2 H), 5.01 (s, 2 H), 5.04 (s, 2 H), 7.03 (d J=2.5 Hz, 1 H), 7.09 (d, J=9.4 Hz, 1 H), 7.10 (d, J=9.1 Hz, 1 H), 7.18–7.34 (m, 10 H), 7.46 (d, J=9.2 Hz, 1 H), 7.56 (d, J=9.1 Hz, 1 H); FD-ES: 453 (M+1)$^+$.

Example 18
Synthesis of Compound 18

Compound 17 (16.0 g, 0.035 mol) was dissolved in 200 mL of toluene. To the solution was added anhydrous magnesium bromide/ether complex (9.12 g, 0.035 mol). The reaction was refluxed overnight. The reaction was cooled and water was added. The organic phase was separated and the aqueous phase was extracted with ether. The combined organic phase was dried over MgSO$_4$. The pure product was obtained by column chromatography on silica gel using heptane/ether as an eluent (11.5 g, 90% yield). $^1$H NMR CDCl$_3$) δ (ppm): 0.85 (t, J=7.0 Hz, 3 H), 1.29–1.35 (m, 6 H), 1.77–1.84 (m, 2 H), 3.08 (t, J=7.4 Hz, 2 H), 5.11 (s, 2 H), 7.93–7.46 (m, 8 H), 7.68 (d, J=9.1 Hz, 1 H), 7.92 (d, J=9.2 Hz, 1 H), 12.74 (s, 1 H); FD-MS: 362 (M$^+$).

Example 19
Synthesis of Compound 19

Compound 18 (3.02 g, 0.0083 mol) was dissolved in 30 mL of methylene chloride and cooled to 0° C. To this solution was added triethylamine (1.01 g, 0.0099 mol) and trifluoromethane sulfonic anhydride (2.85 g, 0.01 mol) was added dropwise. After 20 min, the reaction was quenched by water and extracted with methylene chloride. The pure product was obtained by passing through a short silica gel column (4.0 g, quantitative yield). FD-MS: 494 (M$^+$).

Example 20
Synthesis of Compound 20

Compound 6 (9.27 g, 0.033 mol) and compound 19 (15.0 g, 0.030 mol) were dissolved in 150 mL of toluene. To this solution was added 2 M Na$_2$CO$_3$ (30 mL, 0.060 mol) and a drop of phase transfer reagent Aliquat 336. The mixture was bubbled with nitrogen for 10 min and catalyst Pd(PPh$_3$)$_4$ (0.52 g, 1.5mol %) was added. The reaction was heated to 105° C. for 3 h and cooled down. The reaction was extracted with methylene chloride and the combined organic phase was dried over MgSO$_4$. The crude product was recrystallized from heptane to give 10.34 g (60% yield) pure product as light yellow solid. FD-MS: 578 (M$^+$).

Example 21
Synthesis of Compound 21

Compound 20 (1.0 g, 1.7 mmol) was dissolved in 10 mL of anhydrous THF and cooled to 0° C. To this cold solution was added LiAlH$_4$ (0.10 g, 2.6 mmol). The reaction was stirred for 20 min and quenched with sodium sulfate decahydrate and then filtered. The precipitate was washed thoroughly with methylene chloride. The filtrate was evaporated to give 0.81 g (81% yield) of pure product as yellow solid. FD-MS: 580 (M$^+$).

Example 22
Synthesis of Compound 22

Compound 21 (8.85 g, 0.015 mol) was dissolved in methylene chloride and cooled to 0° c. To this solution was added dropwise trifluoroacetic acid (2.47 g, 0.022 mol). After 20 min, reaction was quenched with water and extracted with methylene chloride. The pure product was obtained from recrystallization of the crude product from heptane to give white pulp-like solid (6.36 g, 75% yield). $^1$H NMR CDCl$_3$) δ (ppm): 0.32–0.37 (m, 2 H), 0.61 (t, J=7.0 Hz, 3 H), 0.83–0.92 (m, 4 H), 1.26–1.38 (m, 2 H), 2.53–2.55 (m, 2 H), 4.86 (br, 1 H), 5.21 (s, 4 H), 7.25–7.53 (m, 17 H), 7.68 (d, J=8.3 Hz, 1 H), 7.92 (d, J=8.3 Hz, 1 H), 8.09 (d, J=8.8 Hz, 1 H); $^{13}$C NMR (CDCl$_3$): 13.87, 22.42, 29.38, 31.29, 33.79, 46.36, 70.06, 108.61, 118.85, 119.26, 125.45, 125.81, 126.73, 127.62, 128.03, 128.63, 133.96, 136.94, 137.77, 143.45, 155.95; FD-MS: 562 (M$^+$).

Example 23
Synthesis of Compound 23

Compound 22 (1.0 g, 1.78 mmol) was suspended in 2 mL of DMSO. The suspension was degassed by bubbling nitrogen for 5 min. and 50% NaOH aqueous solution (0.28 g, 3.56 mmol) and a drop of phase transfer reagent Aliquat® 336, followed by slow addition of n-hexylbromide (0.35 g, 2.13 mmol). The reaction turned into bright orange upon addition of NaOH, and changed into light yellow when n-hexylbromide was added. The reaction was heated to 80° C. for 20 min. during which the reaction became clear light yellow solution. The reaction was poured into water, extracted with ether and dried to give quantitative pure product as off-white solid. $^1$H NMR CDCl$_3$) δ (ppm): 0.21–0.25 (m, 4 H), 0.59 (t, J=7.0 Hz, 6H), 0.74–0.92 (m, 8 H), 1.26–1.34 (m, 4 H), 2.65–2.70 (m, 4 H), 5.19 (s, 4 H), 7.30–7.44 (m, 10 H), 7.51 (d, J=7.2 Hz, 4 H), 7.77 (d, J=8.3 Hz, 2 H), 7.90 (d, J=8.3 Hz, 2 H), 8.30 (d, J=9.2 Hz, 2 H); $^{13}$C NMR (CDCl$_3$): 13.83, 22.36, 23.54, 29.39, 31.15, 40.12, 59.95, 69.99, 109.15, 118.58, 118.77, 124.67, 125.38, 127.11, 127.64, 128.01, 128.60, 134.65, 136.92, 137.48, 145.14, 155.54; FD-MS: 646 (M$^+$).

Example 24
Synthesis of Compound 24

Compound 23 (1.0 g, 1.5 mmol) was dissolved in 30 mL of methylene chloride and cooled to 0° C. To this solution was added boron tribromide (0.85 g, 3.4 mmol) dropwise. After 30 min, the reaction was quenched with saturated sodium bicarbonate. The aqueous layer was extracted with methylene chloride and the combined organic layer was washed with water and dried over MgSO$_4$. The crude product was washed with minimum amount of methylene chloride to 0.41 g give pure product as light tan solid and the filtrate was purified by column chromatography on silica gel using ether/heptane as an eluent to give 0.19 g of product (total yield 74%). $^1$H NMR (CDCl$_3$) δ ppm: 0.18–0.28 (m, 4 H), 0.60 (t, J=7.0 Hz, 6 H), 0.74–0.98 (m, 8 H), 1.12–1.31 (m, 4 H), 2.63–2.68 (m, 4), 5.08 (br, 2 H), 7.20 (dd, J$_1$=9.1 Hz, J$_2$=2.6 Hz, 2 H), 7.30 (d, J=2.6 Hz, 2 H), 7.73 (d, J=8.4 Hz, 2 H), 7.89 (d, J=8.4 Hz, 2 H); FD-MS: 466 (M$^+$).

Example 25
Synthesis of Compound 25

Compound 24 (1.0 g, 2.14 mmol) was dissolved in methylene chloride and cooled to 0° C. To the solution was added triethylamine (0.54 g, 5.36 mmol) followed by slow addition of trifluoromethanesulfonic anhydride (1.51 g, 5.36 mmol). The reaction was stirred at room temperature for 30 min and quenched with water. The reaction was extracted with methylene chloride and the organic phase was dried with MgSO$_4$. The crude product was recrystallized from heptane to give 1.1 g pure product as light yellow crystals (70% yield). $^1$H NMR (CDCl$_3$) δ ppm: 0.13–0.23 (m, 4 H), 0.59 (t, J=7.0 Hz, 6 H), 0.74–0.89 (m, 12 H), 2.66–2.72 (m, 4 H), 7.50 (dd, J$_1$=9.3 Hz, J$_2$=2.5 Hz, 2 H), 7.90 (d, J=2.6 Hz, 2 H), 7.97 (d, J=8.4 Hz, 2 H), 8.09 (d, J=8.4 Hz, 2 H), 8.44 (d, J=9.4 Hz, 2 H); 13.74, 22.24, 23.39, 29.13, 31.04, 40.06, 60.53, 119.88, 120.07, 121.18, 125.61, 128.59, 128.81, 133.98, 139.87, 145.87, 146.25, FD-MS: 730 (M$^+$).

Example 26
Synthesis of Compound 26

Compound 22 (7.0 g, 12.46 mmol) was suspended in 15 mL of DMSO. The suspension was degassed by bubbling nitrogen for 5 min. and 50% NaOH aqueous solution (1.96 g, 24.92 mmol) and 3 drop of phase transfer reagent Aliquat® 336, followed by slow addition of 2-ethylhexylbromide (2.89 g, 14.94 mmol). The reaction turned into bright orange upon addition of NaOH, and changed into light yellow when 2-ethylhexylbromide was added. The reaction was heated to 80° C. for 20 min. during which the reaction became clear light yellow solution. The reaction was poured into water, extracted with ether and dried to give quantitative 6.8 g of pure product as light yellow viscous oil (92% yield). FD-MS: 674 (M$^+$).

Example 27
Synthesis of Compound 27

Compound 26 (8.0 g, 11.87 mmol) was dissolved in methylene chloride and cooled to 0° C. To the solution was added boron tribromide (7.47 g, 29.68 mmol) dropwise. The reaction was stirred for 20 min. and quenched with saturated Na$_2$CO$_3$ solution, and extracted with methylene chloride. The crude product was purified by column chromatography on silica gel using 1/1 methylene chloride/heptane as an eluent to 3.5 g give pure product as light brown solid (60% yield). $^1$H NMR (CDCl$_3$) δ ppm: 0.16–0.87 (m, 26 H), 2.62–2.67 (m, 4 H), 7.20 (dd, J$_1$=9.1 Hz, J$_2$=1.3 Hz, 2 H), 7.28 (d, J=2.6 Hz, 2 H), 7.73 (d, J=8.3 Hz, 2 H), 7.88 (dd, J$_1$=8.3 Hz, J$_2$=1.2 Hz, 2 H), 8.28 (dd, J$_1$=9.1 Hz, J$_2$=2.6 Hz, 2 H); $^{13}$C NMR (CDCl$_3$): 10.34, 13.86, 13.96, 22.46, 22.55, 23.25, 26.51, 27.70, 29.42, 31.22, 32.79, 35.64, 41.18, 43.51, 59.70, 111.47, 111.50, 131.31, 117.33, 117.36, 118.76, 125.35, 125.47, 125.54,.61, 126.68, 126.73, 134.53, 134.62, 137.25, 137.32, 145.34, 145.46, 151.85; FD-MS: 494 (M$^+$).

Example 28
Synthesis of Compound 28

Compound 27 (3.50 g, 7.1 mmol) was dissolved in 100 mL of methylene chloride and cooled to 0° C. To this solution was added triethylamine (1.43 g, 14.1 mmol) followed by slow addition of triflic anhydride (4.41 g, 15.6 mmol). The reaction was stirred at room temperature for 20 min. and quenched with water. The reaction was extracted with methylene chloride and the organic phase was dried over MgSO$_4$. The crude product was purified by column chromatography on silica gel using methylene chloride/heptane (5/95) as an eluent to give 2.35 g of pure product as light cream solid (44% yield). $^1$H NMR (CDCl$_3$) δ ppm: 0.11–1.26 (m, 26 H), 2.67–2.71 (m, 4 H), 7.50 (d, J=9.4 Hz, 2 H), 7.89 (d, J=2.4 Hz, 2 H), 7.97 (d, J=8.4 Hz, 2 H), 8.08 (d, J=8.4 Hz, 2 H), 8.45 (d, J=9.3 Hz, 1 H), 8.47 (d, J=9.3 Hz, 1 H); $^{13}$C NMR (CDCl$_3$): 10.12, 13.50, 13.66, 22.23, 22.36, 22.72, 23.09, 26.56, 27.54, 29.09, 31.03, 32.79, 35.76, 40.96, 43.36, 60.27, 119.74, 120.09, 121.05, 121.13, 126.09, 128.87, 128.97, 133.94, 133.99, 139.91, 139.93, 146.22, 146.33, 146.37, 146.38; FD-MS: 758 (M$^+$).

Example 29
Synthesis of Compound 29

To a 500 mL round-bottomed flask was added 200 mL of methylene chloride and phenyldecane (37.6 g, 0.17 mol). The solution was cooled to 0° C., and aluminum chloride (18.4 g, 0.14 mol) was added in portions, followed by slow addition of o-bromobenzoyl chloride (25.2 g, 0.11 mol). The reaction was stirred at room temperature until completion and cooled to 0° C. and quenched carefully with 2 N HCl solution. The reaction was extracted with methylene chloride, and the combined organic phase was dried over $MgSO_4$. The crude product was purified by column on silica gel to give 41.6 g of product as clear oil (90% yield). FD-MS: m/z 401 ($M^+$).

Example 30
Synthesis of Compound 30 (4-(2-ethylhexyloxy)-bromobenzene)

To a 1-L round-bottomed flask were added 4-bromophenol (60.0 g, 0.35 mol), potassium carbonate (52.7 g, 0.38 mol), 2-ethylhexyl bromide (73.7 g, 0.38 mol) and DMF 200 mL. The reaction mixture was stirred at 90° C. under nitrogen overnight. The reaction was poured into water and extracted with ether three times and the combined organic phase was washed with water three times and dried over $MgSO_4$. After solvent was removed, the crude product was obtained as light brown liquid. Pure product was obtained by column chromatography on silica gel using ether/hexane (10/90) as an eluent as a light yellow liquid, 71.2 g (72% yield). $^1H$ NMR ($CDCl_3$) δ (ppm): 0.88–0.93 (m, 6H, $CH_3$), 1.27–1.46 (m, 8H), 1.65–1.74 (m, 1H), 3.78 (d, J=5.7 Hz, 2H, $OCH_2$), 6.76 (d, J=8.9 Hz, 2H), 7.33 (d, J=8.9 Hz, 2H); $^{13}C$ NMR ($CDCl_3$): 11.08, 14.08, 23.03, 23.80, 29.05, 30.46, 39.29, 70.72, 112.42, 116.29, 132.11, 158.47; FD-MS: m/z285 ($M^+$).

Example 31
Synthesis of Compound 31 (2,6-bis(t-butyldimethylsilyloxy)anthraquinone)

To a 2-L round-bottomed flask were added 2,6-dihydroxyanthraquinone (80.0 g, 0.33 mol), imidazole (108.8 g, 1.6 mol), t-butyldimethylsilyl chloride (115.5 g, 0.77 mol), and DMF 600 mL. The dark red mixture was heated to 90° C. for 3 h. TLC indicated the completion of the reaction. The reaction was cooled down and poured into 2 L of cool water. The dark green needle like precipitate was filtered off and washed with water and methanol. The dark green crystals were dissolved in ether and the black insoluble part was filtered off. The bright yellow filtrate was concentrated and the crude product was suspended in boiling methanol and filtered to give pure 85.1 g product as yellow silky crystals (54% yield). $^1H$ NMR ($CDCl_3$) δ (ppm): 0.28 (s, 12H), 1.00 (s, 18H), 7.14 (dd, $J_1$=8.5 Hz, $J_2$=2.5 Hz, 2H), 7.64 (d, J=2.5 Hz, 2H), 8.17 (d, J=8.5 Hz, 2H); $^{13}C$ NMR ($CDCl_3$): −4.36, 25.53, 117.35, 125.34, 127.57, 129.73, 135.73, 161.26, 182.17; M.p. 131–133° C.; FD-MS: m/z 468 ($M^+$).

Example 32
Synthesis of Compound 32 (2,6-dihydroxy-9,10-di(4-(2-ethylhexyloxy)phenyl)anthracene)

Compound 30 (18.3 g, 0.064 mol) was dissolved in 60 mL of anhydrous THF and cooled to −78° C. To this solution was added n-BuLi (2.5 M in hexane, 25.6 mL, 0.064 mol) slowly to maintain the temperature below 60° C. After addition, the orange-yellow solution was stirred at −78° C. for an hour. Compound 31 (10.0 g, 0.021 mol) was dissolved in 30 mL of anhydrous THF and added dropwise to the above cooled solution. TLC analysis indicated the completion of the reaction after 3 h. The reaction was warmed up slightly and HI solution (47% in water, 39 mL, 0.21 mol) was added slowly to quench the reaction and to de-protect the TBDMS group. The deep brown reaction was heated to reflux for 10 min. and most of the solvent was removed under reduced pressure. The reaction mixture was then extracted with methylene chloride three times. The combined organic phase was washed with saturated sodium metabisulfate solution, water, and brine, and dried over $MgSO_4$. The crude product was obtained as brown viscous oil and was purified by column chromatography on silica gel with 15/85 ether/hexane as an eluent. The pure product was obtained as light green-yellow solid 5.5 g (42% yield). $^1H$ NMR ($CDCl_3$) δ (ppm): 0.92–1.01 (m, 12H, $CH_3$), 1.26–1.46 (m, 16H), 1.77–1.86 (m, 2H), 3.96 (d, J 5.7 Hz, 4H, $OCH_2$), 4.93 (s, br, 2H, OH), 6.91 (d, J=2.3 Hz, 2H), 6.95 (dd, J. =9.5 Hz, $J_2$=2.4 Hz, 2H), 7.09 (d, J=8.6 Hz, 4H, phenyl), 7.31 (d, J=8.6 Hz, 4H, phenyl), 7.60 (d, J=9.4 Hz, 2H); $^{13}C$ NMR ($CDCl_3$): 11.17, 14.13, 23.09, 23.91, 29.13, 30.58, 39.46, 70.62, 106.88, 114.49, 118.59, 127.33, 129.00, 129.93, 131.02, 132.21, 151.75, 158.72; M.p. 195–197° C.; FD-MS: m/z 618 ($M^+$).

Example 33
Synthesis of Compound 33 (2,6-di(triflate)-9,10-di(4-(2-ethylhexyloxy)phenyl)anthracene)

Compound 32 (4.5 g, 0.007 mol) was dissolved in 50 mL of dry pyridine and cooled to 0° C. To this brown red solution was added slowly triflate anhydride (6.2 g, 0.022 mol). The dark green reaction was stirred at room temperature for 20 min. TLC indicated the completion of the reaction. The reaction was poured into water and extracted with ether (3×200 mL). The combined organic phase was washed with 2N HCl (2×200 mL) and dried over $MgSO_4$. The crude product was purified by column chromatography on silica gel using $CH_2Cl_2$/hexane (10/90) to give 5.9 g of blue fluorescent yellow crystalline product (92% yield). $^1H$ NMR ($CDCl_3$) δ (ppm): 0.94–1.04 (m, 12H, $CH_3$), 1.38–1.60 (m, 16H), 1.81–1.88 (m, 2H), 4.01 (d, J=5.7 Hz, 4H, $OCH_2$), 7.16 (d, J=8.5 Hz, 4H, phenyl), 7.25 (dd, $J_1$=9.5 Hz, $J_2$=2.4 Hz, 2H), 7.35 (d, J=8.5 Hz, 4H, phenyl), 7.66 (d, J=2.3 Hz, 2H), 7.88 (d, J=9.5 Hz, 2H); M.p. 103–104° C.; FD-MS: m/z882($M^+$).

Example 34
Synthesis of Compound 34 (2,6-di(2,2-dimethyltrimethylene diboronate)-9,10-di(4-(2-ethylhexyloxy)phenyl)anthracene)

Compound 33 (4.1 g, 0.005 mol), bis(neopentyl glycolato)diboron (2.3 g, 0.01 mol), 1,1'-bis(diphenylphosphino)ferrocene)dichloropalladium (II)/dichloromethane complex (0.23 g, 6 mol % to compound 33), 1,1'-bis(diphenylphosphino)ferrocene (0.15 g, 6 mol % to 33), and potassium acetate (2.7 g, 0.028 mol) were mixed with 50 mL of dioxane. The mixture was degassed with nitrogen for 10 min. and then heated to 80° C. overnight. The reaction was cooled and ice water 50 mL was added. Brown precipitate formed and was filtered, washed with water, and hexane. The brownish yellow solid was dissolved in ether, washed with water (5×100 mL) to remove the by-product neopentyl glycol to give 3.3 g of product as light brownish yellow solid (88% yield). $^1H$ NMR ($CDCl_3$) δ (ppm): 0.94–1.04 (m, 24H, $CH_3$), 1.21–1.43 (m, 16H), 1.80–1.88 (m, 2H), 3.72 (s, 8H), 4.02 (d, J=5.7 Hz, 4H, $OCH_2$), 7.14 (d, J=8.5 Hz, 4H, phenyl), 7.38 (d, J=8.5 Hz, 4H, phenyl), 7.62–7.70 (m, 4H), 8.28 (s, 2H); $^{13}C$ NMR ($CDCl_3$): 11.24, 14.16, 21.95, 23.12, 23.95, 29.20, 30.64, 31.83, 39.57, 70.71, 72.24, 114.38, 126.02, 128.25, 130.20, 130.98, 131.26, 132.38, 132.49, 134.41, 134.52, 137.47, 158.59; M.p. 191–193° C.; FD-MS: m/z 810 (M$^+$).

Synthesis of Polymers

Example 35

General Procedure for Synthesis of Polymers Via the Suzuki Coupling Reaction

Equal molar of aromatic di-bromide or di-triflate and aromatic di-boron compound, and phase transfer reagent Aliquat® 336 (0.10 equivalent to monomer) were dissolved in of toluene (the ratio of toluene to water (v/v) is about 3/1). To this solution was added 2 M Na$_2$CO$_3$ aqueous solution (3.3 equivalent to monomer). The reaction mixture was bubbled with dry nitrogen for 15 min and catalyst tetrakis (triphenylphosphine)palladium (0.03 equivalent to monomer) was added. The reaction was heated under vigorous reflux for 12–24 h, and small amount of phenylboronic acid was added for end-capping of bromo group. The reaction was heated for 5 h and bromobenzene was added to end-cap boronate group. The reaction was heated for another 4 h and then poured into 200 mL of methanol. The precipitated polymer was washed with methanol, diluted HCl solution, and dried. The polymer was treated with diethyl dithiocarbamate twice: polymer was dissolved in toluene, and sodium diethyl dithiocarbamate in water (1 g in 10 mL of water) was added, and the mixture was stirred under nitrogen at 60° C. overnight. The toluene layer was separated and concentrated and the polymer was precipitated into methanol twice. Polymer can then be extracted with acetone with a Sohxlet setup overnight to remove oligomers. Polymer was dried under vacuum at 45° C.

EL Device Fabrication and Performance

Example 36

An EL device satisfying the requirements of the invention was constructed in the following manner. The organic EL medium has a single layer of the organic compound described in this invention.

a) An indium-tin-oxide (ITO) coated glass substrate was sequentially ultra-sonicated in a commercial detergent, rinsed with deionized water, degreased in toluene vapor and exposed to ultraviolet light and ozone for a few minutes.

b) An aqueous solution of PEDOT (1.3% in water, Baytron P Trial Product Al 4083 from H. C. Stark) was spin-coated onto ITO under a controlled spinning speed to obtain thickness of 500 Angstroms. The coating was baked in an oven at 110° C. for 10 min.

c) A toluene solution of a compound (300 mg in 30 mL of solvent) was filtered through a 0.2 μm Teflon filter. The solution was then spin-coated onto PEDOT under a controlled spinning speed. The thickness of the film was between 500–700 Angstroms.

d) On the top of the organic thin film was deposited a cathode layer consisting of 15 angstroms of a CsF salt, followed by a 2000 angstroms of a 10:1 atomic ratio of Mg and Ag.

The above sequence completed the deposition of the EL device. The device was then hermetically packaged in a dry glove box for protection against ambient environment.

Figure 2:
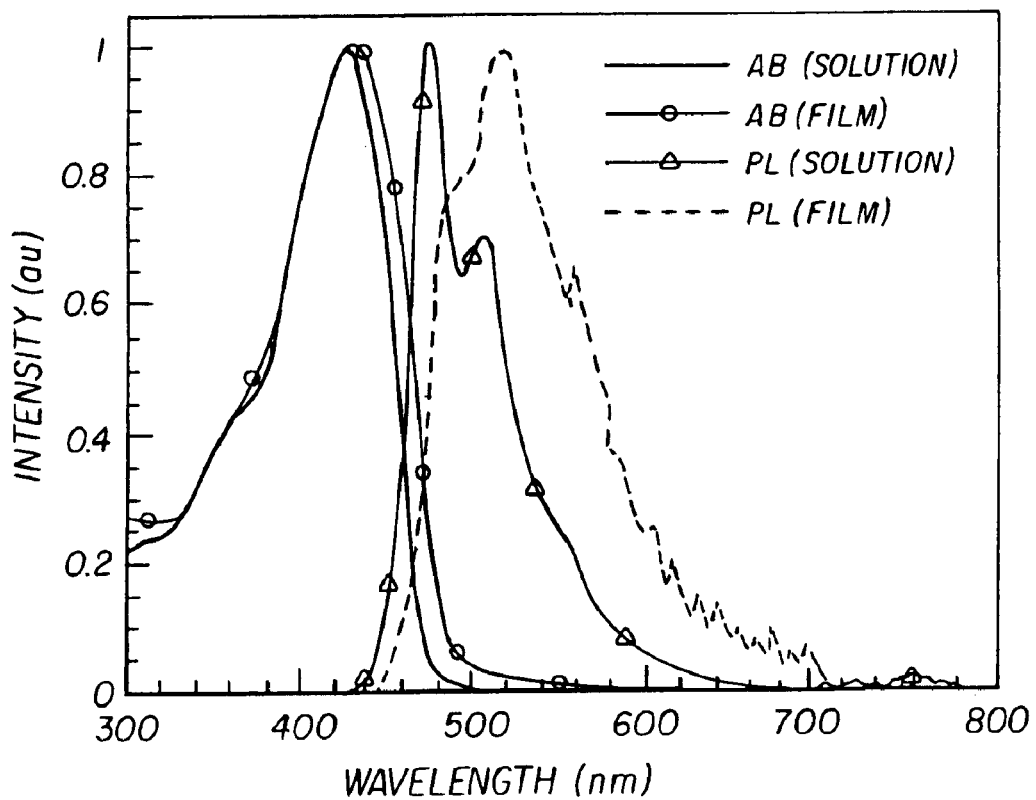
FIG. 2 illustrates the absorption (AB) and photoluminescence (PL) spectra of compound 231.
Figure 3:
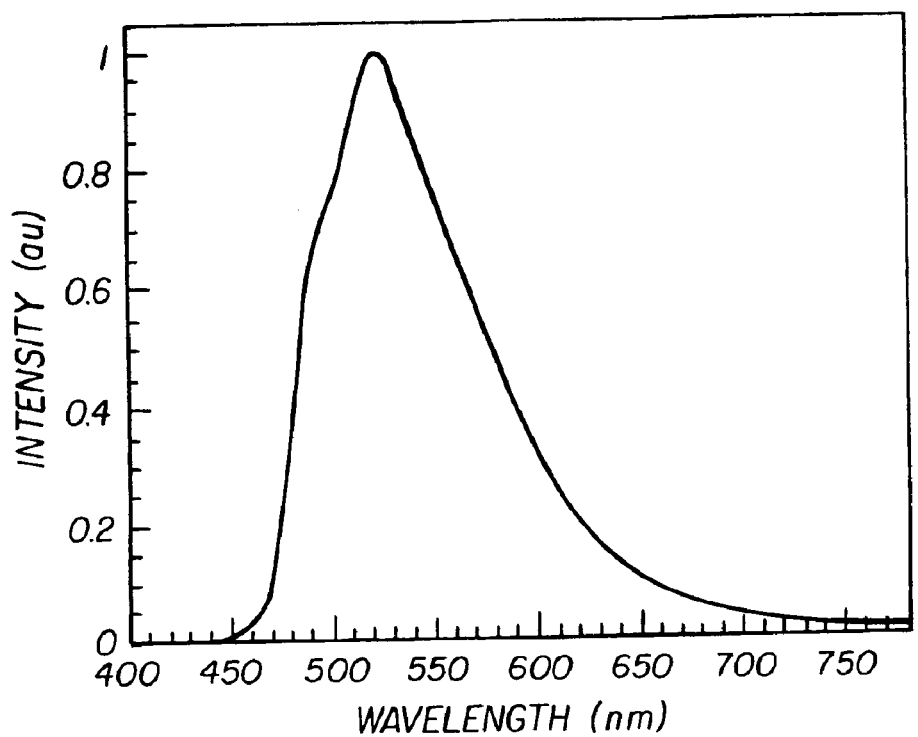
FIG. 3 illustrates the EL spectrum of an EL device fabricated from compound 231.
Figure 4:
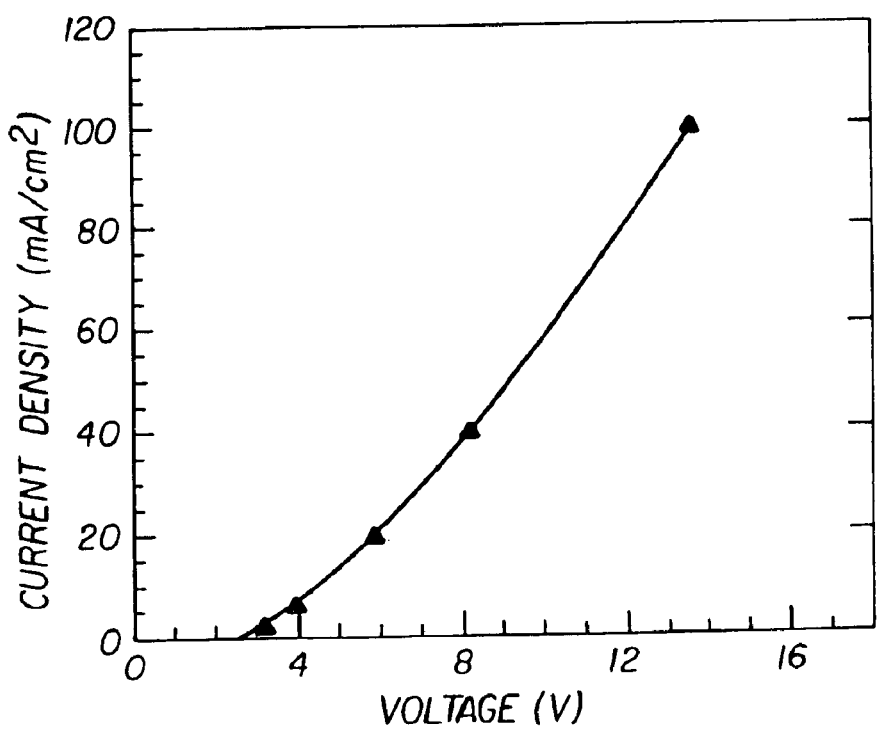
FIG. 4 illustrates the voltage-current density and luminance characteristics of a EL device fabricated from compound 231.
Figure 5:
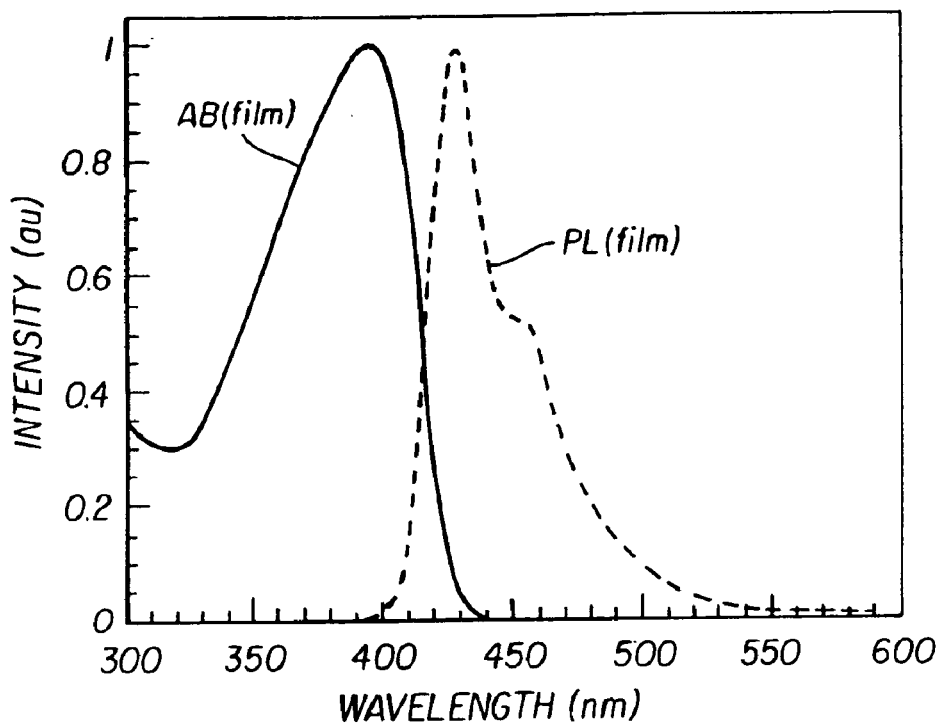
FIG. 5 illustrates the absorption (AB) and photoluminescence (PL) spectra of compound 206.
Figure 6:
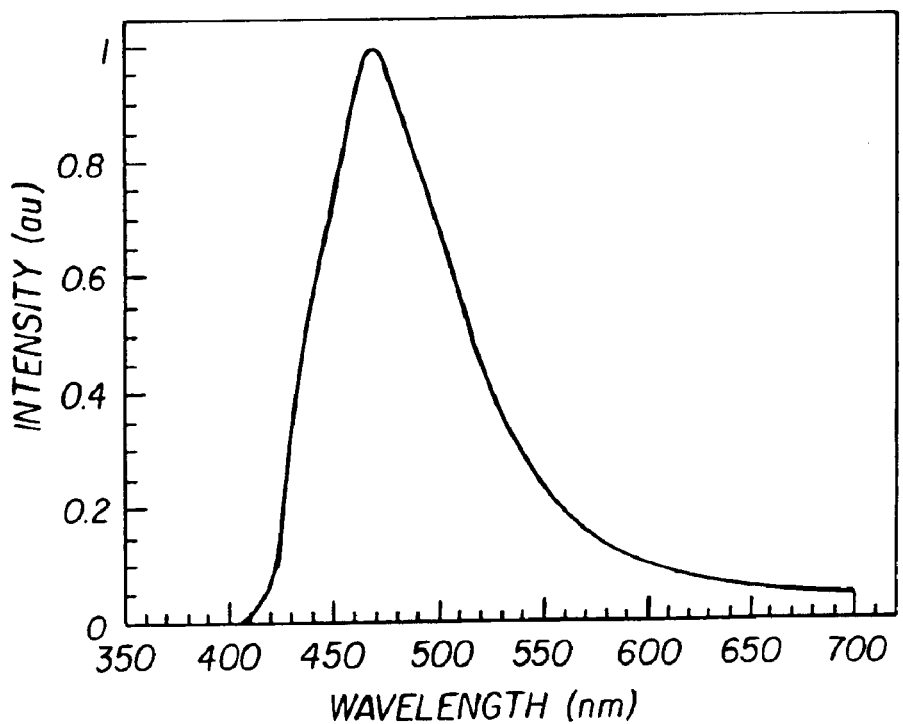
FIG. 6 illustrates the EL spectrum of an EL device fabricated from compound 206.
Figure 7:
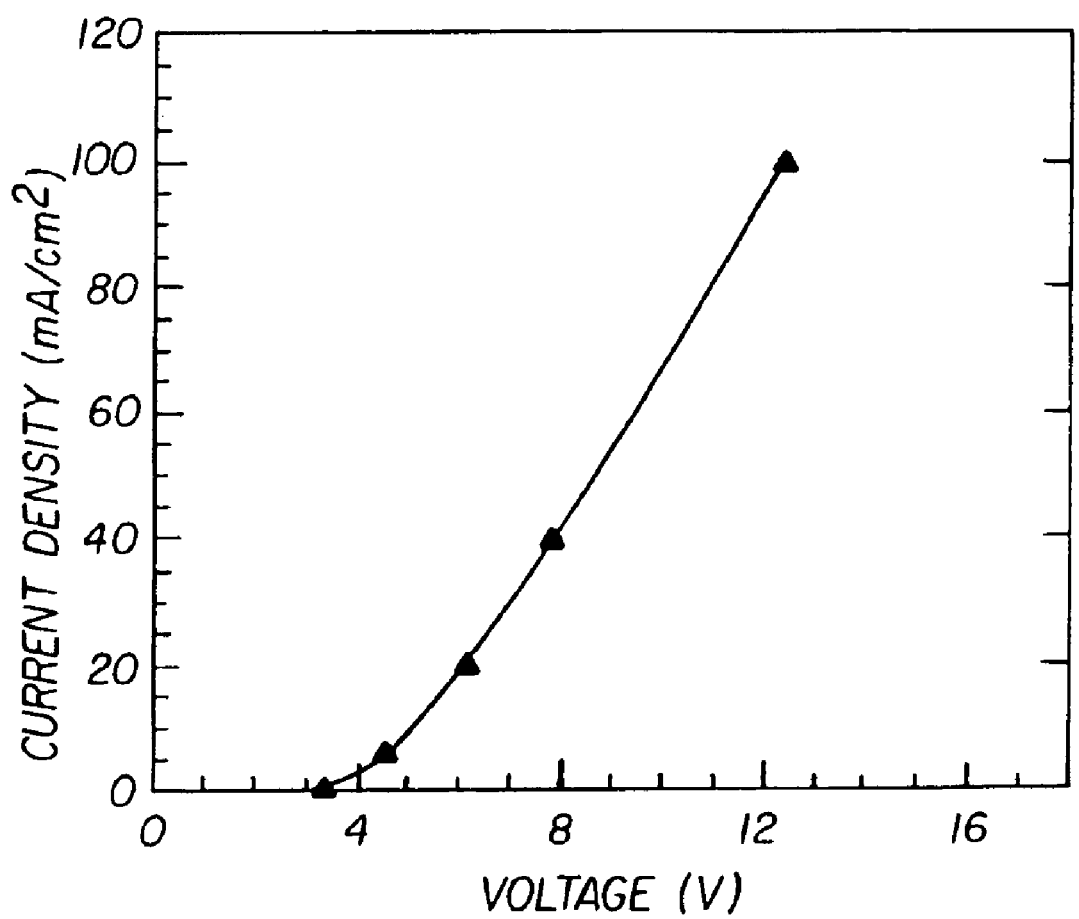
FIG. 7 illustrates the voltage-current density and luminance characteristics of a EL device fabricated from compound 206.

Table 1 summarizes the characterization of the polymers prepared in the present invention. Absorption (AB) and photoluminescence (PL) spectra were obtained from dilute solutions and solid thin films of the polymers and EL spectra were obtained from ITO/PEDOT/organic compound/CsF/Mg:Ag EL devices. The fabrication of EL devices was illustrated in example 36. FIGS. 2 and 5 show the AB and PL spectra of compounds 231 and 206 respectively. FIGS. 3 and 6 show the EL spectra of compounds 231 and 206 respectively. And the voltage-current characteristics of the EL device of compounds 231 and 206 are shown in FIG. 4 and 7 respectively.

TABLE 1

Characterization of polymers according to Examples.

| Compound | $M_w{}^a$ | PDI | $T_d$ (° C.) | $T_g$ (° C.) | UV$^b$ ($\lambda_{max}$ nm) | PL$^c$ ($\lambda_{max}$ nm) | EL ($\lambda_{max}$ nm) |
|---|---|---|---|---|---|---|---|
| 165 | 16300 | 1.70 | 428 | 183 | 380 | 420 (382) | 452 |
| 167 | 23200 | 2.30 | 441 | 50 | 342 | 396 (342) | 412 |
| 168 | 29200 | 1.97 | 418 | 86 | 376 | 420 (380) | 452 |
| 174 | 34400 | 2.01 | 429 | 138 | 392 | 424 (394) | 456 |
| 190 | 7000 | 1.85 | 426 | 137 | 378 | 424 (394) | 476 |
| 221 | 14100 | 1.80 | 430 | 190 | 362 | 410 (364) | 440 |
| 206 | 38200 | 2.15 | 358 | NO$^f$ | 392 | 432 (394) | 468 |
| 231 | 39300 | 2.62 | 405 | 123 | 428 | 522 (430) | 520 |
| 215 | 13100 | 1.65 | 433 | 140 | 388 | 426 (384) | 456 |
| 133 | 29000 | 2.27 | 420 | 72 | 358 | 422 (360) | 468 |
| 280 | 976 | 1.21 | 278 | 70 | NA$^d$ | NA | NA |
| 282 | 4920 | 1.57 | 454 | 182 | 394$^e$ | 448 (396)$^e$ | 488 |
| 278 | 2550 | 1.35 | 449 | 128 | 380$^e$ | 428 (382)$^e$ | NA |
| 284 | 1860 | 1.28 | 236 | 54 | 368$^e$ | 430 (370)$^e$ | NA |
| 198 | 7990 | 2.52 | 436 | 174 | 384 | 448 (386) | 452 |
| 199 | 6890 | 1.50 | 421 | NO | 384 | 424 (386) | NA |
| 201 | 14100 | 1.68 | 405 | 76 | 388 | 450 (378) | 460 |
| 273 | 5190 | 1.38 | 409 | 175 | 364 | 442 (366) | 468 |

$^a$weight average molecular weight, determined by size exclusion chromatography in THF using polystyrene standard.
$^b$as solid state thin film
$^c$as solid state thin film, the number in the parenthesis is the excitation wavelength
$^d$not available
$^e$in toluene solution.
$^f$not observed.

The entire contents of the patents and other publications referred to in this specification are incorporated herein by reference.

The invention has been described in detail with particular reference to certain preferred embodiments thereof, but it will be understood that variations and modifications can be effected within the spirit and scope of the invention.

PARTS LIST 101 substrate
103 anode
105 hole-injecting layer
107 hole transporting layer
109 light emitting layer
111 electron-transporting layer
113 cathode
250 voltage-current source
260 electrical conductors

What is claimed is:

1. An organic compound comprising a complex fluorene structure represented by one of the following formulas:

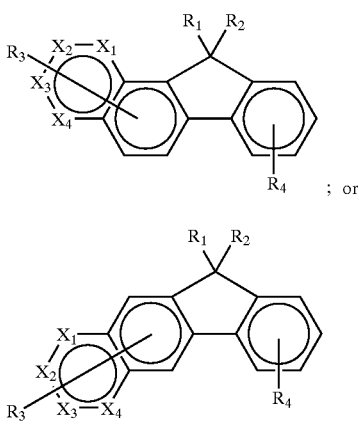

(I)

; or

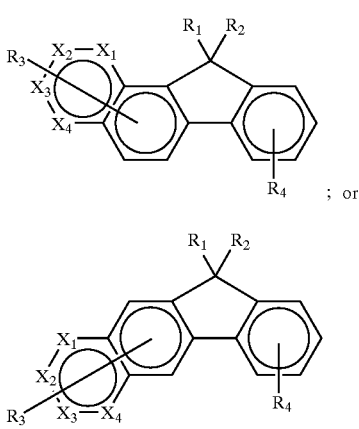

(II)

wherein:

$X_1$, $X_2$, $X_3$, and $X_4$ for formulas I and II include carbon atoms and at least one nitrogen atom; $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings.

2. The organic compound having a complex fluorene structure of claim 1 is a molecule or a polymer or mixture thereof.

3. An electroluminescent material comprising one or more organic compounds having a complex fluorene structure of claim 1.

4. An electroluminescent device comprising one or more active layers, wherein at least one of these active layers comprises one or more orgamc compounds having a complex fluorene structure of claim 1.

5. An organic compound comprising a complex fluorene structure represented by one of the following formulas:

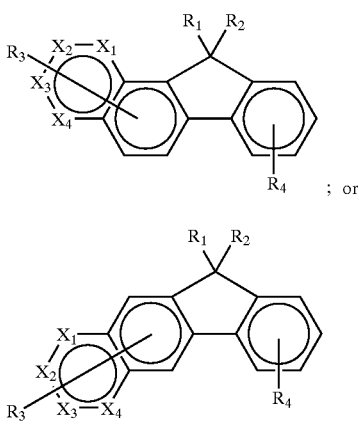

(I)

; or

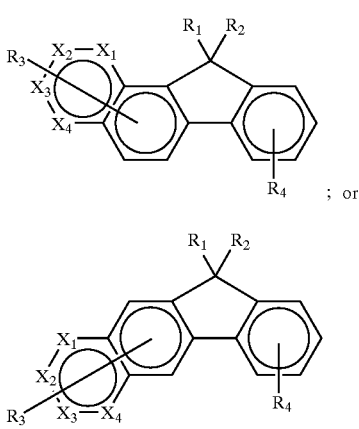

(II)

wherein:

$X_1$, $X_2$, $X_3$, and $X_4$ for formulas I and II are individually the same or different and include a moiety containing CH or N; $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings and wherein the organic compound has a complex fluorene structure represented by formula (IV)

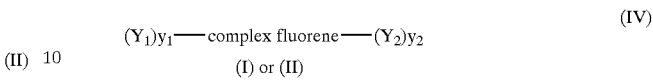

(IV)

wherein $Y_1$ and $Y_2$ are each individually represented as a substituted or unsubstituted alkyl, alkenyl, alkynyl, aryl, or heteroaryl, and $y_1$ and $y_2$ are integers from 1 to 6, and wherein $Y_1$ and $Y_2$ are the same or different.

6. An electroluminescent material comprising one or more organic compounds having a complex fluorene structure of claim 5.

7. An electroluminescent device comprising one or more active layers, wherein at least one of these active layers comprises one or more organic compounds having a complex fluorene structure of claim 5.

8. An organic molecular compound comprising a complex fluorene structure represented by the formula:

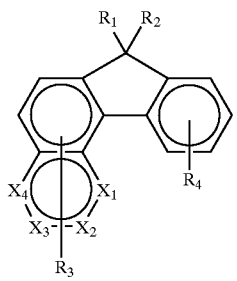

wherein:

$X_1$, $X_2$, $X_3$, and $X_4$ are individually the same or different and include a moiety containing CH or N, and $X_1$, $X_2$, $X_3$, and $X_4$ include at least one moiety containing CH and one moiety containing N; $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings.

9. An electroluminescent device comprising one or more active layers, wherein at least one of these active layers comprises one or more organic compounds having a complex fluorene structure of claim 8.

10. An electroluminescent material comprising one or more organic compounds having a complex fluorene structure of claim 8.

11. An organic polymeric compound containing a complex fluorene structure represented by the formula:

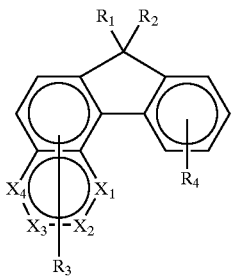

wherein:

$X_1$, $X_2$, $X_3$, and $X_4$ are individually the same or different and include a moiety containing CH or N, and $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings.

12. An electroluminescent material comprising one or more organic compounds having a complex fluorene structure of claim 11.

13. An electroluminescent device comprising one or more active layers, wherein at least one of these active layers comprises one or more organic compounds having a complex fluorene structure of claim 11.

14. The organic compound having a complex fluorene structure of claim 11 is a polymer represented by repeating units of formula (VII) or (VIII)

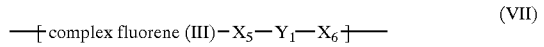

(VII)

; or

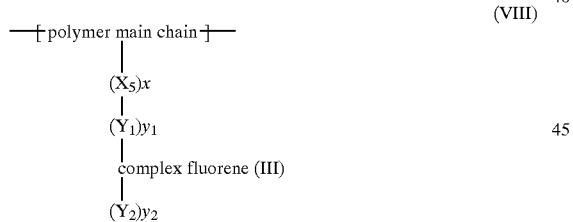

(VIII)

wherein:

$X_5$ and $X_6$ are linking groups, $Y_1$ and $Y_2$ are each individually represented as a substituted or unsubstituted alkyl, alkenyl, alkynyl, aryl, or heteroaryl or other conjugated groups, x, $y_1$ and $y_2$ are integers from 0 to 6, and wherein $Y_1$ and $Y_2$ are the same or different.

15. An organic polymeric compound comprising a complex fluorene structure represented by one of the following formulas:

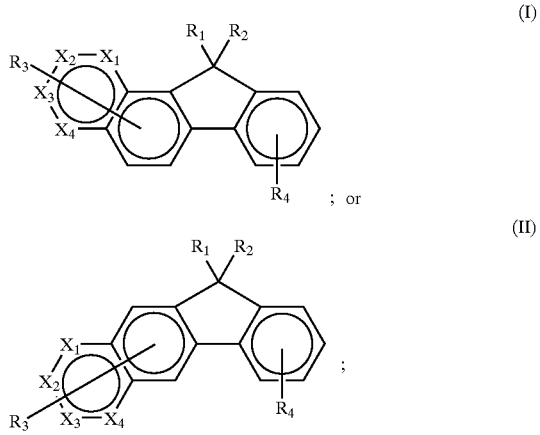

(I)

; or (II)

wherein:

$X_1$, $X_2$, $X_3$, and $X_4$ for formulas I, and II are individually the same or different and include a moiety containing CH or N; $R_1$, $R_2$, $R_3$, and $R_4$ are substituents each being individually hydrogen, or alkyl, or alkenyl, or alkynyl, or alkoxy of from 1 to 40 carbon atoms; aryl or substituted aryl of from 6 to 60 carbon atoms; or heteroaryl or substituted heteroaryl of from 4 to 60 carbons; or F, Cl, or Br; or a cyano group; or a nitro group; or $R_3$, or $R_4$ or both are groups that form fused aromatic or heteroaromatic rings.

16. An electroluminescent material comprising one or more organic compounds having a complex fluorene structure of claim 15.

17. An electroluminescent device comprising one or more active layers, wherein at least one of these active layers comprises one or more organic compounds having a complex fluorene structure of claim 15.

18. The organic compound having a complex fluorene structure of claim 15 is a polymer represented by repeating units of formula (V) or (VI)

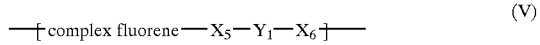

(V)

; or

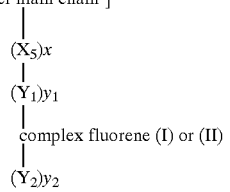

(VI)

wherein:

$X_5$ and $X_6$ are linking groups, $Y_1$ and $Y_2$ are each individually represented as a substituted or unsubstituted alkyl, alkenyl, alkynyl, aryl, or heteroaryl, x, $y_1$ and $y_2$ are integers from 0 to 6, and wherein $Y_1$ and $Y_2$ are the same or different.

* * * * *